United States Patent [19]
Tamba et al.

[11] Patent Number: 5,654,931
[45] Date of Patent: Aug. 5, 1997

[54] HIGH-SPEED SEMICONDUCTOR MEMORY DEVICE AND DATA PROCESSING SYSTEM USING THE SAME

[75] Inventors: Akihiro Tamba, Mito; Masahiro Iwamura, Hitachi; Yutaka Kobayashi, Katsuta; Kinya Mitsumoto, Tanamura-machi; Tatsumi Yamauchi, Hitachioota; Shuko Yamauchi, Hitachi; Takashi Akioka, Hitachi, all of Japan

[73] Assignee: Hitachi, Ltd., Tokyo, Japan

[21] Appl. No.: 213,531

[22] Filed: Mar. 16, 1994

[30] Foreign Application Priority Data

| Mar. 16, 1993 | [JP] | Japan | 5-055528 |
| Mar. 18, 1993 | [JP] | Japan | 5-058763 |
| May 12, 1993 | [JP] | Japan | 5-110477 |

[51] Int. Cl.⁶ ............................................. G11C 13/00
[52] U.S. Cl. ............... 365/230.03; 365/191; 365/230.06
[58] Field of Search ............................... 365/230.03, 191, 365/230.06

[56] References Cited

U.S. PATENT DOCUMENTS

| 5,222,047 | 6/1993 | Matsuda et al. | 365/230.03 |
| 5,280,448 | 1/1994 | Watanabe | 365/230.03 X |

*Primary Examiner*—Do Hyun Yoo
*Attorney, Agent, or Firm*—Antonelli, Terry, Stout & Kraus, LLP.

[57] ABSTRACT

A semiconductor integrated circuit device is divided into a plurality of blocks, which are individually equipped with signal generate units such that the signal generate units are distributed in the semiconductor integrated circuit device. The semiconductor integrated circuit device is preferably constructed to generate the pulse signal by the pulse generate units which are provided for the individual blocks, after all initial logic operations on the data and control signals have been taken. Thanks to this construction, an SRAM, for example, can have its write recovery time minimized to 0 so that it can achieve high-speed operations. Moreover, since predecoders are provided for the individual blocks, the wiring line number and area in the chip can be reduced to improve the degree of integration of the semiconductor integrated circuit device. Still moreover, signal delay and skew can be reduced in the chip so that high-speed can be achieved. Another feature is that either the input/output pads of the data into or out of the semiconductor integrated circuit device or their accompanying circuit units are distributed in the semiconductor integrated circuit device. The individual features described above can be used solely or in combination, if necessary, to achieve the above-specified objects.

6 Claims, 39 Drawing Sheets

WEBBF CIRCUIT

DINBF CIRCUIT

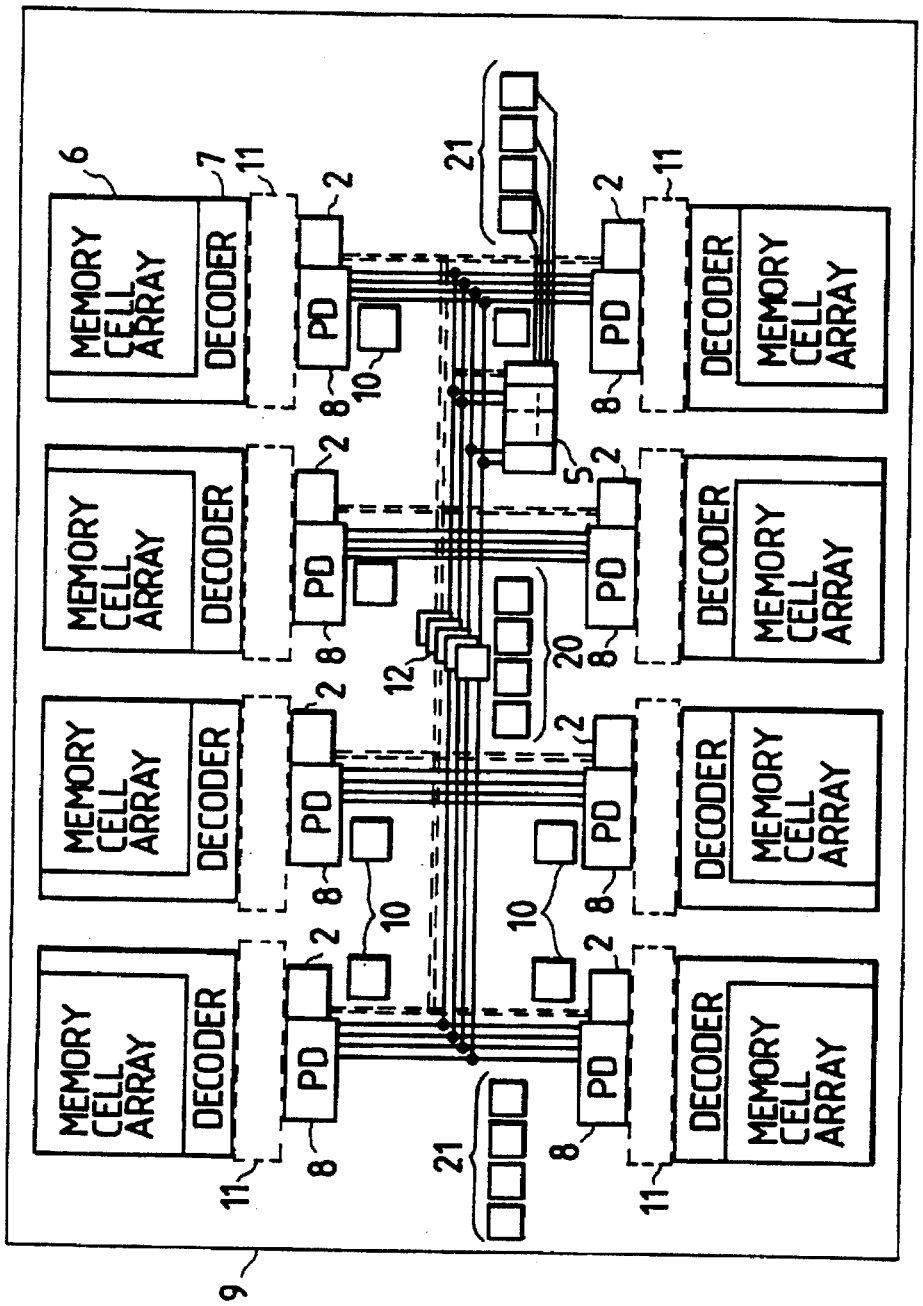

HIGH-SPEED SEMICONDUCTOR MEMORY DEVICE AND DATA PROCESSING SYSTEM USING THE SAME

BACKGROUND OF THE INVENTION

1. Field of the Invention

The present invention relates to a reduction of the signal delay in a semiconductor integrated circuit device and, particularly, to a control circuit for effecting a data writing operation at a high speed in the semiconductor integrated circuit device. More particularly, the present invention relates to a highspeed semiconductor integrated circuit device which adopts at least one of high-speed technologies for speeding up the recovery of data lines and the control of data lines and word lines and for achieving higher speed by arranging buffers and pads for each memory array.

Moreover, the present invention relates to a high-speed decoding circuit for a semiconductor processing system such as a processor or a microcomputer (which will be abbreviated herein to the "micon").

Still further, the present invention relates to a speeded-up semiconductor integrated circuit device, and, more particularly, to a data processor or a data processing system having a semiconductor processing system or a semiconductor memory device.

2. Description of the Related Art

A first technology of the prior art will initially be described.

A static type random access memory (SRAM) of the prior art carries out recovery of data lines in response to a rise of a write enable signal (WEB) fed from the outside.

Here in the semiconductor circuit device (or memory), the term recovery implies restoration (or recovery) of that potential of the data line, which has been fluctuated by the writing operation or the like, to a predetermined value. And, the time period required for the recovery is called the "recovery time".

When the decoder is speeded up so as to speed up the SRAM, the subword lines (SWL) are switched before the data lines are recovered, thereby causing an erroneous writing operation or a delay in the recovery time.

Therefore, the technology for reducing the recovery time to zero is described in Japanese Patent Laid-Open No. 69893/1992.

In this Laid-Open document, there is disclosed a selfwrite system in which the recovery is executed by outputting a pulse signal at a predetermined interval. For this, there is disclosed a semiconductor memory device. In this semiconductor memory device (or the memory chip), a first logic operation is carried out between a write enable signal (WEB) and a chip select signal (CS) to output a first logic signal by one timing control circuit (TC) of the memory device. A second logic operation is carried out between the first logic signal and a data input signal to output a second logic signal by one data input buffer and one write pulse generate circuit. In response to the second logic signal, a pulse signal is generated so that the pulse signal produced by the write pulse generate circuit is distributed to all memory cells.

A second technology of the prior art will now be described.

In this second arrangement, a random access memory (RAM), in which a predecoder is arranged at the central predecoder is distributed to individual memory arrays, as described on pp. 5 of Technical Report of Association of Electronic Information Communication, Vol. 91, No. 66 or in Japanese Patent Laid-Open No. 91895/1988 or 144276/1992.

A third technology of the prior art will now be described.

In order to facilitate connections from the lead lines of the package of a semiconductor memory device to a semiconductor memory circuit unit, this semiconductor memory circuit unit is equipped at its outer peripheral portion with input/output buffers and input/output pads, and wiring lines are arranged from those input/output buffers and pads to the inside of the semiconductor integrated circuit unit to transmit signals.

In the technology of the prior art described above, however, no consideration is taken in case the capacity of the memory is increased, in case the degree of integration of the semiconductor integrated circuit device and the memory cells is enhanced, in case the number of memory cells and memory arrays are increased, in case the area of the semiconductor integrated circuit device is increased, or in case the amount of data to be processes is increased. In other words, since the signal produced at one portion in the semiconductor integrated circuit device is transmitted to all the regions such as the memory array and the memory cells in the semiconductor integrated circuit device, a difference is established in the signal transmissions between the individual regions, thus causing a problem of a signal delay. This problem becomes more serious as the area and the degree of integration are raised to higher levels.

The first technology of the prior art has the following problems.

The first problem is as follows. Since pulse signals (PSG) are produced from WEB, CSB and DIN in one portion of the memory chip and are transmitted into the memory chip, skewing of the pulse signal and deformation (break) of the waveform are caused due the increase in the area of the memory chip so that the timing of the pulse signal is different (to cause the signal delay) locally in the chip. This problem makes the design difficult.

Next, a logic is taken between the pulse signal, after it is produced, and a mat select signal (MS) to produce a write control signal. Moreover, since a common data line (CDL) drive signal is produced in response to that write control signal a timing is deviated between the pulse signal and the mat select signal as the memory capacity and the memory chip area are increased, so that the margin of the pulse width of the pulse signal has to be enlarged. As a result, the difference in the signal widths of the WEB, CSB and DIN signals are decreased to cause a second problem that the effect of the self-write system cannot be sufficiently achieved.

Moreover, the common data line (CDL) is controlled by the pulse signal, but the PMOS or a load connected with the data lines is controlled by the WEB signal so that the control cannot be executed at a precise timing. This raises a third problem that the desired effect of the self-write system cannot be sufficiently achieved.

According to this self-write system of the prior art technology, there arises a fourth problem that common data cannot be written at different addresses by fixing the potentials of the WEB signal and the DIN signal and by switching the address signals only.

In the system for the write control with the pulse signal, therefore, skewing of the pulse signal is caused by the increase of the chip area. If, moreover, a logic operation is performed between the pulse signal and another control signal, the timings of the pulse signal and the control signal become different in the chip so that a pulse signal having a precise pulse width cannot be produced.

According to the second and third technologies of the prior art, if the bit number is increased, for example, the addresses increase to by a power of two relative to the increased bit number. As a result, the number of drive circuits increases in accordance with the increase in the addresses so that the circuit scale is accordingly enlarged. The number of gates to be driven by one logic gate of the predecoder or a first stage logic circuit group is increased to increase a fan-out per logic gate thereby to cause a fifth problem that the load capacity increases.

Moreover, the increase in the number of elements composing one chip makes a complicated logic necessary to invite increases in the logic step number, the logic gate number and the wiring line number thereby to cause-a sixth problem that the chip area increases.

SUMMARY OF THE INVENTION

An object of the present invention is to provide a semiconductor integrated circuit device which can achieve high-speed processing even with the increases in the capacity, the processing amount and the chip area.

Another object of the present invention is to provide a semiconductor integrated circuit in which the delay of signals is not caused at all or is at least reduced.

Another object of the present invention is to provide a semiconductor integrated circuit device in which skewing of the signal transmission does not occur, hardly occurs or is at least low.

Still another object of the present invention is to provide a semiconductor integrated circuit device which can sufficiently exhibit the effect of the selfwrite system in the writing operation of data.

A further object of the present invention is to provide a write circuit or a semiconductor integrated circuit device in which the write recovery time suited for a high-capacity and high-speed semiconductor integrated circuit device is theoretically brought close to zero.

A further object of the present invention is to provide a semiconductor integrated circuit device which can write on the basis of an address signal in case identical data are to be written in different addresses.

A further object of the present invention is to provide a semiconductor integrated circuit device which can reduce the increase in the fan-out or the load capacity even if it is highly integrated, logically complicated or enhanced.

A further object of the present invention is to provide a semiconductor integrated circuit device in which input/output pads are so arranged as to decrease the increases in the chip area and the wiring line length.

According to a feature of the present invention, the inside of the semiconductor integrated circuit device is divided into a plurality of blocks, which are individually equipped with signal generate units. In other words, the signal generate units are distributed in the semiconductor integrated circuit device.

The semiconductor integrated circuit device of the present invention is desirably constructed to generate pulse signals by pulse generate units which are provided for the individual blocks, after the logic operations of all the signals have taken place. Thanks to this construction, the SRAM, for example, can have its write recovery time minimized to 0 so that it can achieve high-speed operations.

Moreover, since predecoders are provided for the individual blocks, the wiring line number and area in the chip can be reduced to improve the degree of integration of the semiconductor integrated circuit device. Still moreover, the signal delay or skew can be reduced in the chip so that the desired high-speed can be achieved.

Another feature is that either the input/output pads of the data into or out of the semiconductor integrated circuit device or their accompanying circuit units are distributed in the semiconductor integrated circuit device.

The individual features described above can be used solely or in combination, if necessary, to achieve the above-specified objects.

BRIEF DESCRIPTION OF THE DRAWINGS

These and other objects, features and advantages of the present invention will be understood more clearly from the following detailed description with reference to the accompanying drawings, wherein:

FIG. 25 is a block diagram schematically showing a semiconductor integrated circuit device according to the present invention;

DESCRIPTION OF THE PREFERRED EMBODIMENTS

A self-write system of the prior art is discussed in the following description before the embodiments of the present invention will be described hereinafter.

Figure 1:
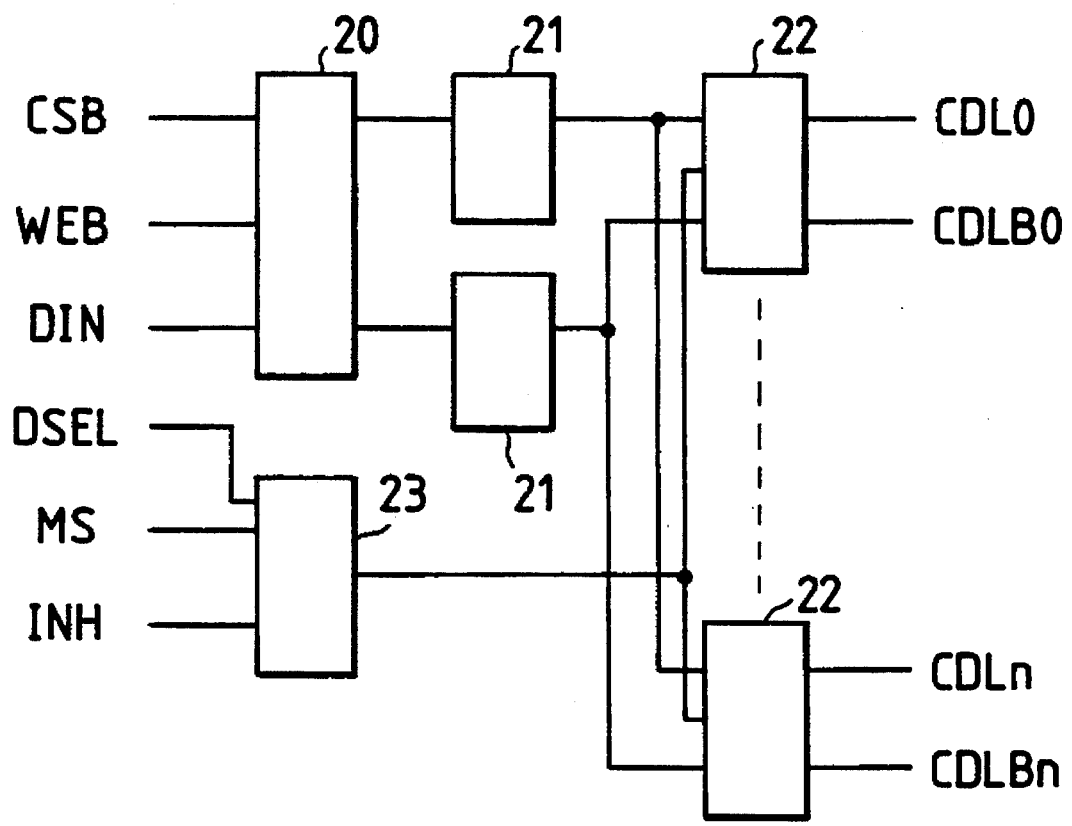
FIG. 1 is a diagram showing the basic concept of a self-write system of the prior art.
Figure 2:
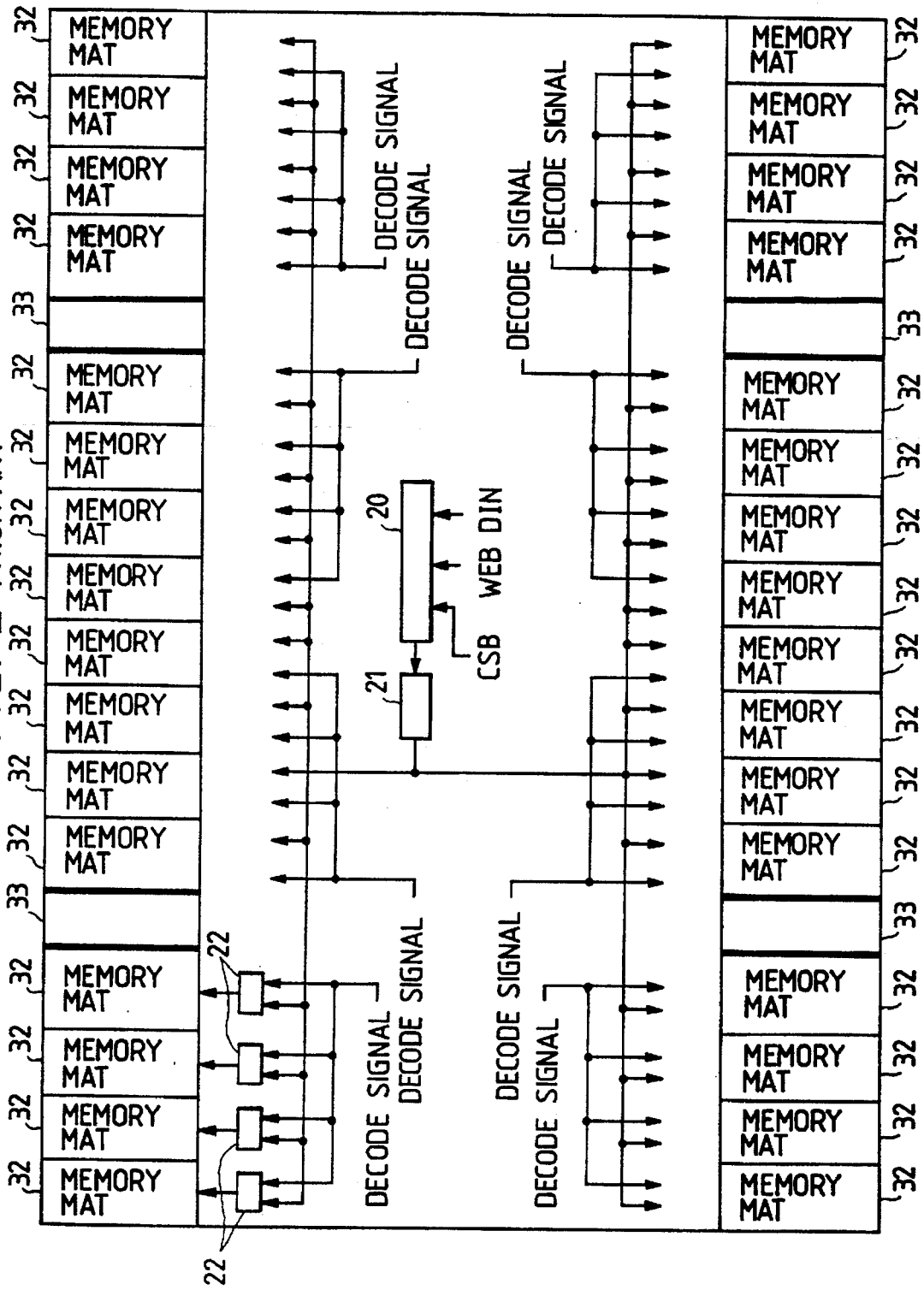
FIG. 2 is a chip image diagram of the self-write system of the prior art.

The self-write system of the prior art belongs to one of the systems for controlling the writing of data with pulse signals. FIG. 1 is a functional block diagram showing the self-write system, and FIG. 2 is a schematic diagram showing a circuit arrangement in case the self-write system is applied to a SRAM chip. In a portion of the chip, there is arranged a logic circuit 20 which is made receptive of an external write enable signal (WEB), a chip select signal (CSB) and a data input signal (DIN). In a portion of the same chip, there is also arranged a pulse generate circuit 21 for producing a pulse signal in response to the output signal of the logic circuit 20. As shown in FIG. 1, after the pulse signal has been transmitted to the inside of the chip, the logic between the output signal of a logic circuit 23, which is made receptive of other control signals, e.g., a mat select signal (MS) and an inhibit signal (INH), and the pulse signal, which is produced by the pulse generate circuit 21, is taken by a plurality of logic circuits 22 which are arranged in the chip. By the signals (or pulses) of the logic circuits 22, common data lines CDLO and CDLBO to CDLn and CDLBn are driven to write the data.

Figure 3:
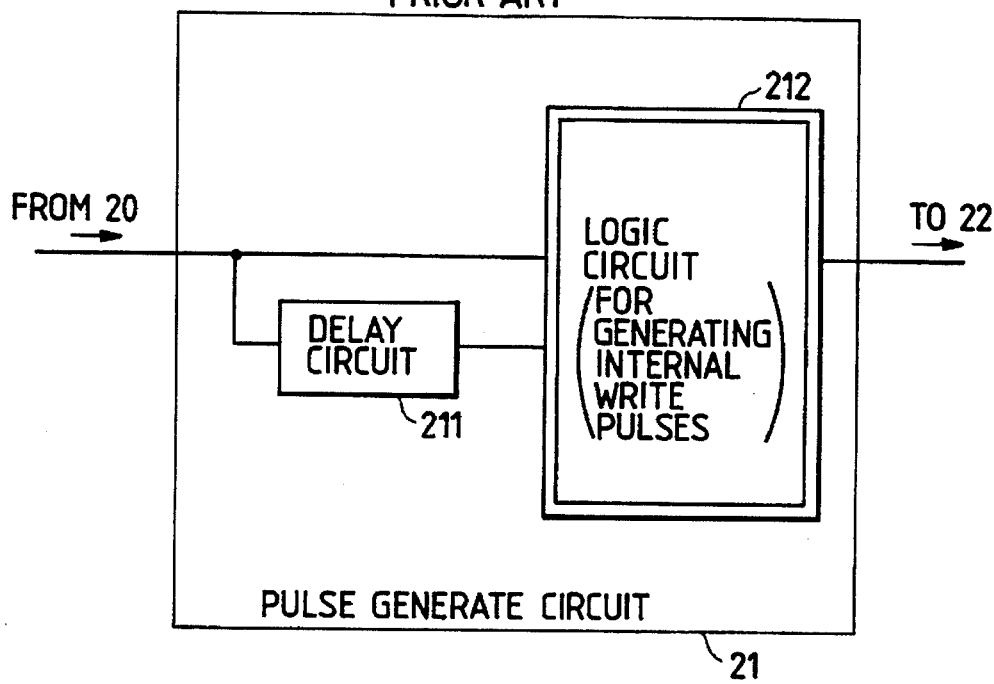
FIG. 3 is a diagram showing one example of a pulse generate circuit 21.

FIG. 3 shows the pulse generate circuit 21. This pulse generate circuit 21 is constructed to include a delay circuit 211 and a logic circuit 212 for generating internal write pulses.

Figure 4:
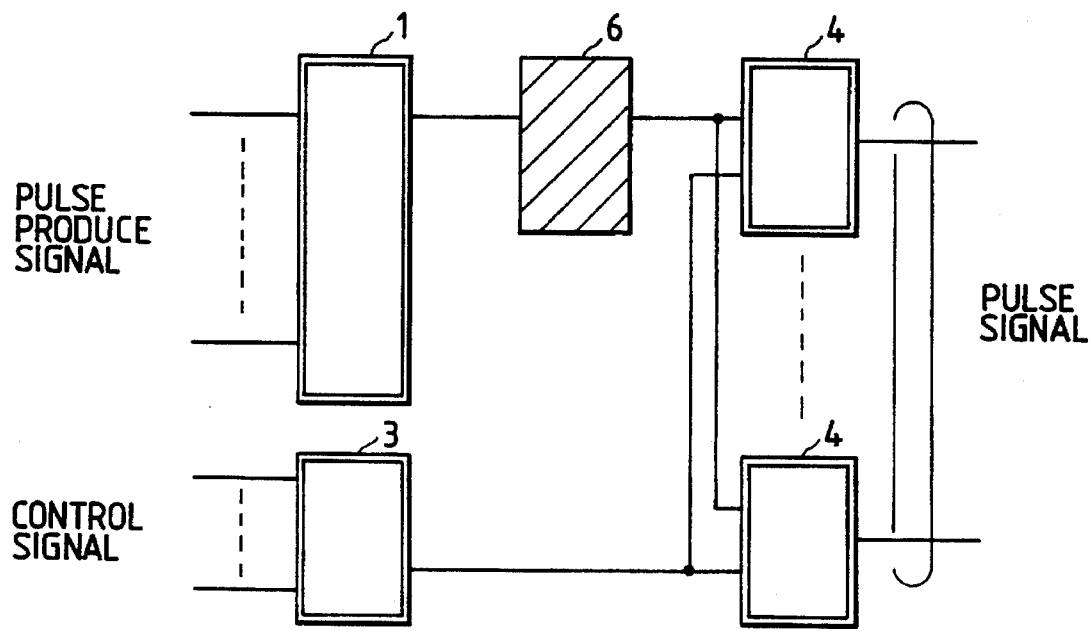
FIG. 4 is a diagram showing the basic concept of a pulse signal generate circuit of the prior art.

If the functions of the aforementioned circuits are considered, the circuit for taking the logic between the pulse signals and the control signals is shown in FIG. 4. In response to the output of a logic circuit 1 arranged in a portion of the LSI chip, as shown in FIG. 4, a pulse generate circuit 6, which is also arranged in a portion of the chip, produces and transmits a pulse signal to the inside of the chip. The logic between the output of a logic circuit 3, which is made receptive of other control signals, and the pulse signal, which is outputted from the pulse generate circuit 6, is taken by logic circuits 4 so that pulse signals are produced in necessary portions and used as the final pulse signals.

In other words, a plurality of the logic circuits 4 are provided in the chip so that their outputs are used as the pulse signals.

The precise control of the write control pulses is solved by producing the pulses with the signal as close to the signals for writing the data in memory cells as possible. In short, a stable self-write system can be ideally realized if the potential of one of paired data lines (DL and DLB) of the memory cell unit to be written is held at a Low level for a predetermined time period and is automatically started for its recovery. In other words, the information of the data write end of the memory cells may be fed back to the write circuit to start the data line recovery. In order to produce the write pulses, however, the pulse generate circuit is necessary, but it is not practical to provide that circuit for each data line because the circuit scale is enlarged too much.

According to the present invention, the pulse generate circuit is provided for each common data line, i.e., each memory block, and the logic signal is produced in accordance with the logic which is taken by the various control signals before it is inputted to the pulse generate circuit, so that the pulses may be generated by the pulse generate circuit on the basis of the logic signal.

One embodiment of the present invention will be described in detail in the following discussion with reference to the accompanying drawings.

Figure 5:
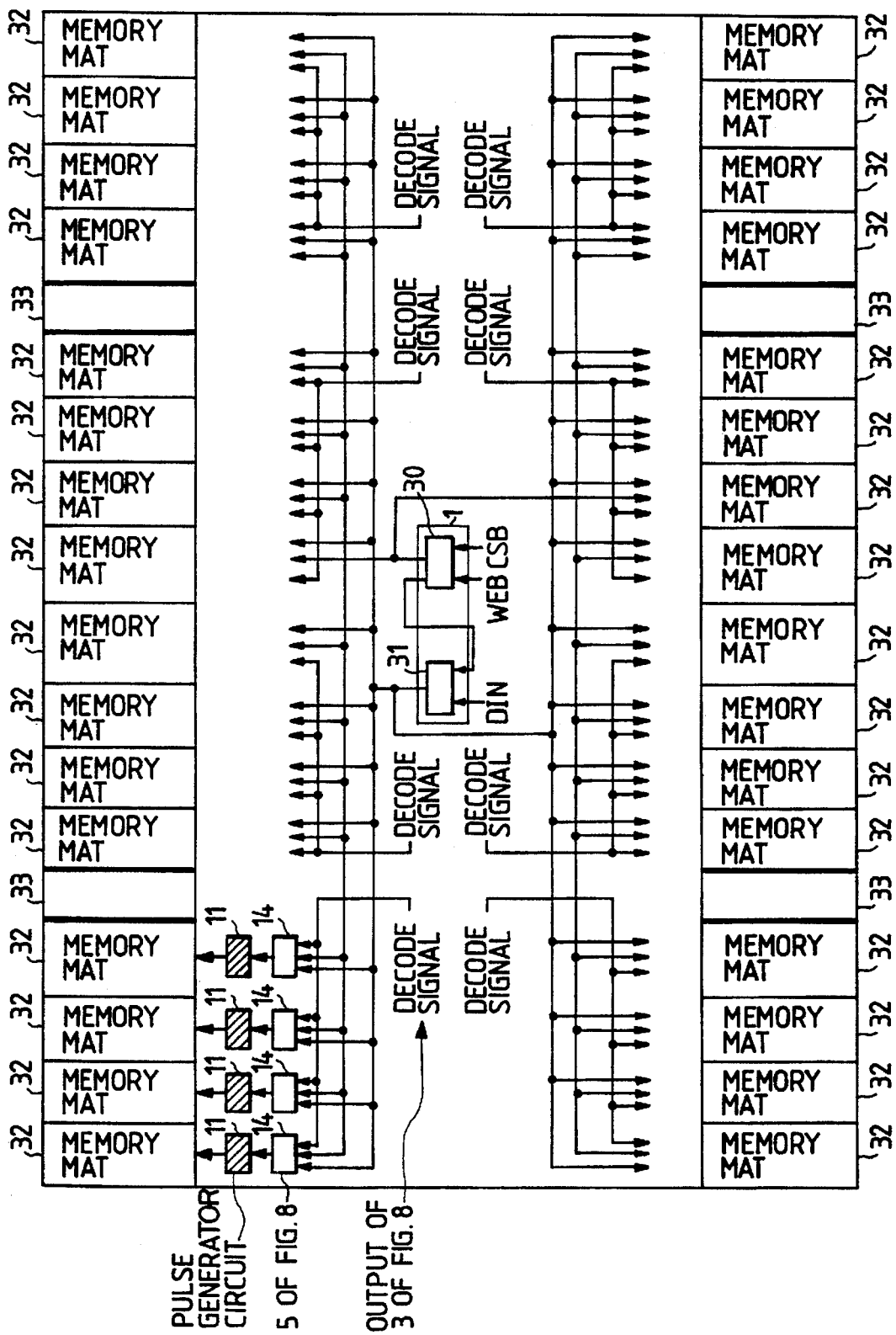
FIG. 5 is a chip image diagram of the self-write system according to the present invention.
Figure 6:
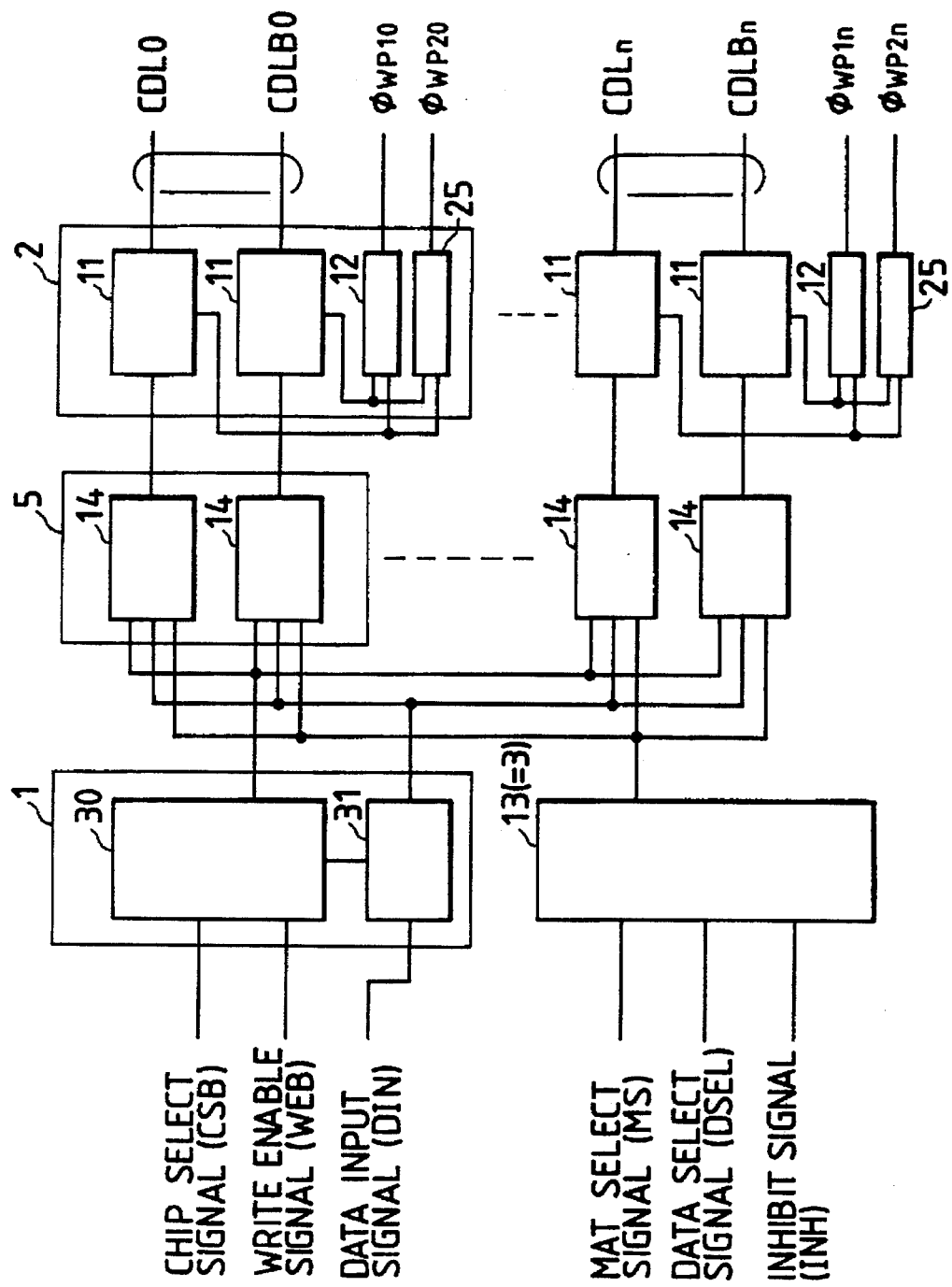
FIG. 6 is a diagram showing the basic concept of a self-write system according to the present invention.

FIGS. 5 and 6 show a self-write system in which a pulse generate circuit 11 is provided for each common data line CDL to produce internal write pulses so that the common data line is driven by the signal. The present system is shown in FIG. 5 in a schematic diagram of the circuit arrangement in which it is arranged in the memory chip. In a portion of the chip, there is arranged a logic circuit 30 which is made receptive of the input signals WEB and CSB. In a portion of the chip, there is also arranged a logic circuit 31 for each data input. After the output signals of the logic circuits 30 and 31 have been transmitted to the entirety of the chip, they are inputted to a logic circuit 14 which is arranged in each mat for each common data line (CDL). Moreover, the decode signals are inputted to the logic circuit 14. If all the three signals instruct the writing operation, the logic circuit 14 outputs a signal instructing the writing operation, and the pulse generate circuit 11, which is arranged for each CDL like the logic circuit 14, outputs pulse signals, so that the data are written. Since the pulse signals are not transmitted by using any long wiring line, as described above, the writing operation can be controlled with a precise pulse width without considering the skew or the like of the signals.

FIG. 6 is a schematic diagram showing in a logic circuit form the functions of the write circuit of a semiconductor memory according to the present invention. Letters MS designate a mat select signal; letters DSEL designate a data select signal (for selecting data of ×4 (bits) ×1 (bit) in the case of a chip of inputs/outputs of ×8 (bits) at the maximum); and letters INH designate an inhibit signal. When all the signals MS, DSEL, DIN, WEB, INH and so on come into the state for instructing the writing operation, the logic circuits 30, 31 and 13 output the write instructing signal to the logic circuit 14. Then, this logic circuit 14 outputs the write instructing signal to the pulse generate circuit 11 to produce negative pulses, and the common data line (CDL) takes a Low level for a predetermined time period so that the data are written. As described above, the pulse signal is produced after the logic of all the signals necessary for producing the write pulses has been taken. This makes it unnecessary to consider the timing margin between the pulse signal and the control signal unlike the prior art system, so that pulses of small pulse width can be produced in an excellent control.

Figure 7:
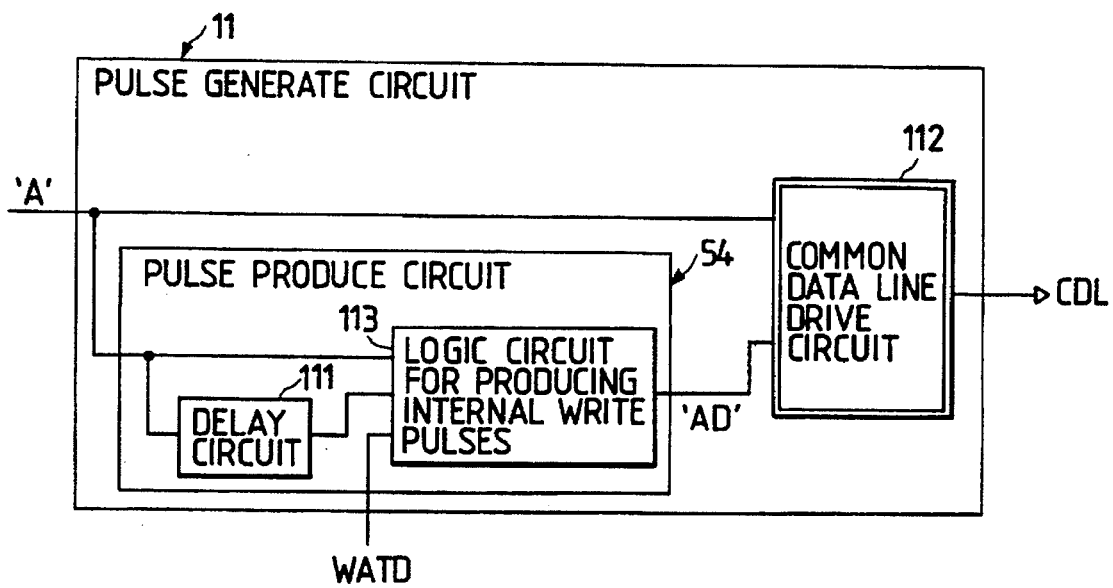
FIG. 7 is a diagram showing one example of a pulse generate circuit 11.

The pulse generate circuit 11 can be constructed, as shown in FIG. 7, to include: a delay circuit 111, a logic circuit 112 such as the common data line drive circuit, and a logic circuit 113 for producing the internal write pulses.

Figure 19:
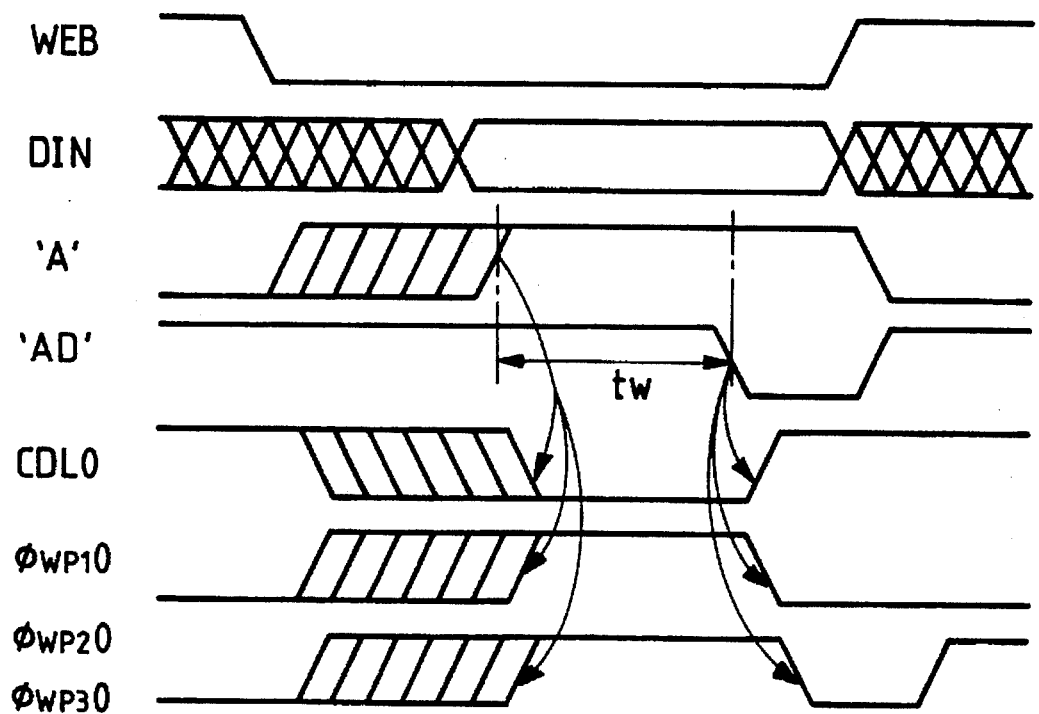
FIG. 19 is a timing chart showing the output timings of various internal pulses.

By using the negative pulse signal, moreover, a high-speed write recovery can be realized (as shown in FIG. 19) by producing a data line recovery control signal QWP1, a data line equalize control signal QWP2 and so on before the rise of the external write enable signal (WEB).

As one example of the case in which the present invention is applied to other than the aforementioned write circuit, there are presented three conditions for controlling the timing and pulse width of the pulse signal precisely: 1) The pulse signal is produced after the logic is taken among all the signals necessary for producing the pulse signal (i.e., the finally necessary signal); 2) A pulse is produced for each circuit block requiring the pulse signal, that is, a plurality of pulse generate circuits are provided in the chip; and 3) After the pulse signal has been produced, it is directly used without taking any logic between it and another signal.

Figure 8:
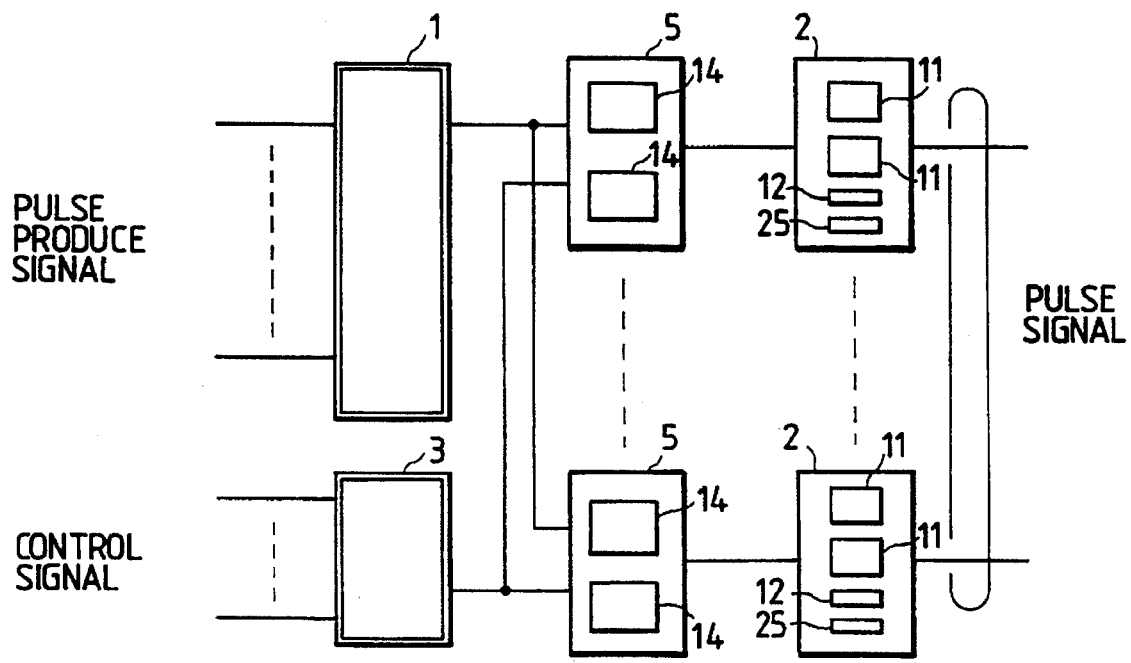
FIG. 8 is a diagram showing the basic concept of a pulse signal generate circuit of the present invention.

The functional block diagram of the pulse produce system according to the present invention, as based upon the above-specified three conditions, is shown in FIG. 8. Although the pulses are produced in the prior art only from the output of the logic circuit 1, they are produced according to the present invention after a logic has been taken between the logic circuits 1 and 3. In other words, a logic circuit 5 is newly provided so that the pulse signal is produced from the output signal of the logic circuit 5. According to the aforementioned conditions 2) and 3), moreover, a plurality of the logic signals 5 and the pulse generate circuits 2 are arranged in the chip.

The pulse generate circuit provided for each pair of common data lines is arranged in the vicinity of the memory mat to act on all the signals other than the column select signal so that the internal pulses provided can be stable for the data writing operation. Moreover, this pulse generate circuit does not produce any pulse unless the writing status is held for the time period set by the common line drive signal, but is constructed to raise no danger for an erroneous writing operation due to a hazard.

If the present invention is applied generally to an LSI, the pulse signal can be used, after it is produced, without taking any logic with another signal, that is, without being processed by another signal, so that it can be stably fed to each circuit block.

An embodiment of the present invention will be described in more detail in the following with reference to the accompanying drawings.

An embodiment having the basic construction of the case, in which the present invention is applied to a write circuit, will be described in the following.

Figure 9:
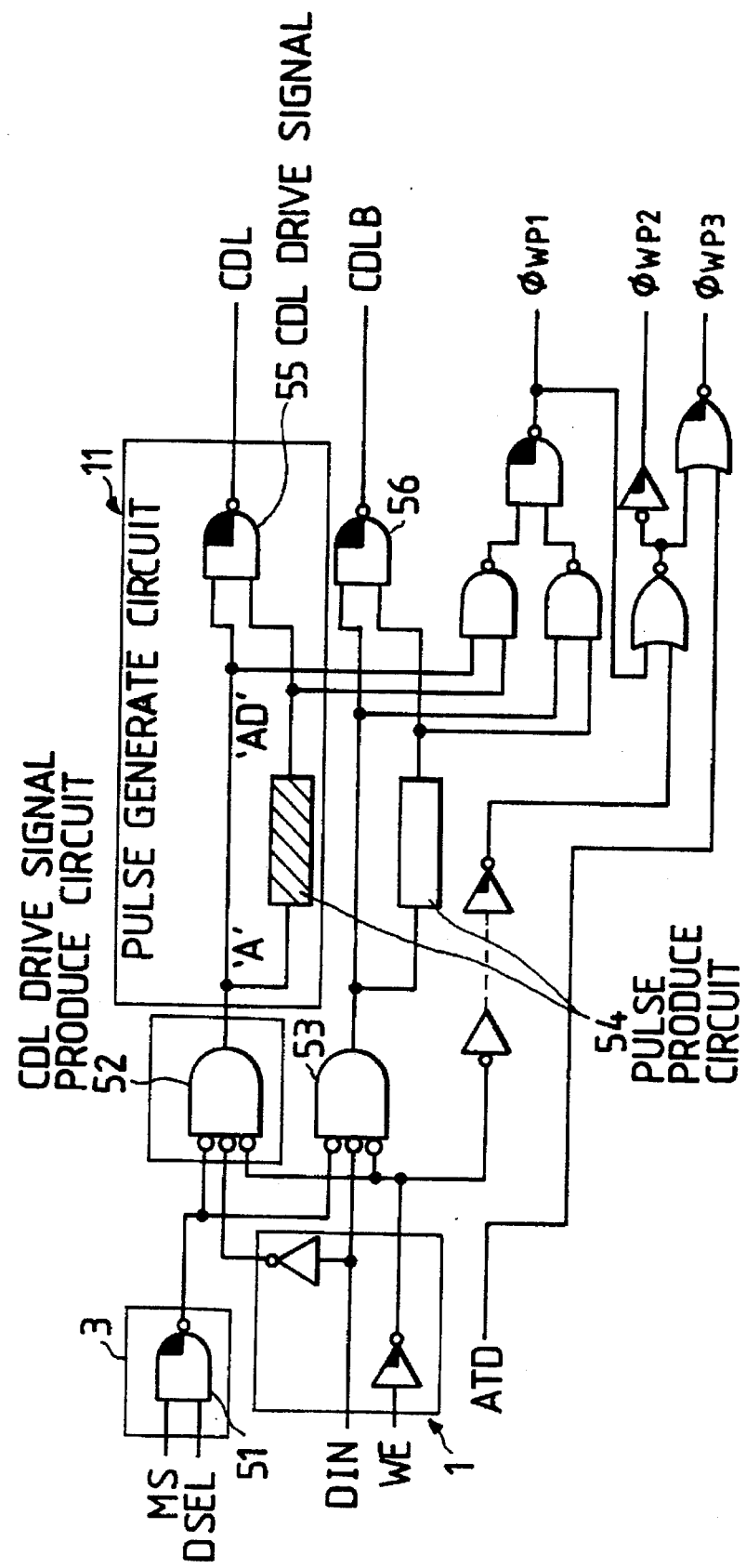
FIG. 9 is a diagram showing the embodiment shown in FIG. 6, in connection with one common data line.

FIG. 9 is a logic diagram showing one common data line pair having the basic construction of the present invention shown in FIG. 6. When the mat select signal (MS) and the data select signal (DSEL) become High so that a two-input NAND gate circuit (BiNMOS gate circuit) 51 takes the Low level whereas an internal write enable signal (WE) takes the High level, either of two three-input NOR gate circuits 52 and 53 takes the High output. A pulse produce circuit (or delay circuit) 54 is set to the High level when the internal write enable signal (WE) takes the Low level. As a result, when the output 'A' of the three-input NOR gate circuit 52 takes the High level, for example, the output of a two-input NAND gate circuit 55, i.e., the potential of the common data line CDL takes the Low level so that the data are written. If the signal 'A' is held in the High status for the minimum time period tW (e.g., 3 ns) necessary for writing the data, the pulse produce circuit 54 produces a low output 'AD' whereas the two-input NAND gate circuit 55 produces the High output, so that the writing operation is ended even if the WE signal takes the High level (for the writing status) to start the data line recovery.

In FIG. 9, signals φWP1, φWP2 and φWP3 indicate a data line load control signal, a common data line (i.e., read-dedicated common data line) and data line recovery control signal, and a data line and common data line equalize control signal, respectively. All of these signals are produced by using the signals 'A' and 'AD'. In other words, since the signals φWP1, φWP2 and φWP3 are also controlled by the internal pulses, the recovery of the data lines can be realized at a higher speed than that of the aforementioned self-write system of the prior art, in which only the common data line CDL is controlled by the internal pulses. A signal ATD is an address transition detect signal for outputting positive pulses at an address transition time. This is a signal for equalizing the data line and the common data line when the data are read out. In the present embodiment, an equalize MOSPET at the write recovery time and an equalize MOSFET at the read time are made common by combining the ATD signal and the φWP1.

Figure 10:
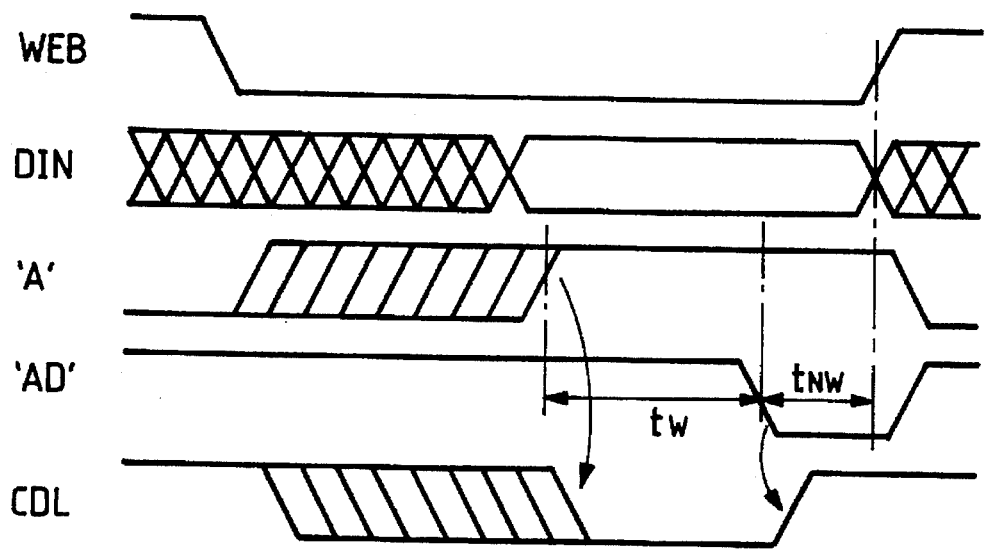
FIG. 10 is a timing chart showing the self-write system according to the present invention.

The operation principle described above is shown in a timing chart in FIG. 10. When the external write enable signal WEB takes the Low level so that the data input signal DIN is defined, the signal 'A' takes the High level whereas the Common data line CDL takes the Low level, so that the writing status is established. If the signal 'A' is held at the High level for the data writing time period tW, the signal 'AD' takes the Low level so that the writing operation is ended. In short, the start of writing the data is determined by the rise of the signal 'A', and the end of writing the data is determined by the signal 'AD'. The data writing time period is determined by the delay time of the pulse produce circuit 54. Thus, it can be understood that the self-write system is realized because the common data line CDL is recovered by setting the data writing time period tW even if the external write enable signal (WEB) is at the Low level.

Figure 11:
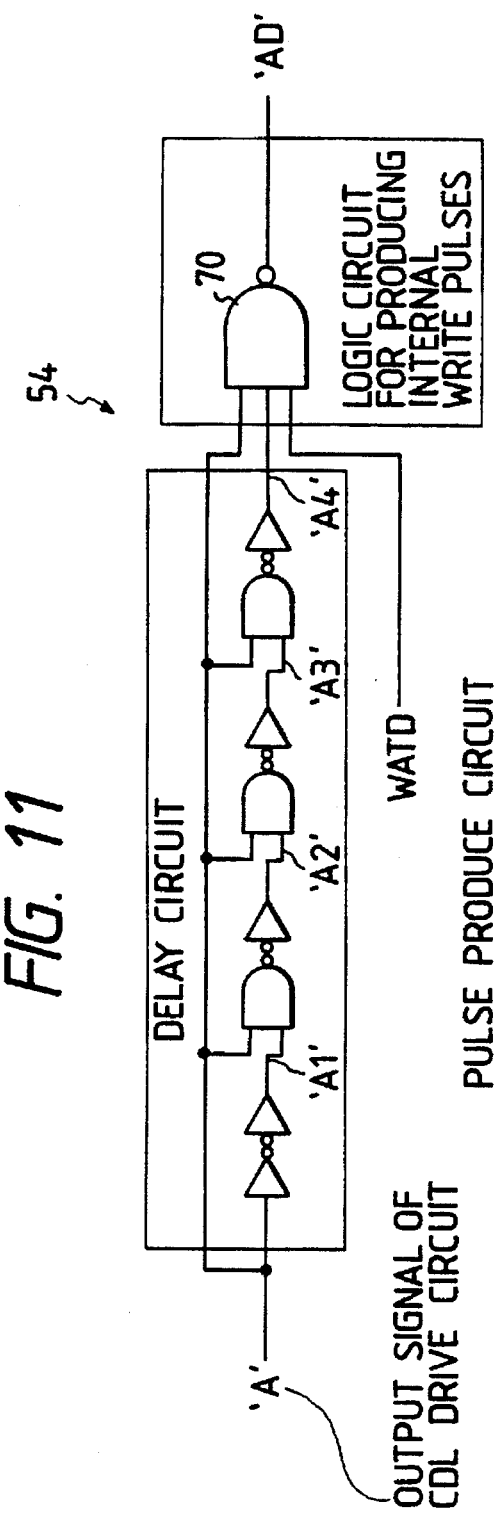
FIG. 11 is a circuit diagram showing one embodiment of a pulse generate circuit.

A specific construction of the pulse produce circuit 54 shown in FIG. 9 is shown in FIG. 11. This pulse produce circuit 54 is composed of an inverter circuit, a two-input NAND gate circuit and a three-input NAND gate circuit. A signal WATD appearing in FIG. 11 is a signal (of negative pulses) in which the ATD signal is given a pulse width with an appropriate time period necessary for writing the data by a pulse stretch circuit. When the input signal 'A' is held at the High level for a predetermined time period, the output signal 'AD' takes the Low level. The operating mechanism of the present pulse produce circuit is as follows. By taking an AND logic between an output signal 'A1' delayed from the input signal 'A' by two stages of inverter circuit and the input signal 'A', a signal 'A2' does not take the High level before the input signal 'A' and the output signal 'A1' take the High level. By taking an AND logic between the signal 'A2' and the signal 'A', moreover, an output signal 'A3' does not take the High level before the signal 'A2' takes the High level from the input signal 'A'. Thus, if the input signal 'A' is held at the High level from a time t0, when the signal 'A' is inputted, to a time t4 when a signal 'A4, is outputted, the output signal 'AD' takes the Low level. If the time period of the Low level is present in the time period from the time t0 to the time t4, the output signal 'AD' does not take the Low level but takes the High level at all times. In the description made above, it is assumed that the signal WATD is fixed.

Figure 13:
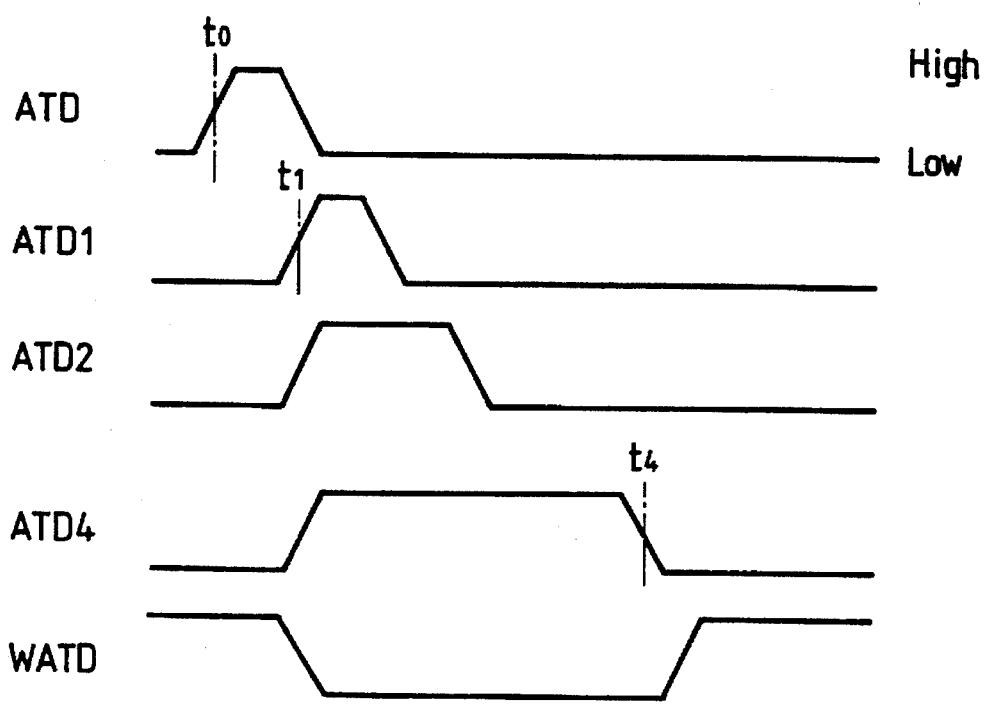
FIG. 13 is a timing chart showing an operating status of the WATD generate circuit.
Figure 12:
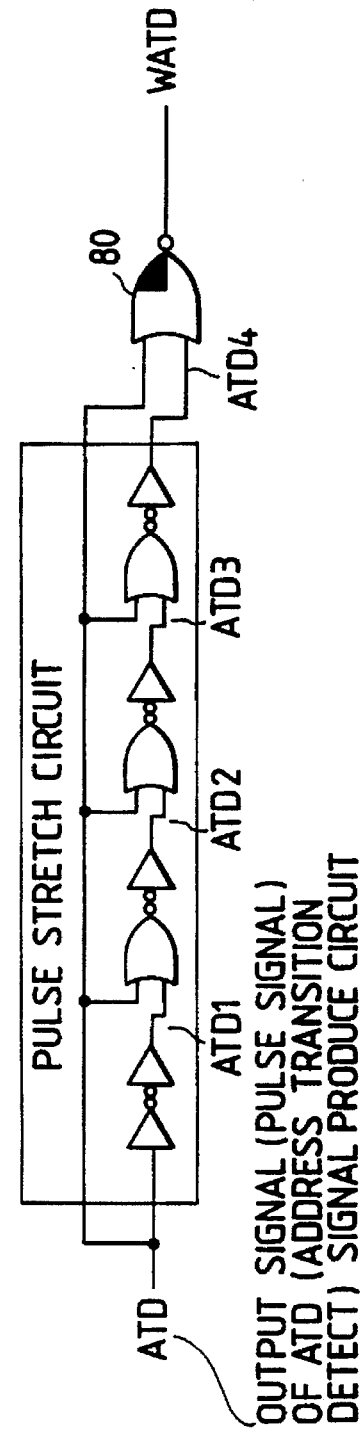
FIG. 12 is a circuit diagram showing one embodiment of a WATD generate circuit.

A WATD signal produce circuit will now be described. One embodiment is shown in FIG. 12. The WATD signal produce circuit is composed of an inverter circuit and a two-input NOR gate circuit. The operation mechanism of this circuit will be described with reference to a timing chart shown in FIG. 13. When the ATD signal of positive pulses is inputted at the time t0, a signal ATD1, which is delayed by the two stages of inverter circuits, is outputted at the time t2. By taking an OR logic between the input signal ATD and the signal ATD1, the input signal ATD turns into a stretched signal ATD2. By repeating these operations, the ATD pulse is a signal stretched for the time period from the time t1 to the time t4 and is transformed into a negative pulse by the final two-input NOR gate circuit (i.e., BiNMOS gate circuit) 80. Each WATD signal produce circuit is provided for each memory mat. After the writing operation of one address has been ended to drop the signal 'AD' shown in FIGS. 9 and 11 to the Low level, the output 'AD' of a three-input NAND gate circuit 70 is reset to the High level by the Low pulse of the WATD signal in case the same data are to be written by changing the address, and the two-input NAND gate circuit 55 of FIG. 9 again takes the Low level in case the signal 'A' is at the High level, so that the data are written.

The basic construction of the present invention has been described hereinbefore. Next, the entire construction of a write circuit which is designed on the basis of the basic construction of the present invention will be described.

Figure 14:
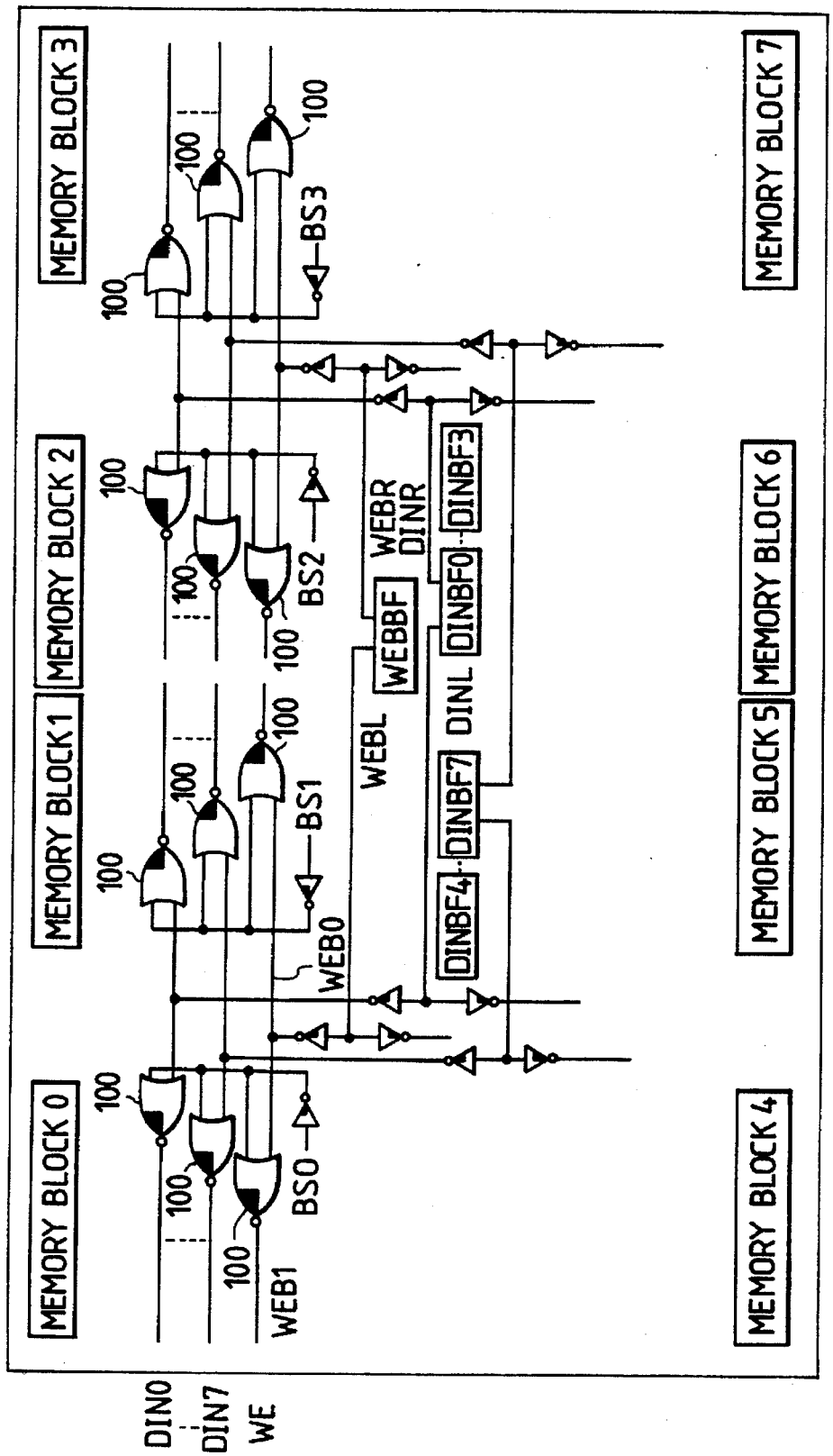
FIG. 14 is an explanatory diagram showing the in-chip wiring image of a write enable signal WEB and a data input signal DIN.

FIG. 14 is a diagram showing a wiring image of the external write enable signal WEB and the data input signal DIN. There is shown the case in which eight memory blocks is each composed of a plurality of memory mats (e.g., eight or sixteen mats in the present embodiment) and in which the data input/output are of eight bits at the most. In this case, there are eight data input signal lines DIN. A signal BS appearing in FIG. 14 is a block select signal, and the memory blocks are selected when the block select signal BS takes the High level. In case no memory block is selected, the block select signal BS is at the Low level so that the output of a two-input NOR gate circuit (i.e., BiNMOS circuit) 100 is fixed at the Low level no matter which the external write enable signal WE and the data input signal DIN might take the Low or High level. This is because the write enable signal (WEB) WEB and the data input signal line DIN are activated only in the selected block so as to reduce the power consumption. On or after the outputting of the two-input NPR gate circuit 100, the write enable signal WEB turks into the positive signal WE which comes into the writing state at the High level.

Figure 15:
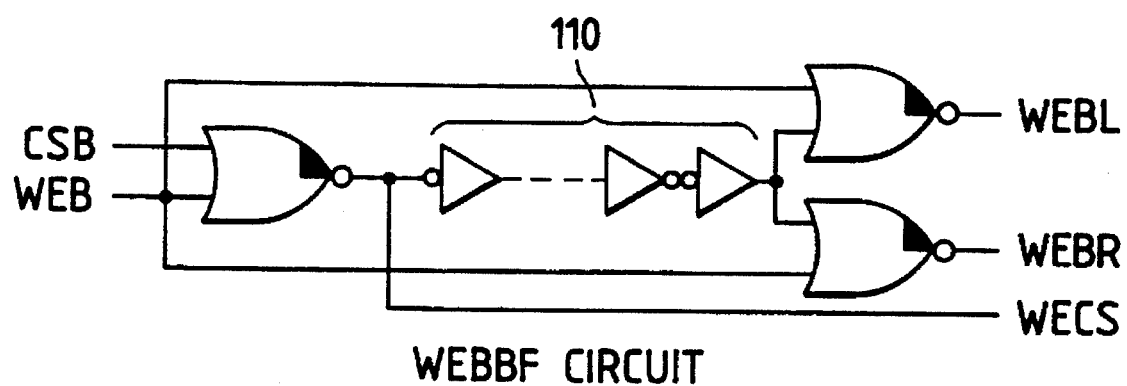
FIG. 15 is a circuit diagram showing one embodiment of a WEB generate circuit.

FIG. 15 is a diagram showing a circuit (as designated at WEBBF in FIG. 14) from the output of the WEB buffer to the inputs WEBL and WEBR of the lefthand and righthand WEB signal lines of the chip. The inputs WEBL and WEPR are fixed at the Low level to reduce the power consumption in case the chip select signal CSB takes a level other than the Low level (for selecting the chip). In FIG. 15, a plurality of inverter circuits 110 are those for delaying the outputting the signals WEBL and WEBR till the mat select signal MS is outputted, so as to prevent an erroneous writing.

Figure 16:
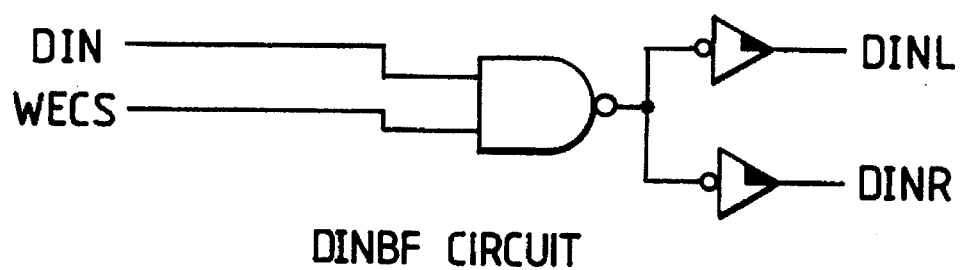
FIG. 16 is a circuit diagram showing one embodiment of a DIN generate circuit.

FIG. 16 is a diagram showing a circuit (as designated at DINBF in FIG. 14) from the output of the DIN buffer to the inputs DINL and DINR of the lefthand and righthand signal lines of the chip. The inputs DINL and DINR are fixed to reduce the power consumption in case the signal WECS taking the High level when the chip is selected to instruct the writing operation takes a level other than the High level.

In response to decode signals such as the WE and DIN signals and the MS and DSEL signals thus distributed to the individual memory mats, the write control signal generate circuits arranged in the individual memory mats produce the signals for controlling the writing operation finally, such as the CDL drive signal.

Figure 17:
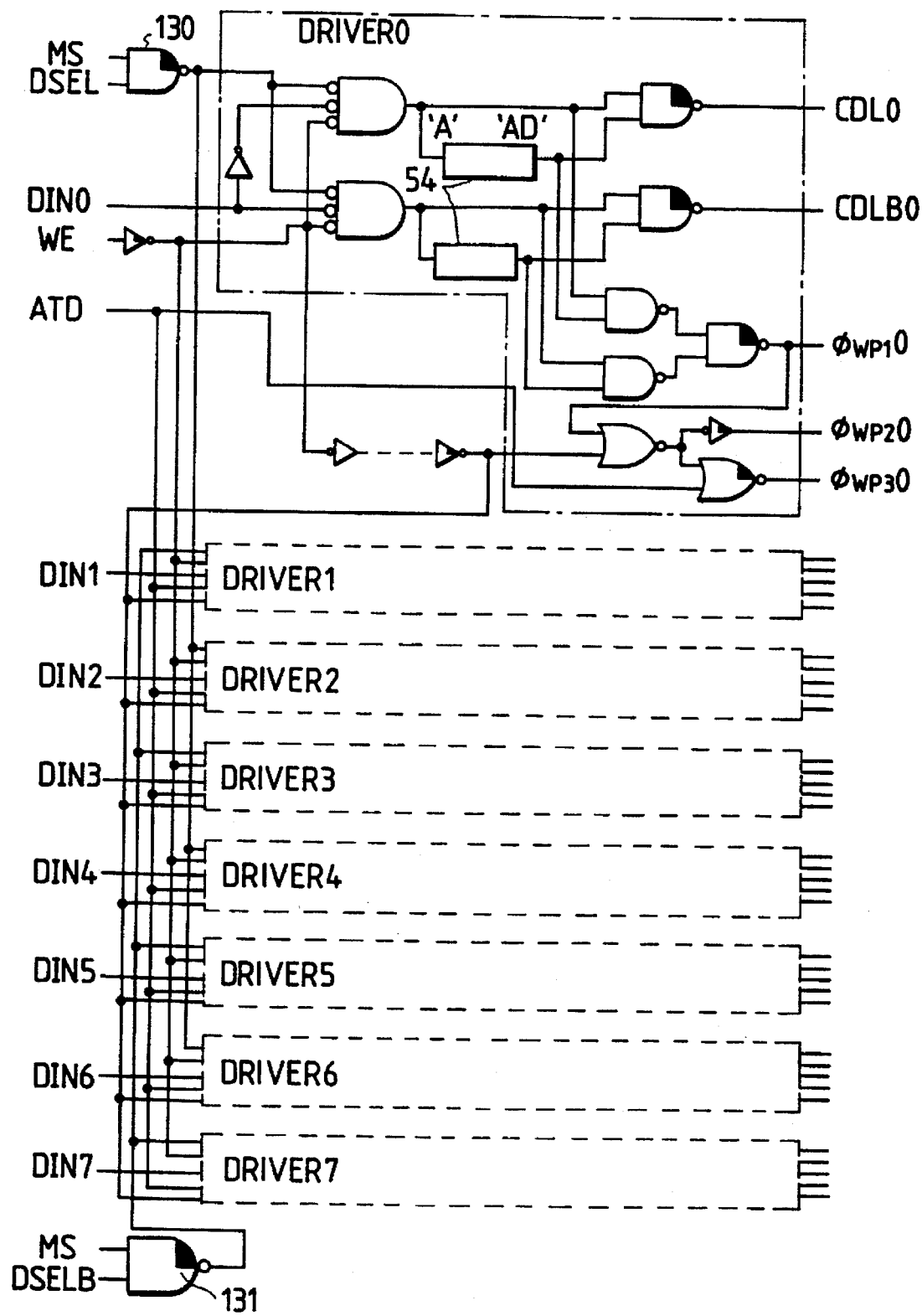
FIG. 17 is a circuit diagram showing one embodiment (of 1 set/memory mat) of a write control signal generate circuit.

FIG. 17 shows an embodiment of the write control signal generate circuit, each set of which is arranged for each memory mat. This circuit is presented by imagining the case of inputs/outputs of ×4 (bits) ×8 (bits) on the basis of FIG. 9. Either of two-input NAND gate circuits 130 and 131 takes the Low level for ×4 (bits), and both of them are fixed at the Low level for ×8 (bits). Signals φWP10, φWP20 and φWP30 are added to the timing chart of FIG. 10 and shown in FIG. 19. The data line load control signal φWP10, the data line and common data line recover control signal φWP20 and the data line and common data line equalize signal φWP30 can also realize the high-speed write recovery because they are controlled by the internal pulses, as shown.

Figure 18:
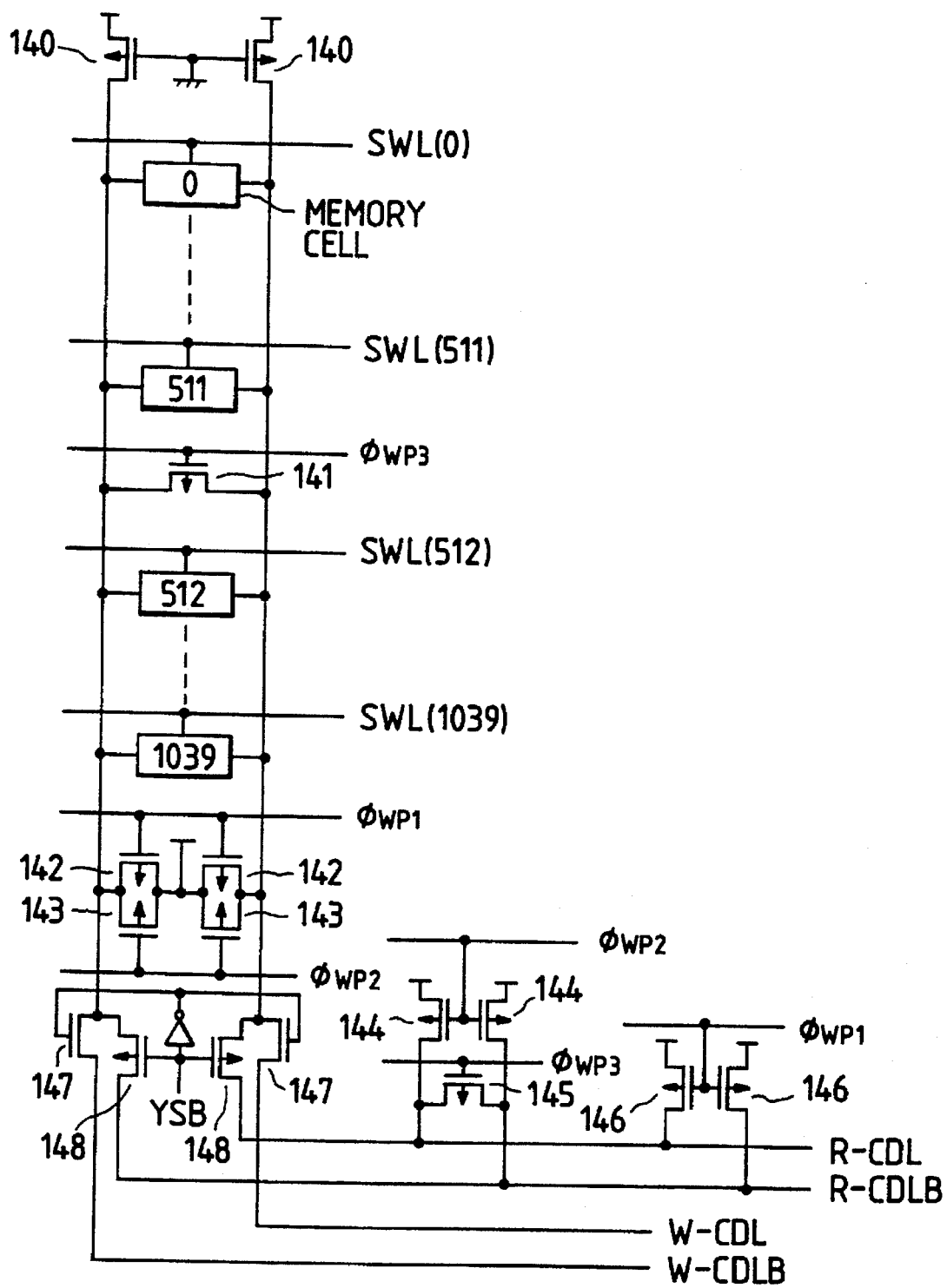
FIG. 18 is a schematic diagram showing one data line pair.

FIG. 18 shows one pair of data lines. The common data lines are shown in case they are divided into a read dedicated common data line (R-CDL) and a write dedicated common data line (W-CDL). A signal YSB is a column select signal. A data line load PMOS 142 and a common data line load PMOS 146 are controlled by the signal φWP1; a data line recover PMOS 143 and a common data line (R-CDL) recover PMOS 144 are controlled by the signal φWP2; and a data line equalize PMOS 141 and a common data line (R-CDL) equalize PMOS 145 are controlled by the signal φWP3.

In the write signal thus constructed, the following facts have been determined. The aforementioned data write time tW was set to 4 ns, and the external write enable signal WEB and the data input signal DIN were simulated with the minimum pulse width of 8 ns. The data lines were recovered 2 ns earlier than the rise of the external write enable signal WEB so that a write recover time tWR could be easily reduced to zero.

(Other Embodiments)

The embodiments thus far described have their circuit scales larger than that of the system of the prior art because the pulse produce circuit is provided for each common data line. Therefore, another design is made in case the pulse produce circuit is provided for each memory block so that the internal write pulses may be produced.

Figure 20:
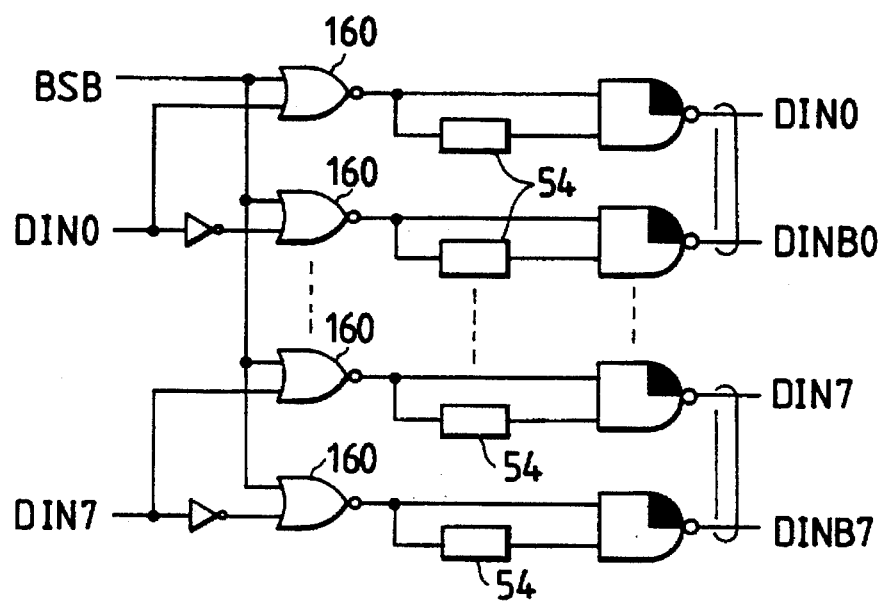
FIG. 20 is a circuit diagram showing an embodiment in case a pulse generate circuit is provided at the unit of a memory block.

FIG. 20 shows an embodiment of this case, in which each memory block has an input of ×8 (bits). When a block select signal BSB takes the Low level, either two-input NOR gate circuit 160 takes the High output for each DIN signal. Then, the pulse produce circuit 54 produces such a negative pulse as is based on the same principle as described above to set the potential of either the DIN line or the DINB lime to the Low level for a predetermined time period. In response to this signal, the write control circuit arranged for each memory mat, as shown in FIG. 17, realizes the self-write system. This system has less hardware thin that of the aforementioned case, in which the pulse produce circuit is provided for each common data line, but has double DIN lines.

Figure 21:
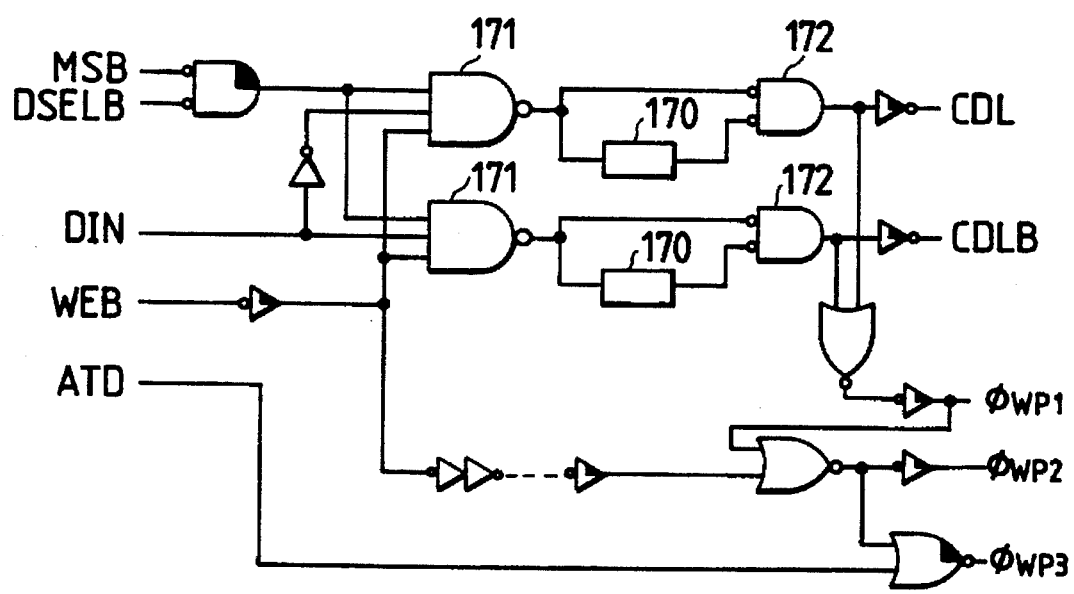
FIG. 21 is a circuit diagram showing another embodiment of the write control signal generate circuit.

FIG. 21 shows another embodiment of the write control circuit shown in FIG. 17, for each common data line pair.

When a mat select signal MSB, a data select signal DSELB and the write enable signal WEB all take the Low level, either of the three-input NAND gate circuits 171 takes the Low level. Since a pulse produce circuit 170 is set to the Low level for the signal WEB of the High level, either a two-input NOR gate circuit 172 then takes the High level, and the common data line CDL or CDLB takes the Low level so that the data are written.

The pulse produce circuit is one for outputting the High level if the input signal holds the Low level for the predetermined time period (tW). When the output takes the High level after the time period tW, the two-input NOR gate circuits 172 take the Low output so that the write recovery is automatically started.

(Embodiment other than Write Circuit)

An embodiment other than the write circuit will be described in the following.

Figure 22:
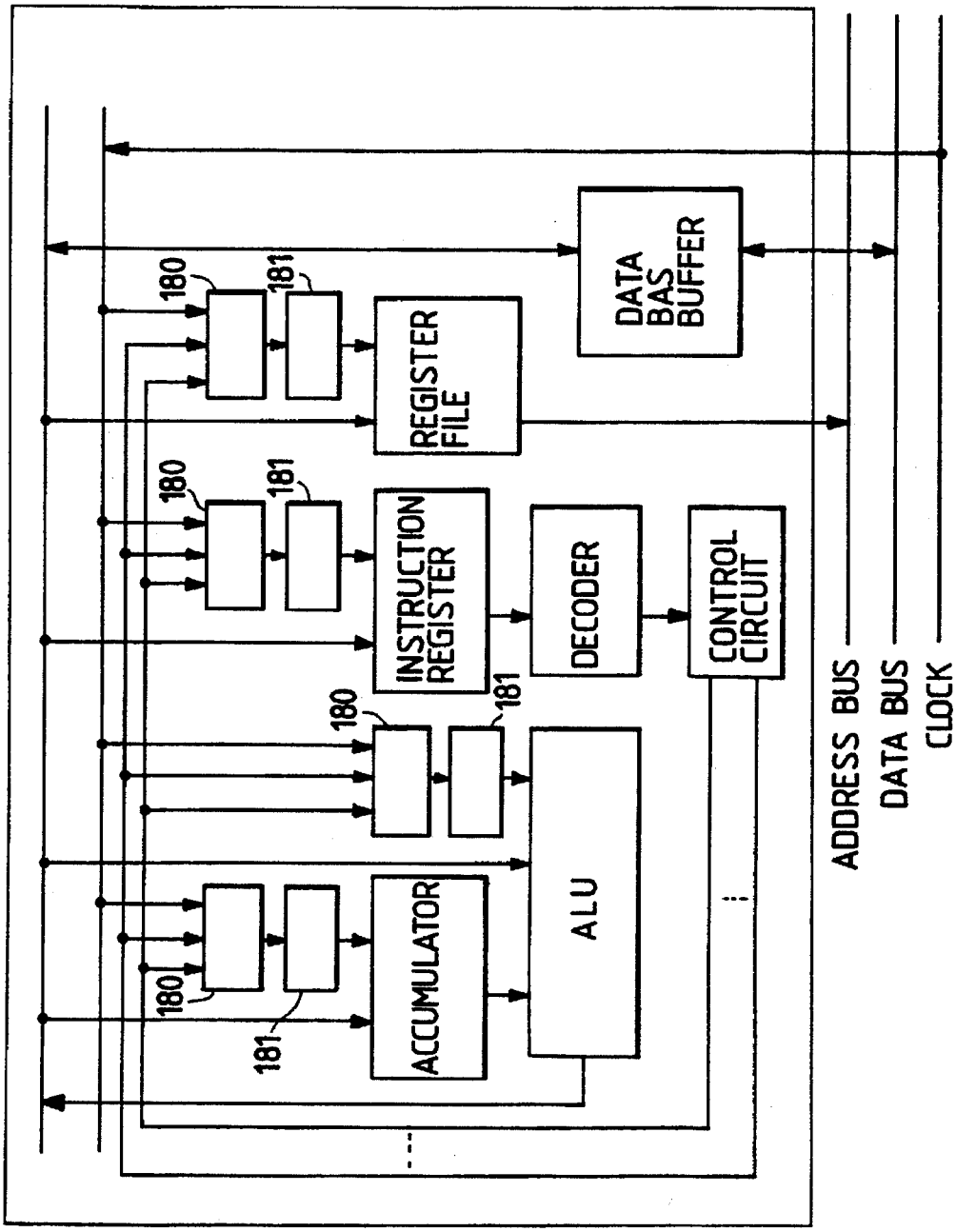
FIG. 22 is a circuit block diagram in case the present invention is applied to a microprocessor.

FIG. 22 is a circuit block diagram showing the case in which the present invention is applied to a microprocessor. In this microprocessor, an accumulator, an ALU, an instruction register and a register file are individually equipped with a logic circuit 180 and a pulse generate circuit 181, so that a pulse signal is produced from a logic between the signal (if necessary) produced by the control circuit and an external clock signal and is used as a control signal. Incidentally, a plurality of the logic circuits 180 and the pulse generate circuit 181 may be provided, if necessary, for each circuit block. Thus, unlike the case in which the pulse signal is transmitted from one pulse generate circuit to a number of circuit blocks, the microprocessor can be operated with the pulse signal having precise pulse timing and width so that the operating speed can be accelerated.

Figure 23:
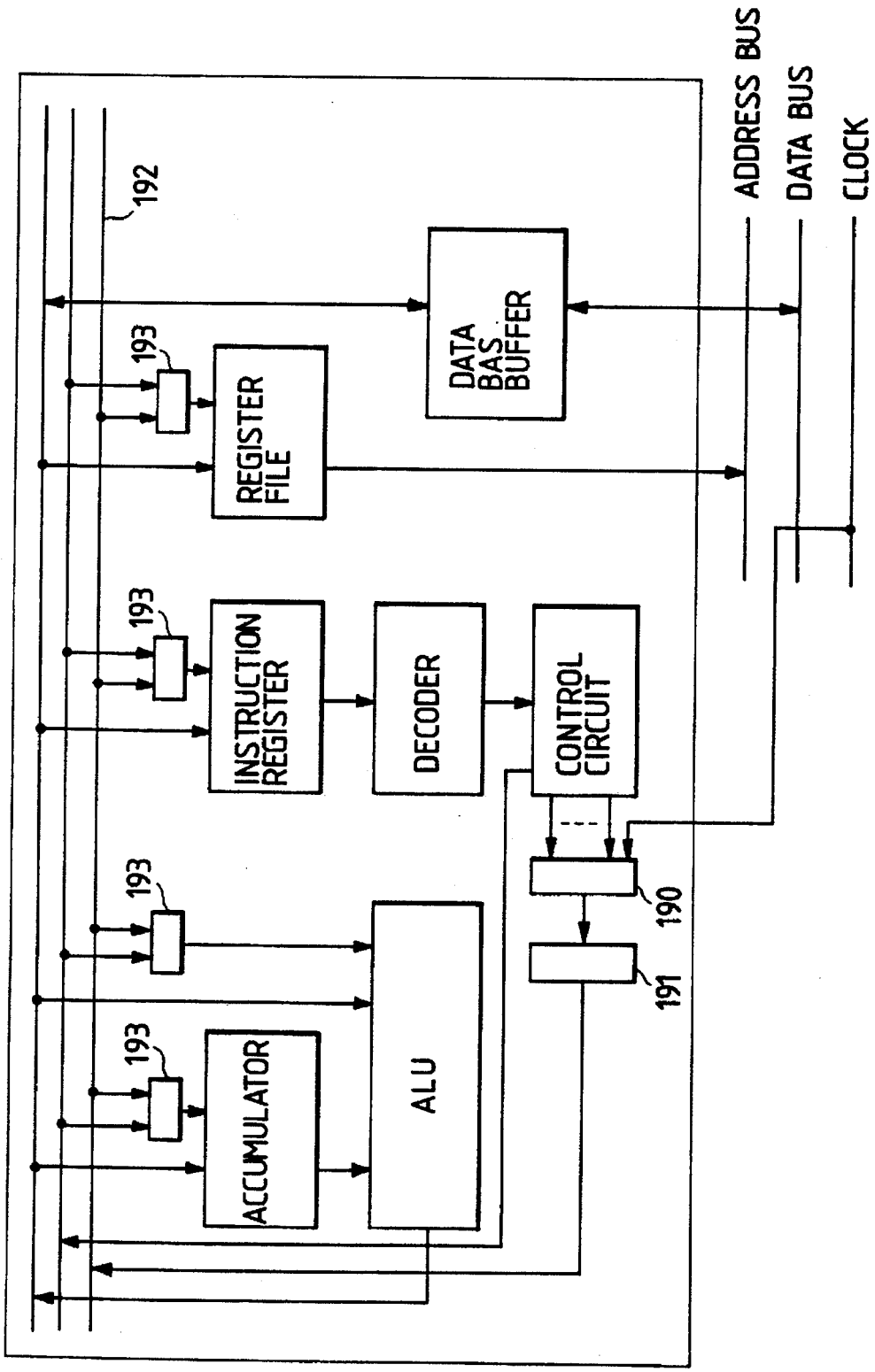
FIG. 23 is a circuit block diagram of a microprocessor of the prior art.

FIG. 23 is a circuit block diagram showing a microprocessor in case the present invention is not used. A logic circuit 190 and a pulse generate circuit 191 are formed in one portion of the chip, and a pulse signal is transmitted through an internal signal bus 192. Moreover, a logic is taken, if necessary, with the control signal by a logic circuit 193 arranged in each circuit block and is used as the final pulse signal.

This system suffers from a problem of skew of the pulse signal produced by the internal signal bus 192 and the timing with the control signal so that it is difficult to precisely control.

The effect of the case, in which the present invention is applied to the write circuit, is that a pulse signal having a small width can be used as the write pulse without considering the skew of the pulse signal and the timing margin between the pulse signal and another control signal. As a result, the recovery of the data line can be started before the rise of the external write enable signal WEB, so that a sufficiently large margin can be taken for an erroneous write and a delay of a write recover access to reduce the write recovery time tWR easily to zero.

Since the chip control circuit region is arranged at one central portion of the chip, the signal wiring lines between the control circuits have to be made to have a considerable distance such as the length of the shorter side or the longer side of the chip. For example, a semiconductor memory such as a dynamic random access memory (as will be abbreviated to "DRAM") or a static random access memory (as will also be abbreviated to "SRAM") selects and reads memory cells of the X-th power of 2 with an address of X bits and executes the writing operation (wherein X: a positive integer). The input pads of X bits are located at the outermost portion of the chip, i.e., outside of the memory cell array, and an address buffer for amplifying their signals is also disposed close to the input pads. In case the input of X bits is divided into an m-number of a, b, c, - - -, and n (wherein a to n: positive integers, a+b+- - -+n=X) bits in both the row and column directions from the more significant bit, there are an m-kinds of predecoders which act as first-stage logic circuits for predecoding the address signal. At this time, the address buffer has complementary outputs so that a logic is taken from a plurality of complementary outputs, M=(the a-th power of 2+the b-th power of 2+the c-th power of 2+- - -+the n-th power of 2), if the number of the predecoders or the first-stage logic circuits is designated at M. At this time, the outputs of the predecoders, from which a logic has been taken, are wired as the inputs of many gates up to the memory cell peripheries of the chip entirety and are decoded for the reading and writing operations.

However, the semiconductor integrated circuit device of the prior art described above encounters the following problems as it is highly integrated. As the bit number increases, the address increases at the bit-number-th power of 2. As a result, the number of drive circuits increases so that the number of gates to be driven by the output of the logic gate in one predecoder or one first-stage circuit group increases with the increase in the circuit scale. In short, the fan-out per one logic gate increases so that the load capacity increases.

Moreover, the number of elements composing one chip increases to complicate the logic thereby to increase the numbers of logic stages and logic gates drastically. As a result, the number of wiring lines drastically increases, and the chip area is enlarged by the increase in the numbers of wiring lines and logic gates.

When the chip area is enlarged, the output wiring lines are elongated so that the delay time due to the resistance and capacity of the wiring lines takes a higher ratio in the operating time period of the circuit. The shortening of this delay time is indispensable for the high speed-operation of the circuit.

The above-specified problem will be described in detail by taking up a memory as an example. If the integration according to the finer working size increases to have a degree of four times, the size of one memory cell cannot be reduced to a value as small as one quarter. As a result, the area exclusively of the memory cell portion in the memory entirety is not made smaller than that before the degree of integration is raised, even if the working size is made finer.

Moreover, the number of the least significant circuits in the peripheries of the memory cells reaches as high as four times so that the chip is extremely enlarged. For the high integration, the relation of M=(the a-th power of 2+the b-th power of 2+the c-th power of 2+- - -+the n-th power of 2) holds, if the number of the output wiring lines of the predecoder group or the logic circuits for predecoding the address signals is designated at M because it is the number of predecoders.

In the predecoders, on the other hand, the fan-out for distributing the predecoded outputs to the individual memory cell decoders increases so that the gate load to be driven through the output wiring lines accordingly rises.

Since the wiring lines are elongated, moreover, the load to be driven by the predecoders increases in both its capacity and resistance so that the gate width has to be enlarged so as to raise the driving power of the predecoders.

Thus, the number of integrated elements and the number of wiring lines increase with the gate width of the drive gate so that the size of the chip is enlarged.

As the chip area increases, moreover, the outputs of the predecoders are wired in the entirety of the chip from end to end so that the wiring length takes a value of 10 mm or more in the longer side direction.

In accordance with the finer construction, still moreover, the inter-line capacity increases to enlarge the wiring line capacity and resistance so that the ratio of the delay time due to the wiring lines to the access time increases.

Other defects are that the fan-out increases because the predecoded outputs are distributed to the individual memory cell decoders, and that the delay time is elongated because the gate load to be driven by the output wiring lines increases. These problems of the delay time causes by the wiring lines and the delay time caused by the increase in the load capacity are present not only in the decoder circuit but also in a sense circuit, a write circuit and another signal control circuit.

Due to the high integration, furthermore, the layout design scale of the circuit is enlarged with the number of layout elements so that the production is complicated with the increase in the number of manufacture steps. As a result, many mistakes arise to cause the delay in the layout design.

In order to reduce the increase in the chip size according to the high integration, on the other hand, an LOC (i.e., Lead On Chip) structure can be provided in which the bonding pads arranged outside of the memory cells at the lead frame side in the semiconductor integrated circuit device of this kind of the prior art are gathered and arrayed at the center of the chip so as to reduce the increase in the chip size. If the region of the circuit in the periphery of the memory cells of the chip for driving the memory cells directly is adopted as a direct region of the peripheral circuit and if the input/ output buffers, the pads and other signal control circuits other than the direct peripheral circuit region are adopted as an indirect peripheral circuit, the predecoder circuit has its multiple wiring lines led in the chip entirety, in case the predecoders are arranged in the vicinity of the address buffer in the indirect peripheral circuit region of the central portion. As a result, the output wiring line region takes a large area to invite the defect of an increase in the chip size.

These problems can be solved by the following constructions to reduce the signal delay caused by the wiring lines, thereby to provide a semiconductor integrated circuit device which can achieve a high-speed operation even with a small size and which can design the layout easily and simply.

According to the present invention, there is provided a semiconductor integrated circuit device having at least one kind of transistors such as NMOS transistors, PMOS transistors and bipolar transistors integrated therein, which device comprises: a plurality of circuit function blocks having a driver group for directly driving a group of transistors for realizing a memory function or an arithmetic function; a plurality of more significant recognize circuits disposed individually for said circuit function blocks for recognizing said circuit function blocks individually; and a group of logic circuits required commonly by said circuit function blocks for outputting signals by taking a logic from input signals, wherein the number of said logic circuit group is in plurality equal to or less than the number of said circuit function blocks existing in a chip.

The semiconductor integrated circuit device further comprises: signal output lines wired in the entirety of said chip; a plurality of circuit function blocks having an identical function in said chip; recognize circuits provided individually for said circuit function blocks for recognizing said circuit function blocks; and a plurality of drive logic circuits provided for the individual inputs of said circuit function blocks for driving said circuit function blocks.

The semiconductor integrated circuit device can also comprise: a plurality of memory cell array blocks having a driver group for directly driving a group of transistors for realizing a memory function; a plurality of more significant recognize circuits disposed individually for said memory cell array blocks for recognizing said memory cell array blocks individually; and a plurality of predecoder circuits or a group of logic circuits required commonly by said memory cell array blocks for outputting signals by taking a logic from input signals, wherein the number of said predecoder circuits is equal to or less than the number of said memory cell array blocks existing in a chip.

The semiconductor integrated circuit device can also comprise: a plurality of circuit function blocks having a driver group for directly driving a group of transistors for realizing a memory function or an arithmetic function; a plurality of more significant recognize circuits disposed individually for said circuit function blocks for recognizing said circuit function blocks individually; and a group of logic circuits required commonly by said circuit function blocks for outputting signals by taking a logic from input signals, wherein when the outputs of said logic circuit group are distributed in plurality to the driver inputs to be drive, an intermediate buffer is disposed on a common wiring line so that the inputs of a gate of the subsequent stage are shared before and after said intermediate buffer.

The semiconductor integrated circuit device can also comprise: a plurality of circuit function blocks having a driver group for directly driving a group of transistors for realizing a memory function or an arithmetic function; a plurality of more significant recognize circuits disposed individually for said circuit function blocks for recognizing said circuit function blocks individually; and a group of logic circuits required commonly by said circuit function blocks for outputting signals by taking a logic from input signals, wherein the inputs of said logic circuit group are input buffer outputs in said chip, and wherein when said input buffer outputs are distributed in plurality to the inputs of said logic circuit group to be drive, an intermediate buffer is disposed on a common wiring line so that the inputs of a gate of the subsequent stage are shared before and after said intermediate buffer.

The semiconductor integrated circuit device can also comprise: a plurality of circuit function blocks having a driver group for directly driving a group of transistors for realizing a memory function or an arithmetic function; a plurality of more significant recognize circuits disposed individually for said circuit function blocks for recognizing said circuit function blocks individually; and a group of logic circuits required commonly by said circuit function blocks for outputting signals by taking a logic from input signals, wherein the inputs of said logic circuit group are input buffer outputs in said chip, and wherein when said input buffer outputs are distributed in plurality to tie inputs of said logic circuit group to be drive, an intermediate buffer of a CMOS structure composed of NMOS transistors and PMOS transistors is disposed on a common wiring line so that the inputs of a gate of the subsequent stage are shared before and after said intermediate buffer.

The semiconductor integrated circuit device can also comprise: a plurality of circuit function blocks having a driver group for directly driving a group of transistors for realizing a memory function or an arithmetic function; a plurality of more significant recognize circuits disposed individually for said circuit function blocks for recognizing said circuit function blocks individually; and a group of logic circuits required commonly by said circuit function blocks for outputting signals by taking a logic from input signals, wherein the inputs of said logic circuit group are input buffer outputs in said chip, and wherein when said input buffer outputs are distributed in plurality to the inputs of said logic circuit group to be drive, an intermediate buffer having CMOS structure composed of NMOS transistors and PMOS transistors connected complementarily and a BiCMOS structure composed of bipolar transistors is disposed on a common wiring line so that the inputs of a gate of the subsequent stage are shared before and after said intermediate buffer.

The semiconductor integrated circuit device can also comprise: a plurality of circuit function blocks having a driver group for directly driving a group of transistors for realizing a memory function or an arithmetic function; a plurality of more significant recognize circuits disposed individually for said circuit function blocks for recognizing said circuit function blocks individually; and a group of logic circuits required commonly by said circuit function blocks for outputting signals by taking a logic from input signals, wherein the number of said logic circuit group is equal to or less than the number of said circuit function blocks existing in a chip, wherein the inputs of said logic circuit group for outputting the signals prepared by taking a logic from the input signals required commonly by said blocks are input buffer outputs in said chip, and wherein when said input buffer outputs are distributed in plurality to the inputs of said logic circuit group to be drive, an intermediate buffer is disposed on a common wiring line so that the inputs of a gate of the subsequent stage are shared before and after said intermediate buffer.

In the semiconductor integrated circuit devices discussed above a logic circuit for distributing an input signal can have input signal outputting wiring lines common to said chip and can have at least one drive circuit on the wiring lines, and the drive circuit can be an intermediate buffer having a CMOS structure composed of NMOS transistors and PMOS transistors and a BiCMOS structure composed of bipolar transistors.

Also in the semiconductor integrated circuit devices discussed above the logic circuit for distributing an input signal can have input signal outputting wiring lines common to said chip and have at least one drive circuit on said wiring lines, and wherein said drive circuit can be an intermediate buffer having a CMOS structure composed of NMOS transistors and PMOS transistors and a BiCMOS structure composed of bipolar transistors.

The semiconductor integrated circuit device can also comprise: a memory cell array having output lines for address input wired in the entirety of a chip and divided into an m-number (wherein m≧2) of sets in said chip; a plurality of recognize circuits for recognizing the m-sets of memory cell arrays individually; a plurality of predecoder groups or logic circuit groups arranged in said chip before drive logic circuits, which are used to drive said m-sets of memory cells arrays, and near said memory cell arrays for driving sail drive logic circuits directly; and a semiconductor memory or a cache memory having its input connected with an address output wired commonly.

The semiconductor integrated circuit device can also comprise: a memory cell array having output lines for address input wired in the entirety of a chip and divided into an m-number (wherein m≧2) of sets in said chip; a plurality of recognize circuits for recognizing the m-sets of memory cell arrays individually; a plurality of predecoder groups or logic circuit groups arranged in said chip before drive logic circuits, which are used to drive said m-sets of memory cell arrays, and near said memory cell arrays for driving sail drive logic circuits directly; and a semiconductor memory or a cache memory having its input connected with an address output wired commonly, wherein sail output wiring lines are relayed by several inverted or noninverted buffer circuits to the inputs of said predecoder groups.

The semiconductor integrated circuit device can also comprise: a function block having output lines for address input wired in the entirety of a chip and divided into an m-number (wherein m≧2) of sets in said chip; a plurality of recognize circuits for recognizing the m-sets of function blocks individually; a plurality of first logic circuit groups or logic circuit groups arranged in said chip before drive logic circuits, which are used to drive said m-sets of function blocks, and near said function blocks for driving said drive logic circuits directly; and a semiconductor memory or a cache memory having its input connected with an address output wired commonly, wherein said output wiring lines are relayed by at least one inverted or noninverted buffer circuit to the inputs of said first logic circuit groups.

The semiconductor memory system can also comprise: a memory cell array having output lines for address input wired in the entirety of a chip and divided into an m-number (wherein m≧2) of sets in said chip; a plurality of predecoder groups or logic circuit groups arranged in said chip before drive logic circuits, which are used to drive said m-sets of memory cell arrays, and near said memory cell arrays for driving said drive logic circuits directly; and a semiconductor memory or a cache memory having its input connected with an address output wired commonly, wherein said output wiring lines are relayed by several inverted or noninverted buffer circuits to the inputs of said predecoder groups.

In short, according to the present invention, the predecoders or the first stage logic circuit groups for distributing the input signal into the chip are arranged in plurality and distributed in the vicinity of the block for distributing the output so that the fan-out is reduced.

Moreover, each block selection can be accelerated by providing each block with the recognize circuit.

The chip area is reduced by shortening the wiring lines between the logic gates having a high fan-out and by reducing the number of the wiring lines led from one logic to a wide area of the chip, i.e., by suppressing the distribution of the signals from one portion through a number of long wiring lines.

In order to suppress the increase in the chip size, the outputs amplified from the input signals are wired in the wiring region by the first stage logic gates to the plurality of first stage logic gate circuit groups which have the input signal wiring lines arranged in the vicinity of the memory cell array.

In order to reduce the delay in the wiring lines, moreover, a z-number (wherein z: an integer) of drive circuits (or intermediate buffers) are disposed in the wiring lines.

Specific solving means will be described by taking up a memory as an example. The load capacity to be driven by one predecoder is reduced by arranging one set of predecoder groups or first stage logic gate groups in one memory cell array group so as to achieve a predecoder output as the signal control circuit input for selecting the row select decoder and the column select decoder for the m-groups of memory cell arrays. The address buffer outputs are wired in the entirety of the chip to the predecoder, which is arranged in the vicinity of the memory cell array group, that is, to the predecoder input.

In order to reduce the signal delay to be caused by the wiring lines, furthermore, the wiring lines of the input signal of the first stage logic are widened to reduce their resistance, and the clearance between the wiring lines is increased to increase the pitch of the output wiring lines of the address buffer thereby to reduce the wiring capacity. And the wiring lines are arranged with the z-number of intermediate buffers.

With reference to FIG. 25, the operations of the case in which the present invention is applied to a memory LSI will now be described. The outputs of the first stage logic gates are arranged in the number of M=(the a-th power of 2+the b-th power of 2+the c-th power of 2+- - -+the n-th power of 2). In FIG. 25, the eight logic blocks of the present invention are used as the memory cell arrays. In FIG. 25, a chip 9 is constructed to include: memory cell arrays 6 including redundancy relieving memories; a decoder circuit group 7 including redundancy relieving decoder circuits; a predecoder group 8; most significant bit recognize circuits 2; an address buffer group 5; intermediate suffers 12; bonding pads 20; and address pads 21. The decoder circuit group includes drivers, which are driven by the less significant logics for decoding the circuit group for driving the memory cells directly. In the predecoders of the prior art acting as the chip control circuits, the buffers are arranged at the lead frame side, as located at the outermost side of the chip, and the predecoders are arranged around the central peripheral circuit regions. However, the pads are arranged at the chip center so that the address buffers are accordingly arranged in the periphery of the pads, i.e., in the vicinity of the chip center.

Figure 26:
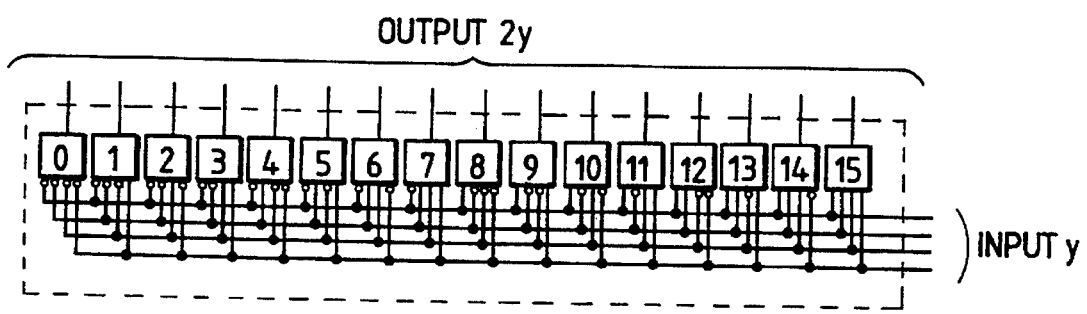
FIG. 26 is an explanatory diagram showing the output number of logic gates from 4 bits.

If, at this time, the predecoders at the first stage of the decoder portion are arranged as in the prior art in the vicinity of the address buffers, they have sixteen outputs because they receive the complementary outputs of the address buffers and because they act as the first stage logic gates for predecoding the addresses of y bits (e.g., 4 bits), as shown in FIG. 26, and because they have logic gates in number of y-th power (e.g., 16) of 2. In order to drive the memory cells by taking a logic between the output of the predecoder composed of the most significant bit and the outputs of the less significant predecoders, the less significant bits are required to have such a fan-out as corresponds to the number of predecoder outputs of the more significant bits. If the most significant bit is the a-bit, for example, the fan-out number of the outputs of the predecoders of the less significant bits b is the a-th power of 2.

According to the present invention, therefore, a logic of several bits is taken from the more significant bits, as shown in FIG. 25, to divide the memory cell array region of the chip, and the predecoders of the remaining less significant bits are arranged in plurality on the chip at each of the divided memory cell array regions so that their fan-out can be reduced to the number of divisions by the more significant bits, that is, one of the a-th power of 2. As a result, the output loads of the predecoders are reduced to reduce the wiring line length of the predecoder outputs to the chip division length so that both the wiring line capacity and resistance can be reduced to speed up the delay time from the predecoder group in the vicinity of the memory arrays, the fan-out of the loads to be driven by the predecoder group is reduced to one several-th (e.g., one eighth in FIG. 25) of the predecoder group in the case of wiring the lines in the chip entirety, so that the access from the predecoders is speeded up.

Figure 24:
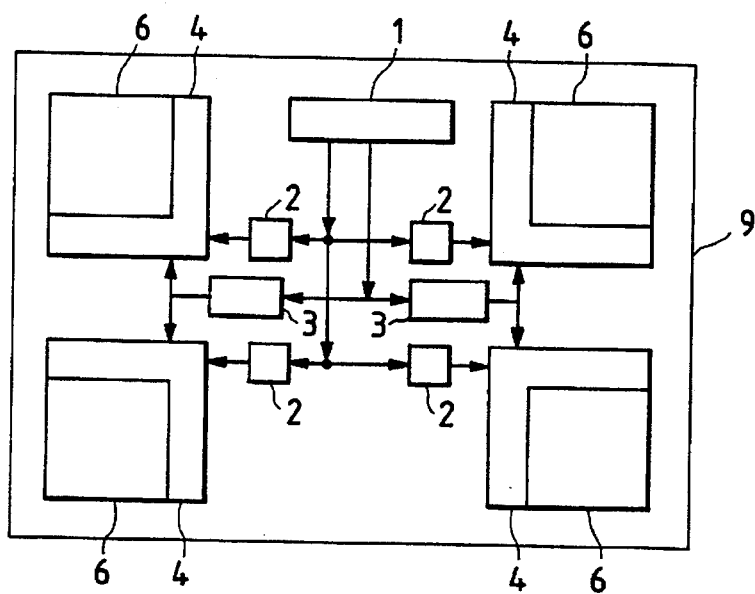
FIG. 24 is a block diagram schematically showing a construction of a semiconductor integrated circuit device according to the present invention.

According to the method of the prior art in which the predecoders are arranged at the central portion, if the predecoded signal outputs are arranged to the individual memory cell arrays, the wiring lines are arranged in multiplicity in the longer side direction of the chip. In case the outputs of a plurality of bit addresses of X=24 are to be decoded, the fourth power of 2, i.e., sixteen outputs are arranged in one kind of prerecorder in the predecoding case of 4 bits. Because of 24 bits, there exist six kinds of predecoders of 4 bits having sixteen outputs so that output wiring lines of 6×6=96 run on the center of the chip. Moreover, the address outputs are used as not only the decode signals but also the input signals of the redundancy relieving program signals or in other signal control circuits. In order to drive the redundancy relieving circuits, therefore, the redundancy relieving program circuits are also arranged in the vicinity of the address buffers, and their outputs are arranged on the chip up to the position of the corresponding memory address so that their wiring lines also run in the longer side direction of the chip. Moreover, the outputs of the address transition detect circuits are also arranged at the corresponding individual positions on the chip because the circuits receive the outputs of the individual addresses. As a result, the number of wiring lines running in the longer side direction, that is, the number of wiring lines of the peripheral circuit region at the central portion takes a very large value if the wiring lines include those of the address outputs, the predecoder outputs and other signal control circuits. In order to decrease the chip size, especially the shorter side length, it is extremely useful to reduce the number of wiring lines running in the longer side direction. Of the wiring lines running at the central portion, the majority of these are predecode signal wiring lines so that their reduction is effective for reducing the wiring line regions. According to the present invention, by extending the outputs of the address buffers, as shown in FIG. 24, the number of wiring lines may be 2X, if the addresses are the memories of X bits, that is, 48 in the complementary outputs if the addresses are of 24 bits, and 24 in case of the single output, so that the number of wiring lines can be drastically reduced. Moreover, since the predecoders are arranged in the vicinity of each memory cell array group so that the address outputs are arranged to the side of the memory cell array group, the inputs of the redundancy relieving circuits can also be arranged in the vicinity of the relieving memory cells. As a result, the output wiring lines of the predecoders and the output wiring lines of the redundancy relieving circuits need not be arranged along in the longer side direction of the chip. As a result, the number of wiring lines running in the longer side direction of the chip can be reduced to shorten the shorter side of the chip. Other signal control circuits can be likewise arranged in the vicinity of the necessary memory cell array group. In the case of no restriction such as the delay time, a suppressed number of wiring lines can be placed in arbitrary positions on the chip so that the indirect peripheral regions of the central portion of the chip can be effectively used to reduce the chip size.

Moreover, the output wiring lines from the address buffers are equipped with the intermediate buffers. In the absence of the intermediate buffers, the gradient of the signal waveforms is made gentler by the load capacity and the wiring resistance to increase the through current of the subsequent stage gate, thus causing a defect that the power consumption is increased. Thanks to the intermediate buffers, the load capacity to be driven by the address buffers can be reduced to shape the waveforms of the signals so that the through current of the subsequent stage gate can be reduced to effect the high-speed operations. Moreover, the total number of the intermediate buffers of the address outputs to be used at this time is far smaller than that of the intermediate buffers which are required to arrange the predecode outputs in the longer side direction, so that the size can be more easily enlarged with a view to enhancing the load driving ability thereby to accelerate the high speed with a smaller area.

Moreover, the present invention can naturally become more effective for a system in which the input pads can be arranged all over the chip such as in a CCB (Controlled Collapse Bonding) arrangement.

Next, an embodiment of the present invention will be described in more detail with reference to the accompanying drawings.

FIG. 24 shows the present invention schematically. This embodiment is a circuit for performing a logic operation on common input signals. This circuit is constructed, in the case of a memory, to include: a chip 9; an input buffer 1; more significant bit recognize circuits 2; predecoders 3, transistor group arrays 6 having a memory function; and decoders 4 or direct drive circuits of the arrays 6. The predecoders 3 have their outputs controlled by the recognize circuits 2 to drive the arrays 6 by the decoders 4. As a result, the accessing at each switching time of the block can be speeded up. Moreover, these functions can be applied not only to the memory but also to logic gates having arithmetic functions.

FIG. 25 is a schematic diagram showing the case in which the present invention is applied to a chip having eight memory cell arrays, i.e., for a more significant bit decoder a=3. This embodiment is constructed to include: a chip 9; memory cell arrays 6 having a redundancy memory cell array; redundancy memory decoder and decoder driver circuit groups 7; predecoder groups 8 acting first stage logic circuit groups; an address buffer group for each of a plurality of addresses; more significant bit recognize circuits 2; signal control circuit groups 10 such as redundancy address program circuits; predecoder output wiring lines 11; intermediate buffers 12; address pads 21; and other bonding pads 20. The address buffers are connected from the pads 21 and have their outputs arranged on the longer sides of the chip. Each memory cell arrays 6 has the decoder circuit group 7, the more significant bit recognize circuit 2 and the predecoder group 8 and receives its address signal input from the wiring lines of the central portion in the longer side direction of the chip. The predecoder groups 8 predecode all the signals that are commonly required by one memory cell array. At this time, the address outputs are decoded by complementary signals. At this time, however, the fan-out of one address output takes a value of 8 for each of the memory cell group, in case the predecoder is a three-input logic gate, so that it takes a value of 64 in case the chip has no intermediate buffer 12 in its entirety. Although, in this case, the delay time due to the capacity and resistance of the wiring lines is elongated because of a high gate capacity and a large wiring line length, the fan-out and the capacity are reduced to one half, if the intermediate buffers 12 are inserted, so that the high-speed operations can be achieved. Since the fan-out of the predecoder outputs has a value of 1, the accessing from the predecoders to the memory cells can also be accelerated. If, at this time, inverters are used as the intermediate buffers, the predecoder circuit groups before the intermediate buffers are connected by inverting the complementary outputs from those of the predecoders of the memory cell groups after the intermediate buffers. If non-inverted buffer circuits are used, those outputs are similarly connected.

When the circuit layout design is to be made, the memory cell arrays, their decoders and the predecoder groups are laid out in one set such that the righthand four memory cell array portions and their decoder circuits are repeated, such that one set of the lefthand four memory cell arrays, their decoders and the predecoder groups are laid out and repeated, and such that the address buffers and the central chip portion wired with their outputs are laid out as one peripheral circuit region. Thus, the layout design can be facilitated for the memory cells of large layout scale. At this time, the intermediate buffers 12 may be made of any of the inverters CMOS, BiCMOS and BiNMOS. Moreover, the intermediate buffers 12 are most effective, if they are at a just half position of the wiring line length between the most righthand and lefthand sides of the address outputs, but they may be offset to one side.

Figure 27:
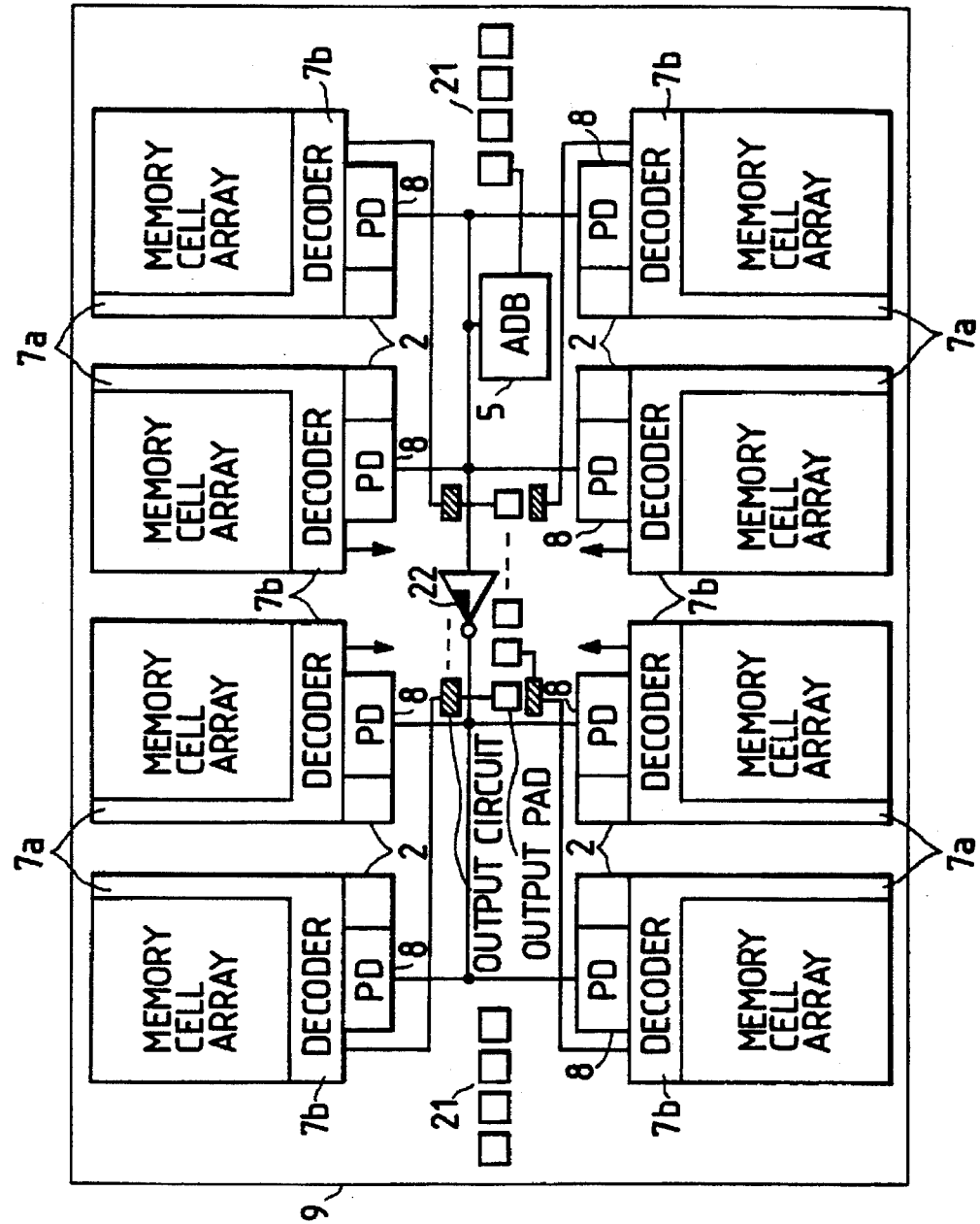
FIG. 27 is a block diagram showing the construction of one embodiment of the semiconductor integrated circuit device according to the present invention.

FIG. 27 is a schematic diagram of the case in which only one address output is noted in the present invention and in which the output of one predecoder circuit is noted. The following embodiments are presented by schematic diagrams in case only one address output is noted, unless otherwise specifically described. The intermediate buffers 22 are made of BiNMOS inverters.

Figure 28:
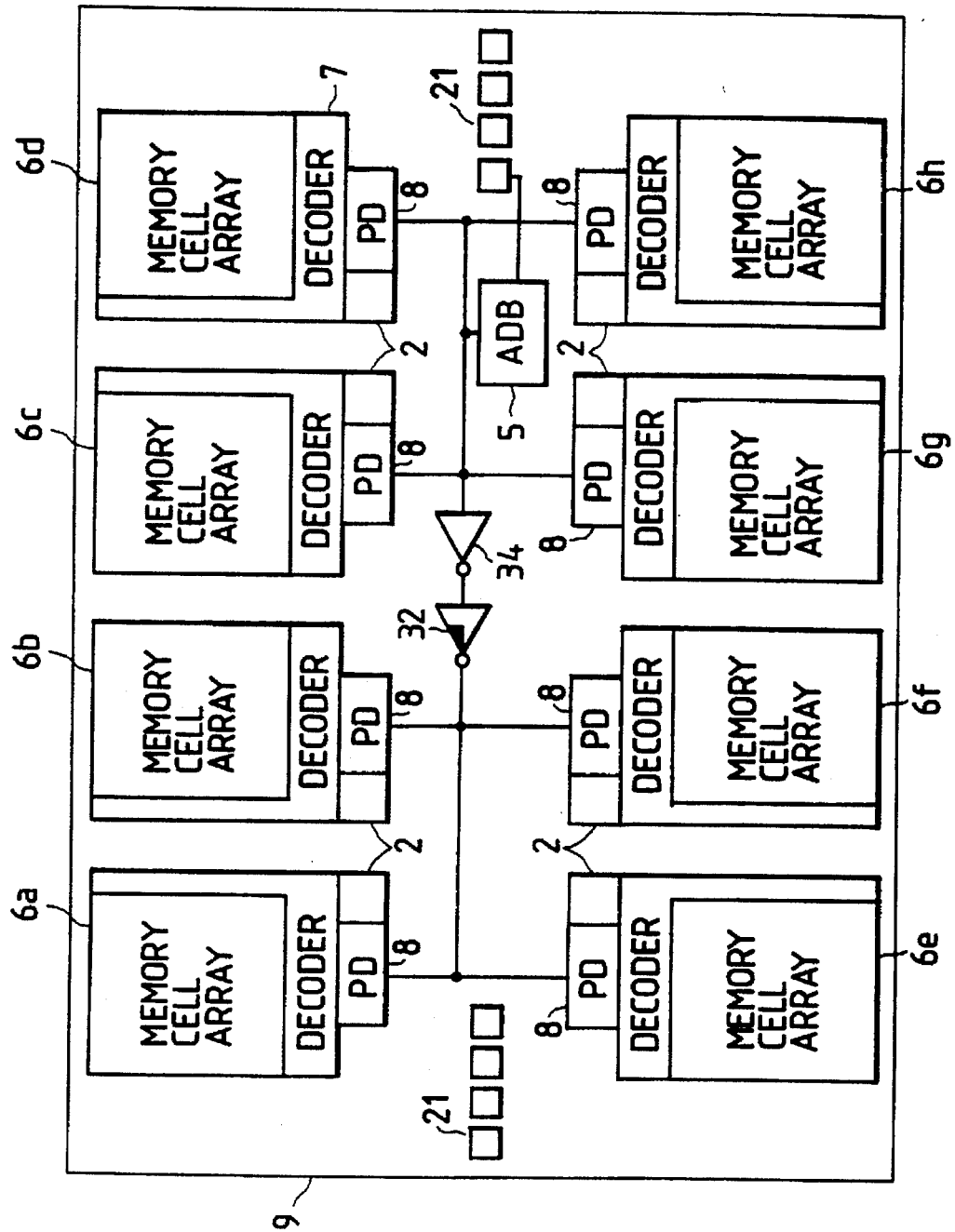
FIG. 28 is a block diagram showing the construction of another embodiment of the semiconductor integrated circuit device according to the present invention.

Next, FIG. 28 shows a second embodiment. This embodiment is equipped with intermediate buffers 32 and 34 in the output wiring line of the address buffer 5. The address output signal is inverted to have its waveform shaped by the intermediate buffer 34 acting as the CMOS inverter and is further inverted by the intermediate buffer 32 acting as the BiNMOS inverter so that the operations can be speeded up while suppressing the power consumption. At the layout time, the predecoder of any of the predecoder circuit groups of the memory cell array is connected without inverting the complementary output so that all the eight memory cell arrays, their decoders and the predecoder groups can be laid out in one set and repeated without being conscious of the presence of the buffers in the longer side direction. At this time, the intermediate buffer 34 is an inverter having a small CMOS size for shaping the waveforms, and the gate capacity and the output wiring line capacity of the predecoders are driven by the BiNMOS inverter 32 of the subsequent stage having a high driving power so that a high-speed accessing can be achieved. The buffer 34 may have its output inputted directly to the gate of the buffer 32 or connected through the output signal wiring line. The intermediate buffers 32 and 34 may be made of any of the inverters CMOS, BiCMOS and BiNMOS. Moreover, the intermediate buffers 32 and 34 are effective, in case they are directly connected, if they are positioned at such a half position of the wiring line length from the most righthand to the most lefthand side of the output as have their load halved to the output load to be driven by the address buffers in the absence of the intermediate buffers, but they may be offset to one side. Moreover, the intermediate buffer 32 can be enlarged in its size to enhance the driving power, because it does not participates in the capacity to be driven by the address buffer even it is large-sized. Thus, it is possible to achieve a high-speed access time.

Figure 29:
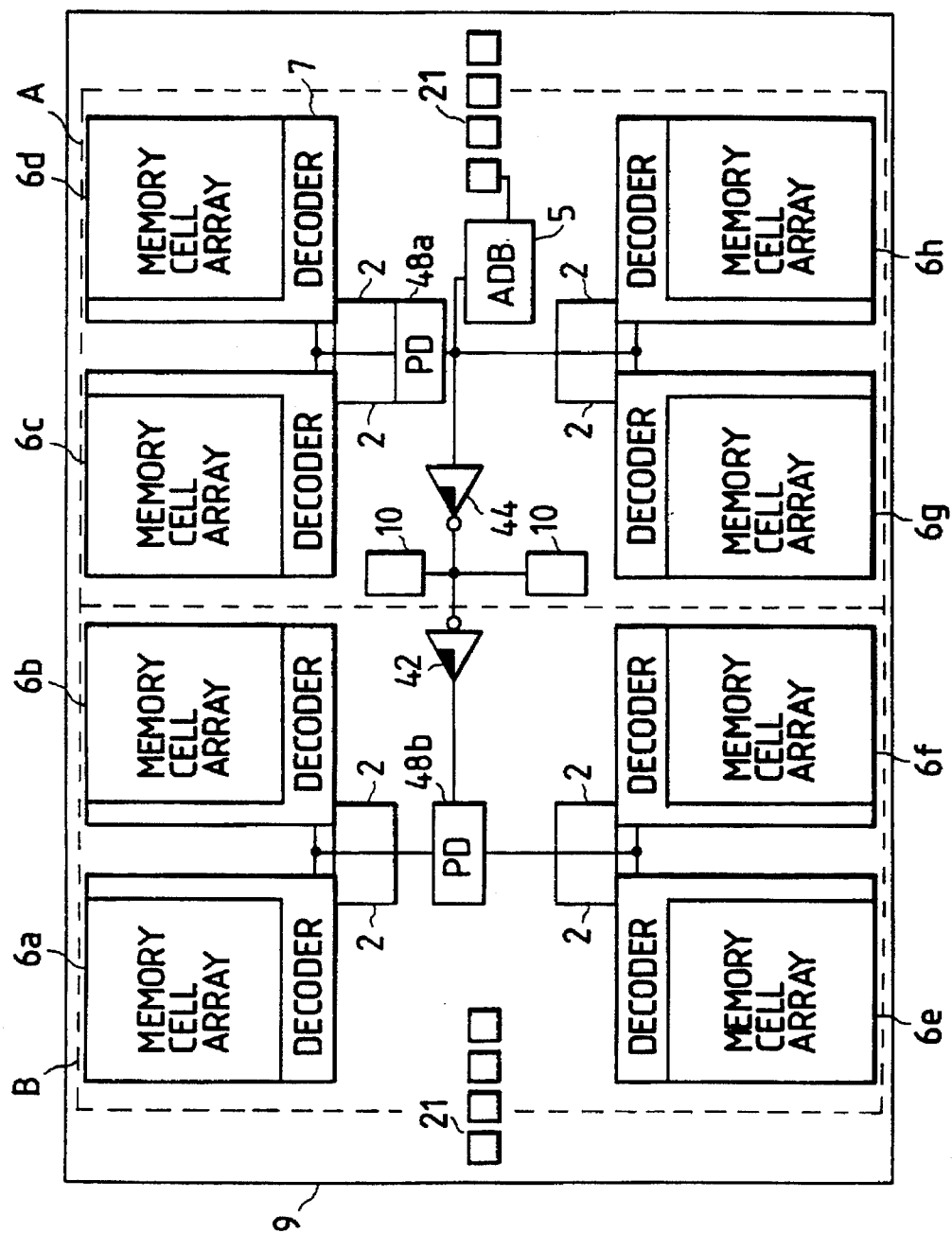
FIG. 29 is a block diagram showing the construction of another embodiment of the semiconductor integrated circuit device according to the present invention.

A third embodiment is shown in FIG. 29. This embodiment is equipped in its chip with two sets of predecoder groups, that is, for a more significant bit a=1. Predecoders 48a and 48b are arranged at the center of two memory cell array groups 6a, 6b, 6e and 6f, and 6e, 6d, 6g and 6h, and the address buffer has its output wiring line arranged with intermediate buffers 44 and 42, the former of which is equipped a signal control circuit 10 for a redundancy relieving program or the like. In the present embodiment, the number of predecoder circuits is twice as many as that of the arrangement of one set, but the number of the wiring lines to exert influenced upon the shorter side length can be reduced because it has only the outputs from the addresses. The fan-out, as viewed from the address buffers, can also be reduced by providing the intermediate buffers so that the high speed can be retained even if the signals are likewise fed to the chip entirety.

The outputs of the address buffers are arranged on the longer sides of the chip, and the predecoders have their individual outputs to the decoder circuits of the memory cell arrays and have a fan-out of 4. The intermediate buffer 44 is made of the BiNMOS so that it may drive the redundancy decode circuit and another signal control circuit 10. On the other hand, the intermediate buffer 42 can provide a high-speed accessing if it is made of the BiNMOS so as to drive the wiring line capacity and the predecoder circuits. Since the intermediate buffers are used in the two stages, the predecoder in the vicinity of the address outputs and the predecoder at the end remote from the address outputs can be connected through the same signals so that the layout can be simplified. Because of the two sets of predecoders, moreover, the number of the gate circuits can be reduced to a relatively small value. The intermediate buffers may be positioned either at a middle of all the load capacities to be driven by the address signals or at such an offset position according to the output loads as to minimize the delay time. The redundancy decoding circuit may be dispensed with, or another load may be added. A CMOS circuit may be used if the intermediate buffers 44 and 42 have a load capacity of less than 0.3 pF.

Figure 30:
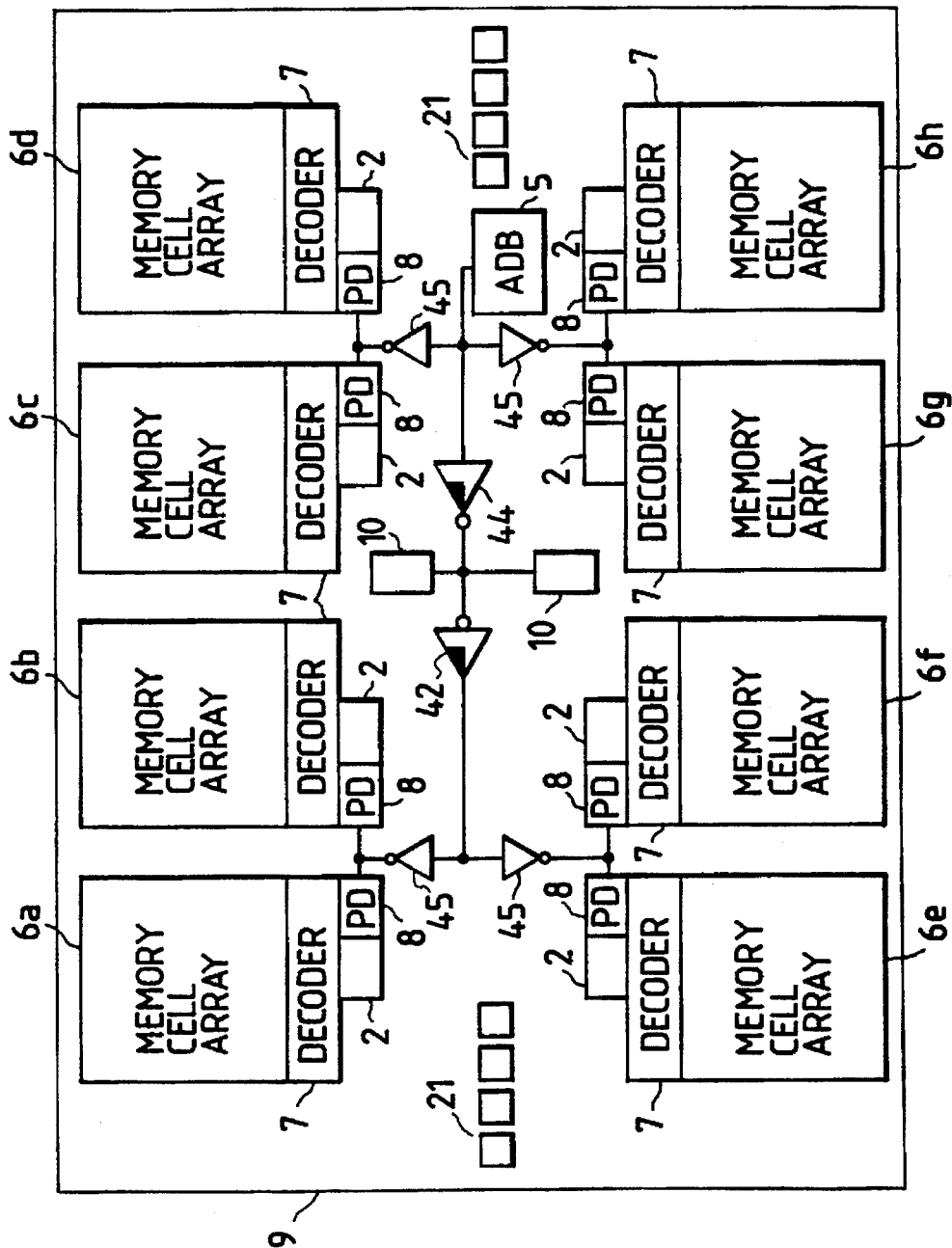
FIG. 30 is a block diagram showing the construction of another embodiment of the semiconductor integrated circuit device according to the present invention.

FIG. 30 shows a fourth embodiment. In FIG. 30, the embodiment has eight memory cell arrays, each of which is equipped with one set of predecoders. The address buffer is equipped at its output with the intermediate buffers 44 and 42, a redundancy decoder circuit 10, and a buffer 45 disposed before each predecoder for driving the wiring line capacity and the gate load capacity. This arrangement is effective especially in case the wiring line capacity and the gate load capacity of the predecoders are high, that is, in case the fan-out is high, in case the gate size is large and in case the wiring lines are thick. The positions of these buffers are set at arbitrary positions and are effectively used. The intermediate buffers may naturally be made of any of the inverters CMOS, BiCMOS and BiNMOS, and their number can be arbitrarily set.

Figure 31:
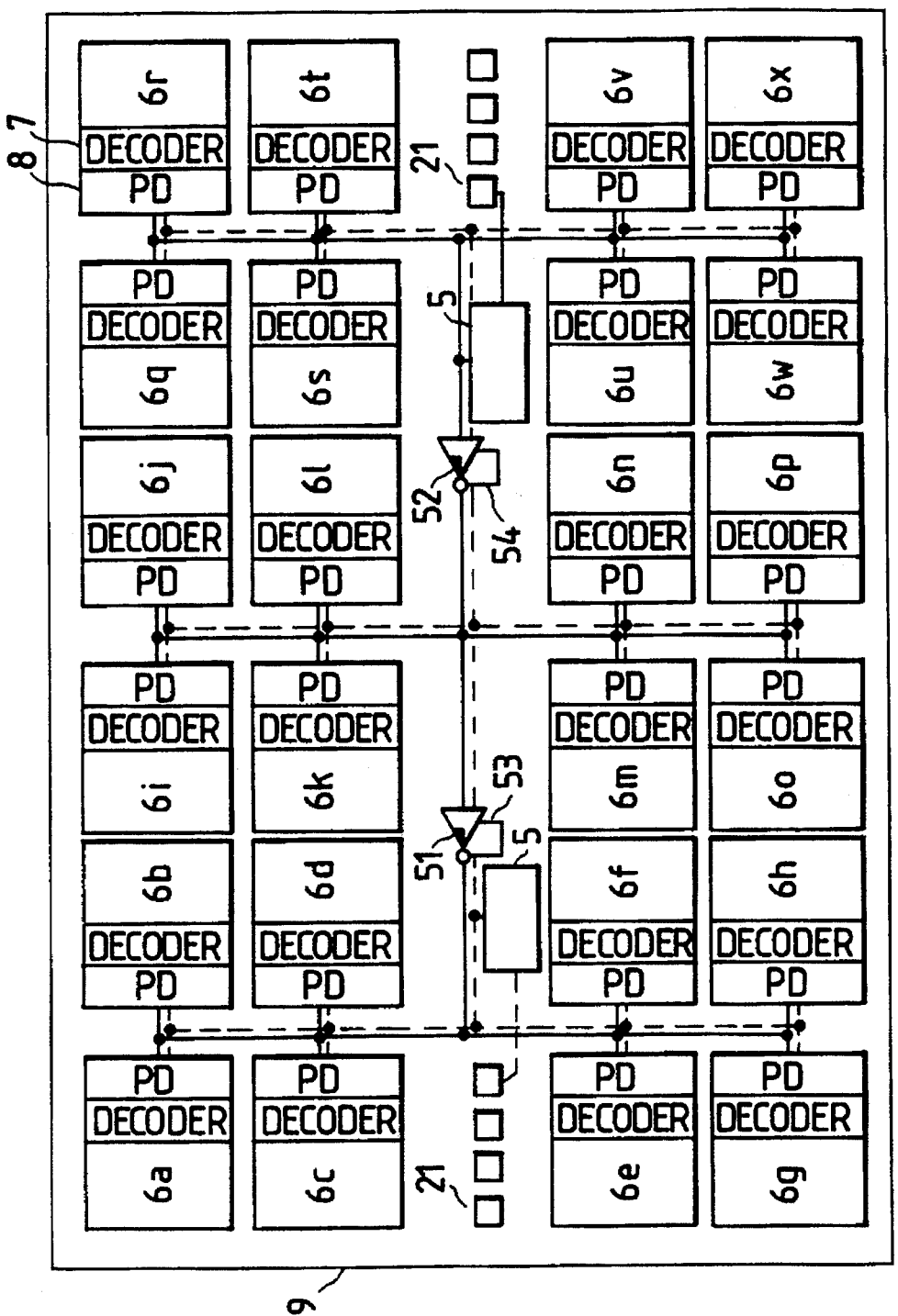
FIG. 31 is a block diagram showing the construction of another embodiment of the semiconductor integrated circuit device according to the present invention.
Figure 32:
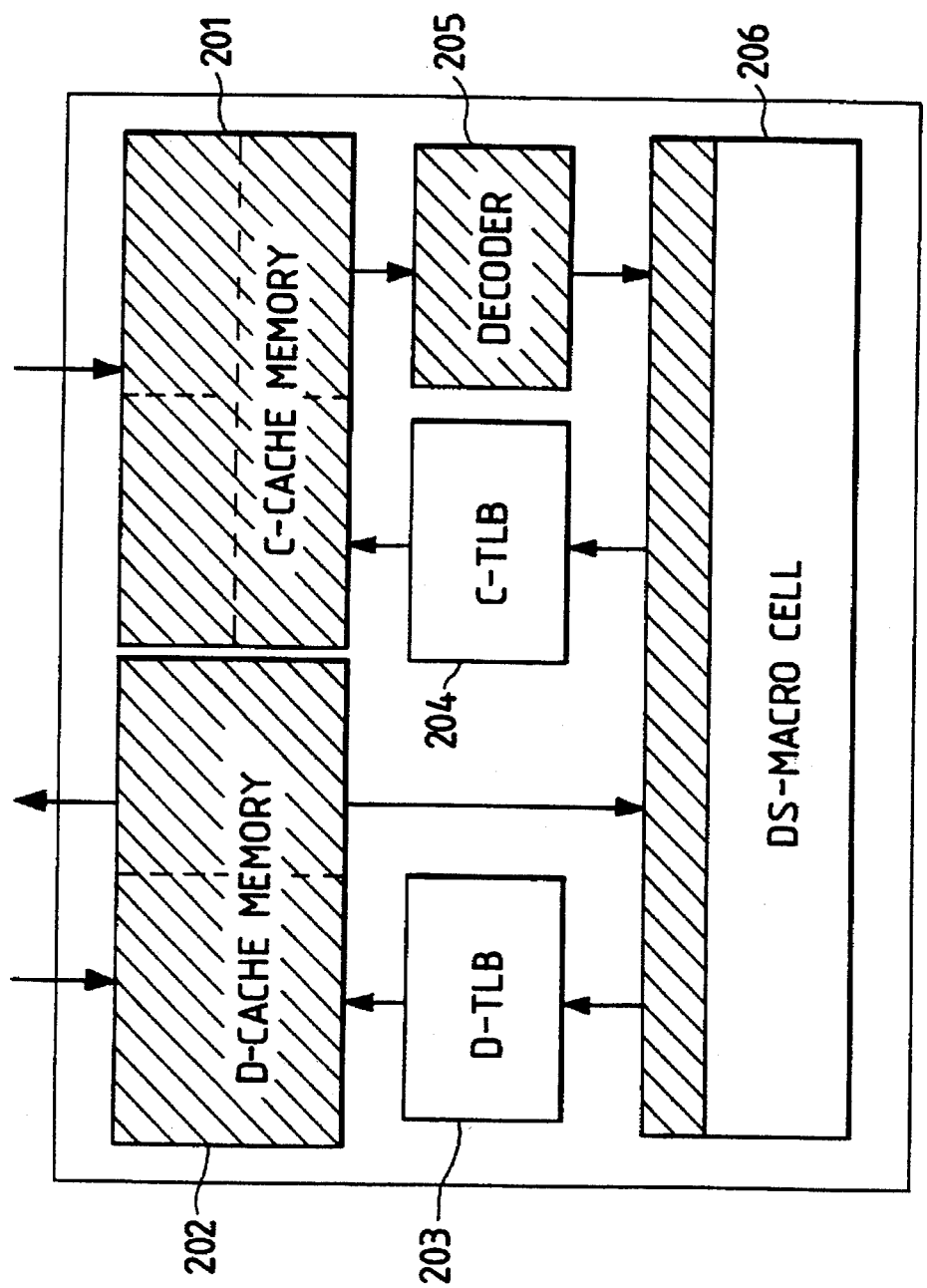
FIG. 32 is a block diagram showing an example in which the present invention is applied to a microprocessor.

FIG. 31 shows a fifth embodiment. In FIG. 31, the embodiment has twenty four memory cell arrays, each of which is equipped with one set of predecoders. The address buffer is equipped at its output with intermediate puffers 51, 52, 53 and 54, which are set at arbitrary positions and are effectively used. The intermediate buffers may naturally be made of any of the inverters CMOS, BiCMOS and BiNMOS, and their number can be arbitrarily set.

In any of the foregoing embodiments, the wiring line resistance can be dropped to speed up the operations by thickening the output wiring lines of the address signals. Moreover, the number of the wiring lines can be less than that of the case in which the wiring lines for the predecode signals of the prior art are arranged, to realize a decode circuit which has a lower wiring line delay in the wiring line region of the same area. The bonding pads for receiving the inputs from the outside can be positioned not only at the chip center but also in the peripheral portion or in any location between the functional blocks. The input buffers may be either the TTL input buffers or the ECL input buffers. Moreover, their outputs may be exemplified by complementary signals or equipped with an inverter at a single end. At the time of the single end output, the number of wiring lines can be further reduced so that the wiring lines to be operated with one address can be reduced from two to one thereby to reduce the current consumption. Incidentally, in case a multibit test is demanded, the address necessary for the test such as the output of a block or mat selecting input buffer may desirably have double ends.

This construction can be applied to any memory LSI such as an SRAM, a DRAM or a ROM.

Still moreover, a processor using such a high-speed memory, a processor using such a decoding method or a processor having an internal cache memory can be operated at a high speed to realize a system having a smaller size.

Incidentally, the present invention should not be limited to the embodiments thus far described but can be modified in its design such that the address outputs and the signals are arranged in a net shape on the chip to reduce the number of wiring lines.

Figure 33:
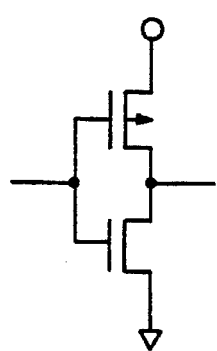
FIG. 33 is a circuit diagram showing one example of a specific circuit of an intermediate buffer in the semiconductor integrated circuit according to the present invention.
Figure 34:
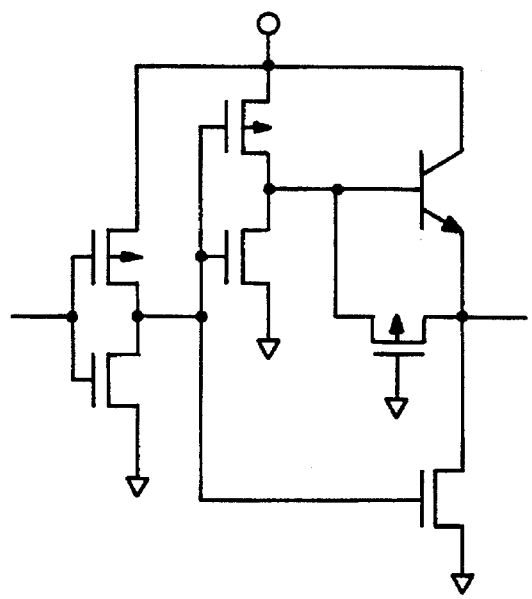
FIG. 34 is a circuit diagram showing one example of a specific circuit of an intermediate buffer in the semiconductor integrated circuit according to the present invention.

Next, the specific circuit constructions of the intermediate buffers of the aforementioned individual embodiments are shown in FIGS. 33 to 42. FIG. 33 shows a construction of the CMOS inverter acting as an intermediate buffer, and FIG. 34 shows a construction of a noninverted type intermediate buffer composed of a CMOS inverter and a BiCMOS inverter.

Figure 35:
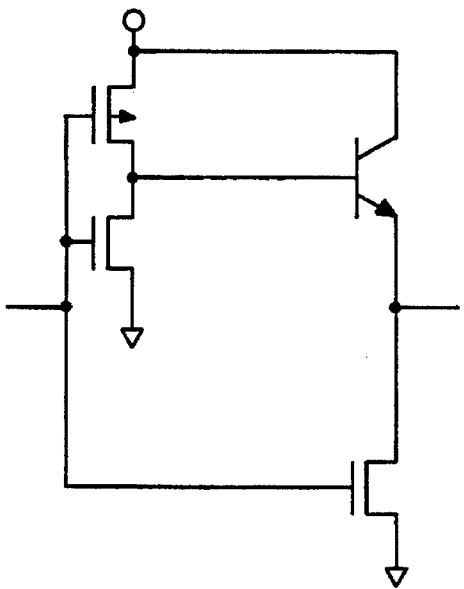
FIG. 35 is a circuit diagram showing one example of a specific circuit of an intermediate buffer in the semiconductor integrated circuit according to the present invention.
Figure 36:
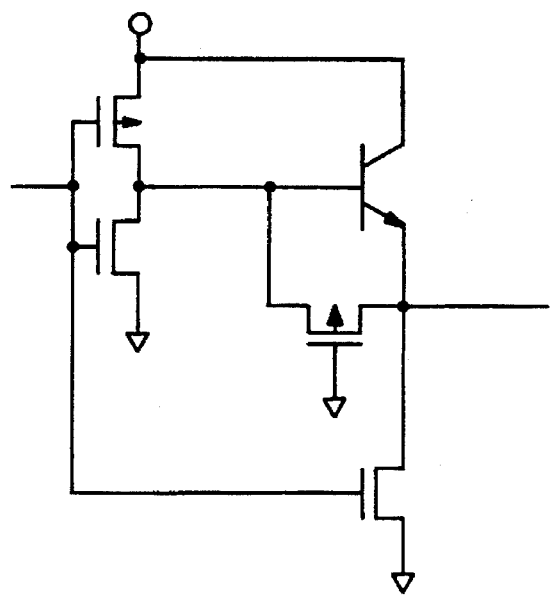
FIG. 36 is a circuit diagram showing one example of a specific circuit of an intermediate buffer in the semiconductor integrated circuit according to the present invention.
Figure 37:
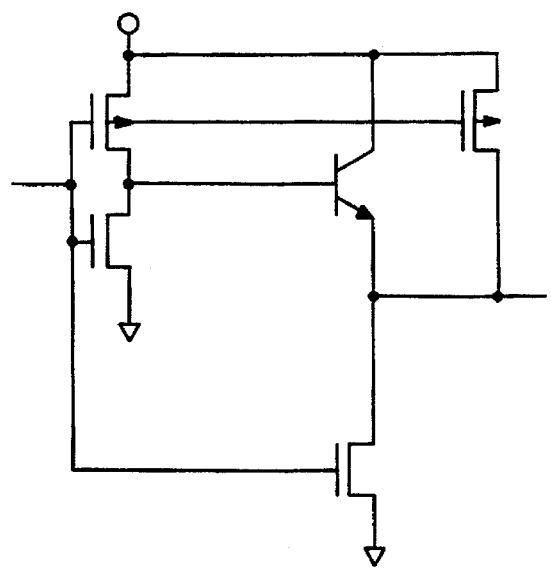
FIG. 37 as a circuit diagram showing one example of a specific circuit of an intermediate buffer in the semiconductor integrated circuit according to the present invention.

Moreover, FIG. 35 shows one example of a BiNMOS inverter composed of a CMOS and a bipolar transistor, and FIGS. 33 and 37 show one example of a BiNMOS inverter composed of a CMOS and bipolar transistors and having output pull-up elements.

Figure 38:
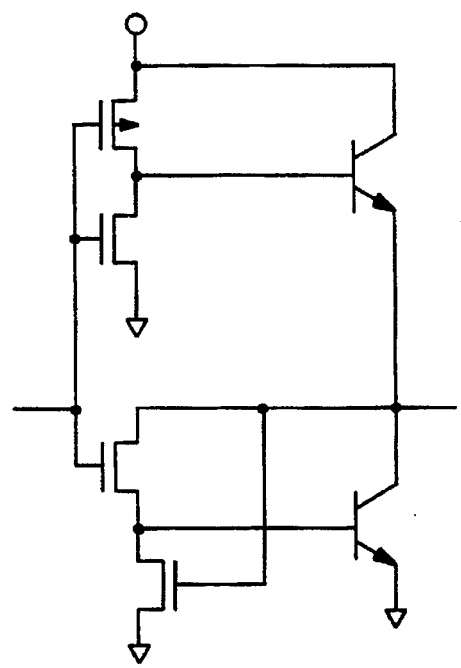
FIG. 38 is a circuit diagram showing one example of a specific circuit of an intermediate buffer in the semiconductor integrated circuit according to the present invention.
Figure 39:
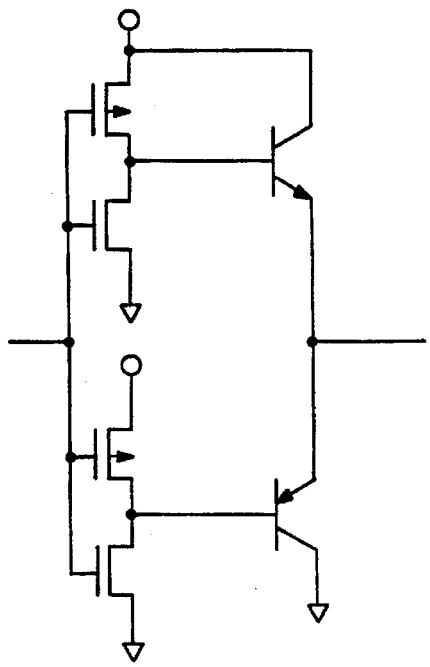
FIG. 39 is a circuit diagram showing one example of a specific circuit of an intermediate buffer an the semiconductor integrated circuit according to the present invention.

Still moreover, FIG. 38 shows one example of a BiCMOS inverter composed of a CMOS and a bipolar transistor, and FIG. 39 shows one example of a BiCMOS inverter composed of a CMOS and bipolar transistors, that is, one example of a CBiCMOS (i.e., Complementary BiCMOS) using an NPN transistor and a PNP transistor at its output drive stage.

Figure 40:
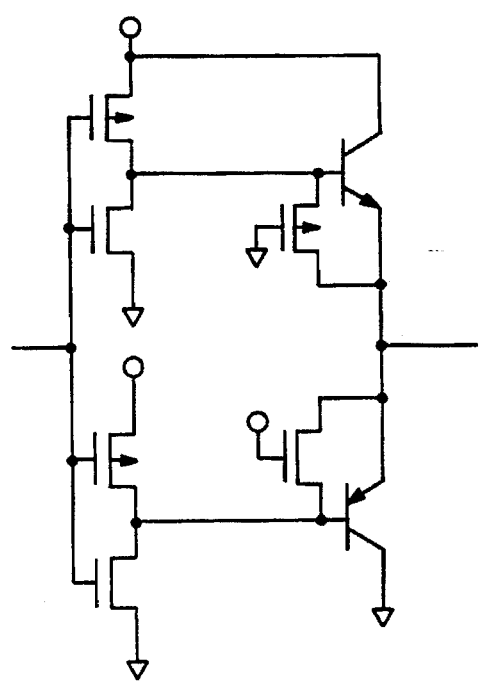
FIG. 40 as a circuit diagram showing one example of a specific circuit of an intermediate buffer an the semiconductor integrated circuit according to the present invention.
Figure 41:
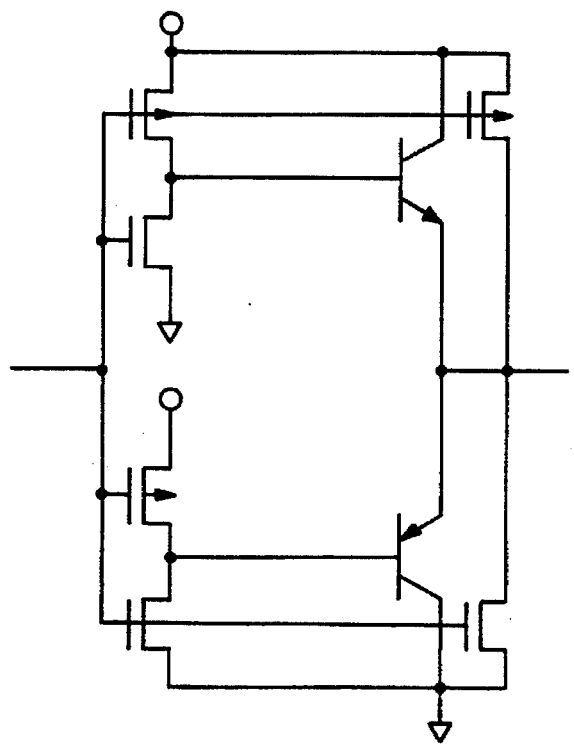
FIG. 41 is a circuit diagram showing one example of a specific circuit of an intermediate buffer in the semiconductor integrated circuit according to the present invention.

FIGS. 40 and 41 show examples of a BiCMOS inverter composed of a CMOS and a bipolar transistor, that is, examples of CBiCMOS (i.e., Complementary BiCMOS) having a full output amplitude by using an NPN transistor and a PNP transistor at their output drive stage.

Figure 42:
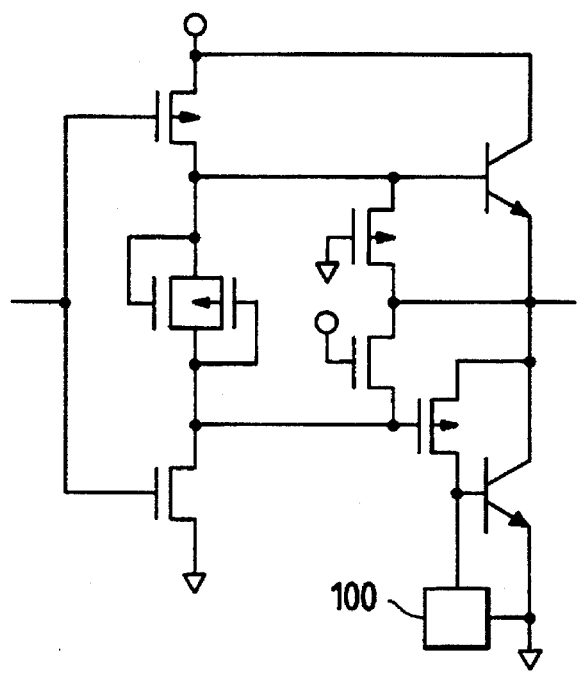
FIG. 42 is a circuit diagram showing one example of a specific circuit of an intermediate buffer in the semiconductor integrated circuit according to the present invention.

Moreover, FIG. 42 shows one example of a BiCMOS inverter composed of a CMOS and bipolar transistors, that is, an example of a QC-BiCMOS (i.e., QuasiComplementary BiCMOS) having a full output amplitude by using a NPN transistor and a PNP transistor at its output drive stage. Reference numeral 100 designates a base discharging resistor, which may be exemplified by a resistance element or a MOS transistor.

Next, FIG. 42 shows an embodiment, in which the present invention is applied to a microprocessor. This Figure shows the internal structure of an ordinary microprocessor.

The microprocessor is constructed, as well known in the art, to include: a C-cache memory 201 for accepting an instruction; an instruction decoder unit 205; a data structure (DS) macro cell 206 for executing an arithmetic operation on the basis of the output signal of the decoder unit; a D-cache memory 202 for latching the arithmetic result; a code translation look-aside buffer (C-TLB) 104 for designating an address to read out a next instruction after the arithmetic operation from the cache memory 201; and a D-TLB 203 for transforming the logic address of the arithmetic result into a physical address of the D-cache memory 202 to designate the data latch address.

The present invention can be applied to any of the individual function blocks, i.e., the C-cache memory 201, the instruction decoder unit 205, the DS macro cell 206, the C-cache memory 202, the C-TLB 204, the D-TLB 203 and the D-cache memory 202. If, however, the present invention is applied especially to the decoder unit 205 or a logic gate circuit portion having a high fan-out of the macro cell and the cache memory, then a small-sized high-speed microprocessor can be provided.

In order to accelerate the microprocessor, it is indispensable to enhance the performances of the data cache memory and the instruction cache memory. A small size and a high-speed performance can be achieved if the data cache memory and the instruction cache memory according to the present invention are used.

Moreover, a higher-speed/performance IC can be achieved by applying the present invention at least to the rate determining logic gate in the IC such as an ASIC (i.e., Application Specific Integrated Circuit) of a gate array or a micon.

Although the present invention has been described in detail in connection with its embodiments, it should not be limited to the foregoing embodiments, but a variety of small design modifications can be made without departing from the gist as specified in the Claims of the present invention.

According to the present invention, as has been apparent from the description thus far made, the following can be achieved.

(1) A small-sized, high-speed highly integrated logic LSI and a high-speed semiconductor integrated circuit device can be provided by equipping it with a plurality of logic circuits and a block recognize circuit and by arranging them in the vicinity of individual function blocks.

(2) Since the number of wiring lines can be drastically reduced, according to the present invention, it is possible to provide a high-speed access memory which is given a high-speed decode circuit without increasing the chip area.

(3) According to the present invention, the layout of the chip in its entirety can be made with a repetition of one m-th to facilitate the layout in a highly integrated circuit thereby to shorten the layout process.

(4) It is possible to provide a memory of high-speed access by inserting intermediate buffers into the wiring lines to reduce the capacity and resistance to be driven by one gate and by shaping the waveforms to reduce the through current of a subsequent stage thereby to provide a high-speed decoder circuit.

(5) A small-sized, high-speed system can be provided by applying the present invention to a semiconductor memory or a processor having a cache memory of one chip.

As has been described hereinbefore, according to the present invention, there is provided a semiconductor integrated circuit device which comprises: output wiring line, distributed in the entirety of a chip; a plurality or sets of function circuit blocks and their drive logic circuit groups distributed close to each other to reduce the output load capacity of one set of drive circuit; and a plurality of intermediate buffers arranged on signal wiring lines, so that the signal delay due to the wiring lines can be reduced to achieve high-speed operations with a small size and so that the layout design can be easily simplified.

In order to facilitate the connections from the lead lines of the package to the input/output pads of the semiconductor integrated circuit of the prior art, an input/output buffer means (including input/output buffer circuits and input/output pads) is arranged along the outer peripheral portion of the semiconductor integrated circuit.

Figure 49:
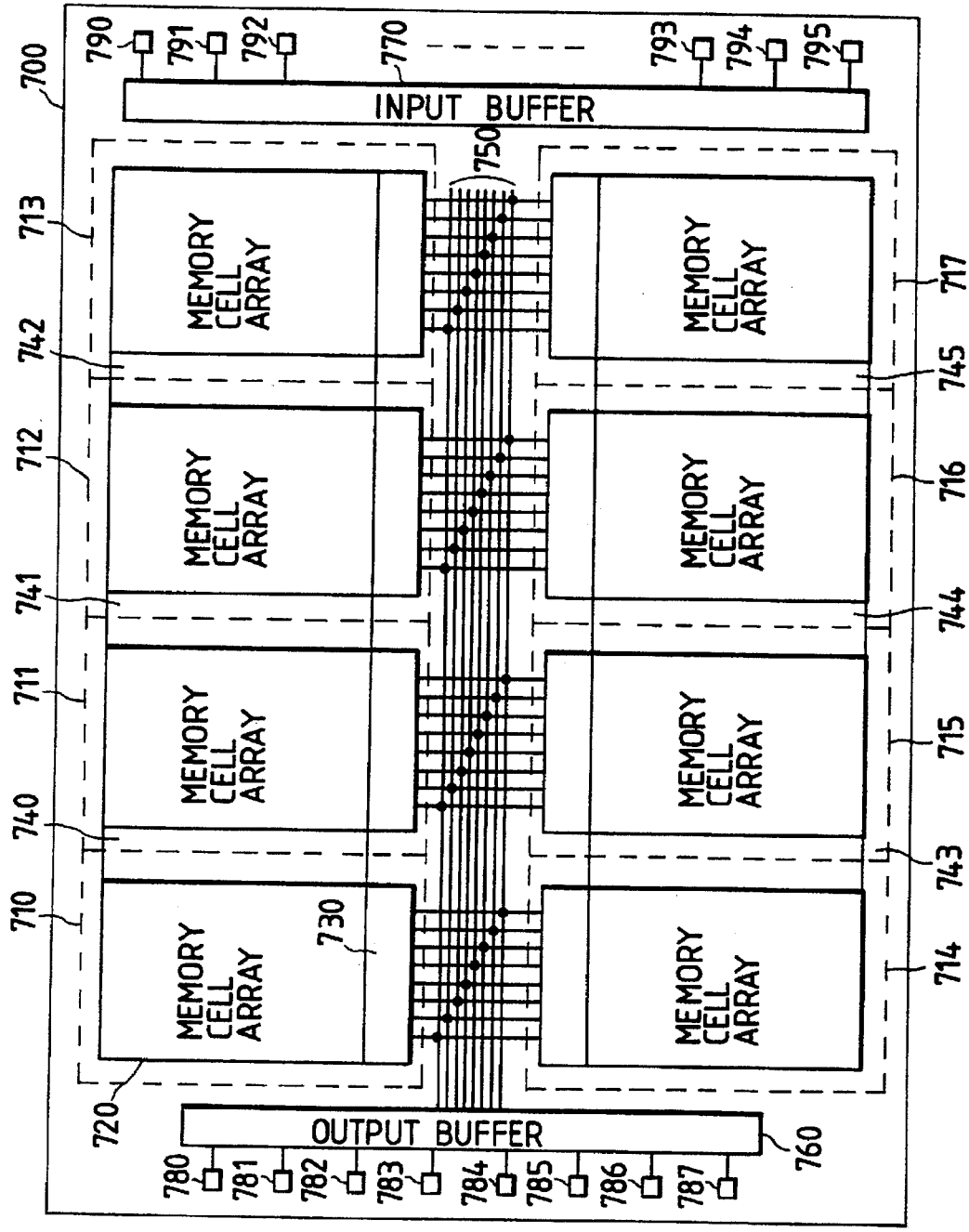
FIG. 49 is a conceptional diagram showing an arrangement of an example of the semiconductor integrated circuit of the prior art.

A semiconductor integrated circuit 700 constituting a semiconductor memory of the prior art is constructed, as shown in FIG. 49, to have an output bit width of 8 bits and to include: memory blocks 710 to 717 each composed of a memory cell array 720 and a read circuit 730; decoder circuits 740 to 745; a common bus 750 for transmitting the read signals of the memory blocks 710 to 717 to an output buffer circuit 760; output pads 780 to 787; an input buffer circuit 770; and input pads 790 to 795.

In the semiconductor integrated circuit thus constructed, the signals read out from the memory blocks 710 to 717 arranged all over the surface are outputted to the common bus 750 which has its wiring lines extended from end to end in the semiconductor integrated circuit, until they are transmitted to the outer peripheral portion of the chip. Although not shown, long wiring lines are extended from the input buffer circuit 770 to the decoder circuits 740 to 745. As a result, the delay time due to the in-chip wiring lines is so long in the prior art structure that it obstructs high-speed operations.

Figure 50:
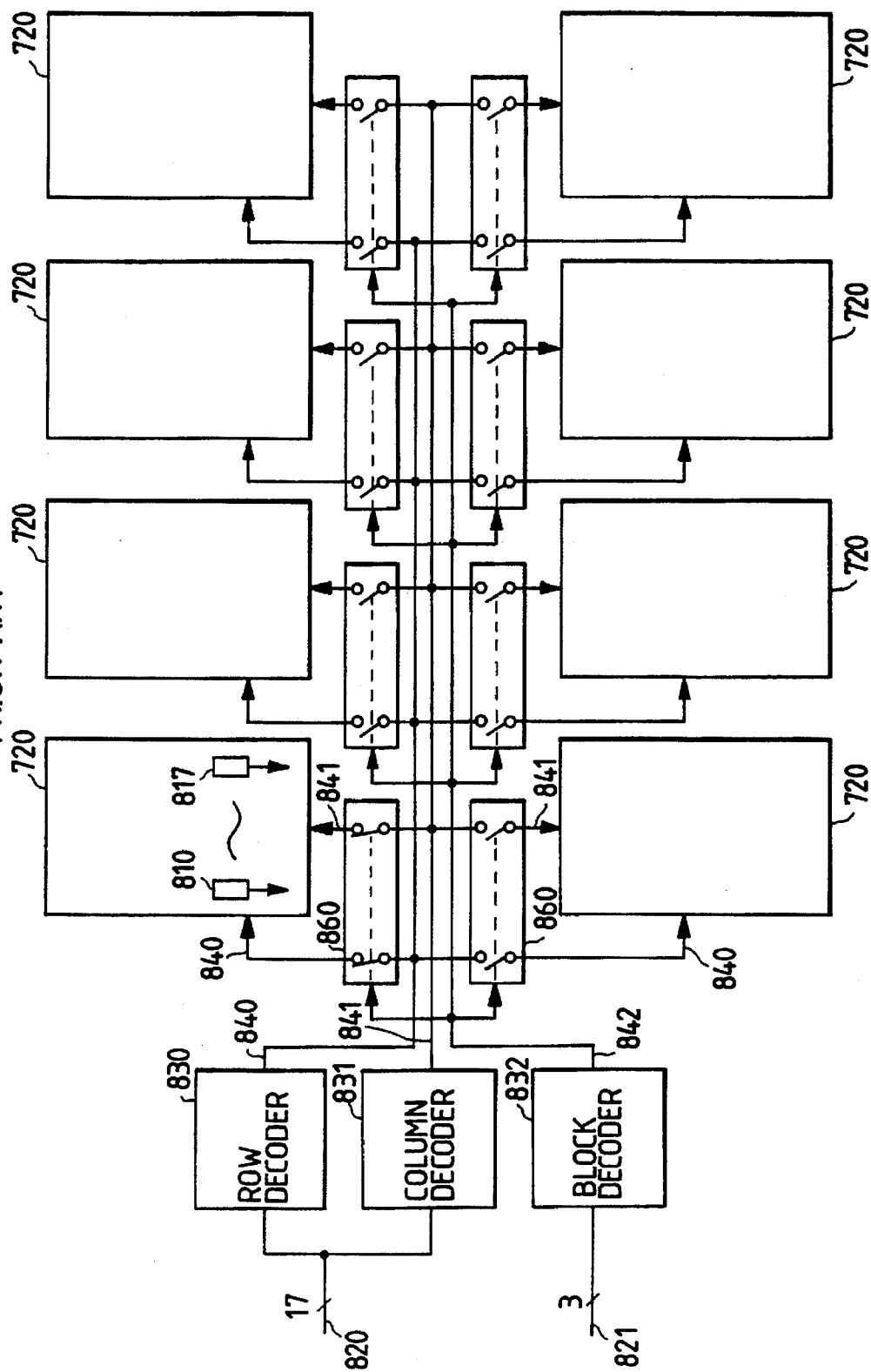
FIG. 50 is a conceptional diagram showing an example of decoder means of the prior art of the semiconductor integrated circuit.

FIG. 50 is a diagram in which the decode means of the semiconductor integrated circuit shown in FIG. 49 is simplified. In this example, address signals 820 and 821 are decoded by a row decoder 830, a column decoder 831 and a block decoder 832 into a row select signal 840, a column select signal 841 and a block select signal 842, so that such one of the memory cells 810 to 817 in the memory cell array 720 is selected by the row select signal 840 and the column select signal 841. The signal, which is read out of the selected memory cell, is fed through the aforementioned common bus 750 and the output circuit 760 to the output pads 780 to 787 and is then transmitted to the outside of the semiconductor integrated circuit. Specifically, in response to the address signal, one of the eight memory cell arrays 720 is selected so that its data of 8 bits are selected and outputted from the output pads 780 to 787. For this operation, the common bus 750 extending the whole length of the semiconductor integrated circuit is provided for outputting the data from any of the memory cell arrays 720 out of the output pads 780 to 787. First of all, if one of the memory cell arrays is selected to extract data of 8 bits therefrom, the remaining memory cell arrays need not be operated so that the power consumption can be easily reduced.

In recent years, the LOC (i.e., Lead On Chip) technology has developed, in which the input/output pads are arranged at the center of the semiconductor integrated circuit with a view to shortening the delay time of the wiring lines. Because of the presence of the common bus 750 for connecting the memory blocks 710 to 717, however, the LOC technology has failed to provide basic measures for shortening the delay time of the wiring lines.

According to the circuit of the prior art described above, the wiring lines from the memory blocks to the output buffer circuits (as will be abbreviated to the "output circuit") and the wiring lines from the input buffer circuits (as will be abbreviated to the "input circuits") to the individual memory blocks are so long that the delay time in the in-chip wiring lines are long. This delay due to the wiring lines has occupied a heavier weight in the delay time of the critical pulses as the miniaturization of the memories and the size of the chip advance. In order to reduce the delay time resulting from the wiring lines, the prior art has tried to reduce the wiring resistance by enlarging the wiring line width or to shorten the in-chip wiring lines by arranging the input/output pads at the center of the semiconductor integrated circuit. Despite of these trials, however, the countermeasures have had restrictions.

In order to shorten the delay time of the wiring lines in the semiconductor integrated circuit, the present intention is characterized by dividing the memory cell arrays into a plurality of memory blocks and by equipping each of the memory blocks independently with output buffer means for outputting the data stored in the memory blocks.

Another characteristic resides in that each of the memory blocks is independently equipped with input buffer means for inputting signals or decode means for decoding the address signals.

The present invention can also be achieved by dividing the memory cell array into such a number of memory blocks as corresponds to the output bit width, by equipping each of the memory blocks independently with the input buffer means for inputting signals, the decode means for decoding the address signals and the output buffer means, and by outputting data of 1 bit from each memory block to give the data a predetermined bit width as a whole.

Thus, the memory cell arrays in the semiconductor integrated circuit are divided into the plurality of memory blocks, and the individual memory blocks and the input/output buffer means are arranged close to each other, so that the wiring lines in the chip from the memory blocks to the output buffer means and the wiring lines in the chip from the input buffer means to the memory blocks are shortened. When the in-chip wiring lines are thus shortened, the delay time of the wiring lines can be shortened.

Moreover, since the decode means output the data of 1 bit from each memory to prepare data of a predetermined bit width as a whole, it is sufficient to connect the output buffer means of the bit data outputted from each memory block, but it is unnecessary to connect the output buffer means with the individual memory blocks through the common bus.

According to the above-specified means, it is possible to suppress the delay time of the wiring lines occupying the critical path, which delay time would raise problems in promoting the miniaturization of the semiconductor integrated circuit and the enlargement of the chip size.

The present invention will be described in more detail in the following in connection with its embodiments with reference to the accompanying drawings. Incidentally, the identical portions are designated at common reference numerals throughout the Drawings to avoid the repeated descriptions.

Figure 43:
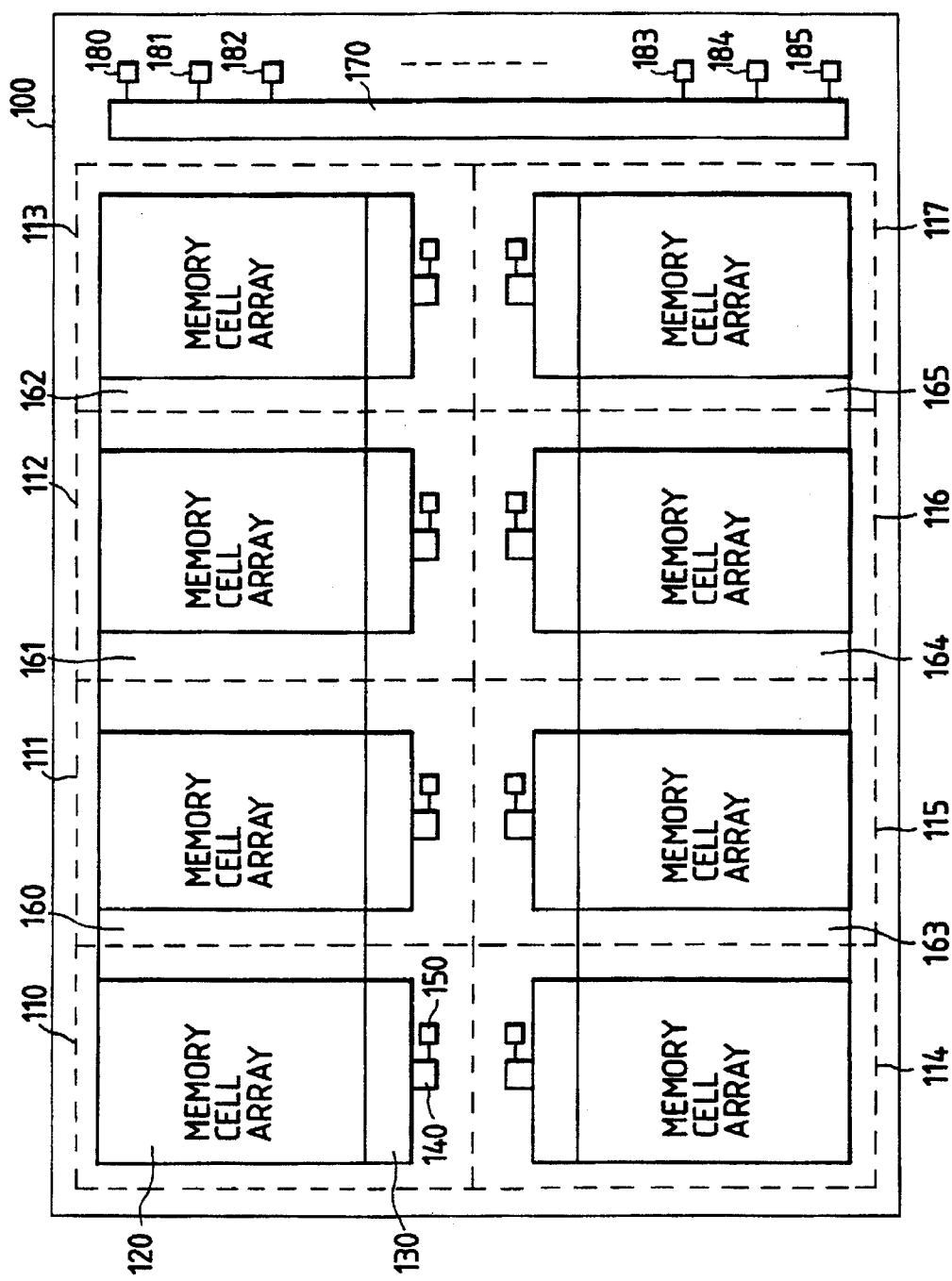
FIG. 43 is a conceptional diagram showing an arrangement of one embodiment of the semiconductor integrated circuit of the present invention.

FIG. 43 shows an embodiment of the present invention. A shown semiconductor integrated circuit 100 is constructed to include: eight memory blocks 110 to 117 individually having memory cell arrays 120; read circuits 130 individually arranged in the memory blocks 110 to 117 for reading out the data of the memory cell arrays 120; output circuits 140 individually attached to the read circuits 130; output pads 150 individually attached to the output circuits 140; decoder circuits 160 to 165 arranged between the individual memory cell arrays 120; an input circuit 170 arranged at the righthand end portion of the entirety of the memory blocks 110 to 117; and input pads 180 to 185 connected with the input circuit 170.

The semiconductor integrated circuit of the present embodiment is constructed to have one output circuit 140 for each of the memory blocks 110 to 117. This construction should not limit the present invention, but each memory block can be equipped with a plurality of output circuits, for example. By way of example, each of four divided memory blocks can be equipped with two output circuits to provide a semiconductor memory having outputs of 8 bits. In these cases, the output bit width of the semiconductor memory is equal to the total number of the output circuits which belong to all the memory blocks. In the following embodiments, too, neither the number of divisions of the memory blocks nor the number of the output circuits in the memory blocks should be limited like the aforementioned embodiment.

In the semiconductor integrated circuit shown in FIG. 43, by taking up a semiconductor memory having an output bit width of 8 bits as an example, let the case be considered, in which the data of arbitrary one bit of the output bit width are stored in each of the memory cell arrays 120 in the eight-divided memory blocks 110 to 117. The stored data of these memory blocks 110 to 117 are assigned, for example, at the 0th bit of the LSB of the output bit, to the memory block 110, at the 1st bit to the memory block 111, - - -, and at the 7th bit to the memory block 117. Thanks to this construction, the read data between the individual memory blocks 110 to 117 need not be connected through a common bus, but the output circuits 140 and the output pads 150 can be provided independently of the individual memory blocks 110 to 117. As a result, the data read out of the individual memory blocks 110 to 117 can be outputted to the outside of the semiconductor integrated circuit through the output circuits 140 and the output pads 150 arranged close to them. In other words, the wiring line length for the stored data to be read and outputted to the outside of the semiconductor integrated circuit can be shortened to drastically reduce the delay time due to the resistance and capacity of the wiring lines so that the semiconductor integrated circuit can be speeded up.

Figure 44:
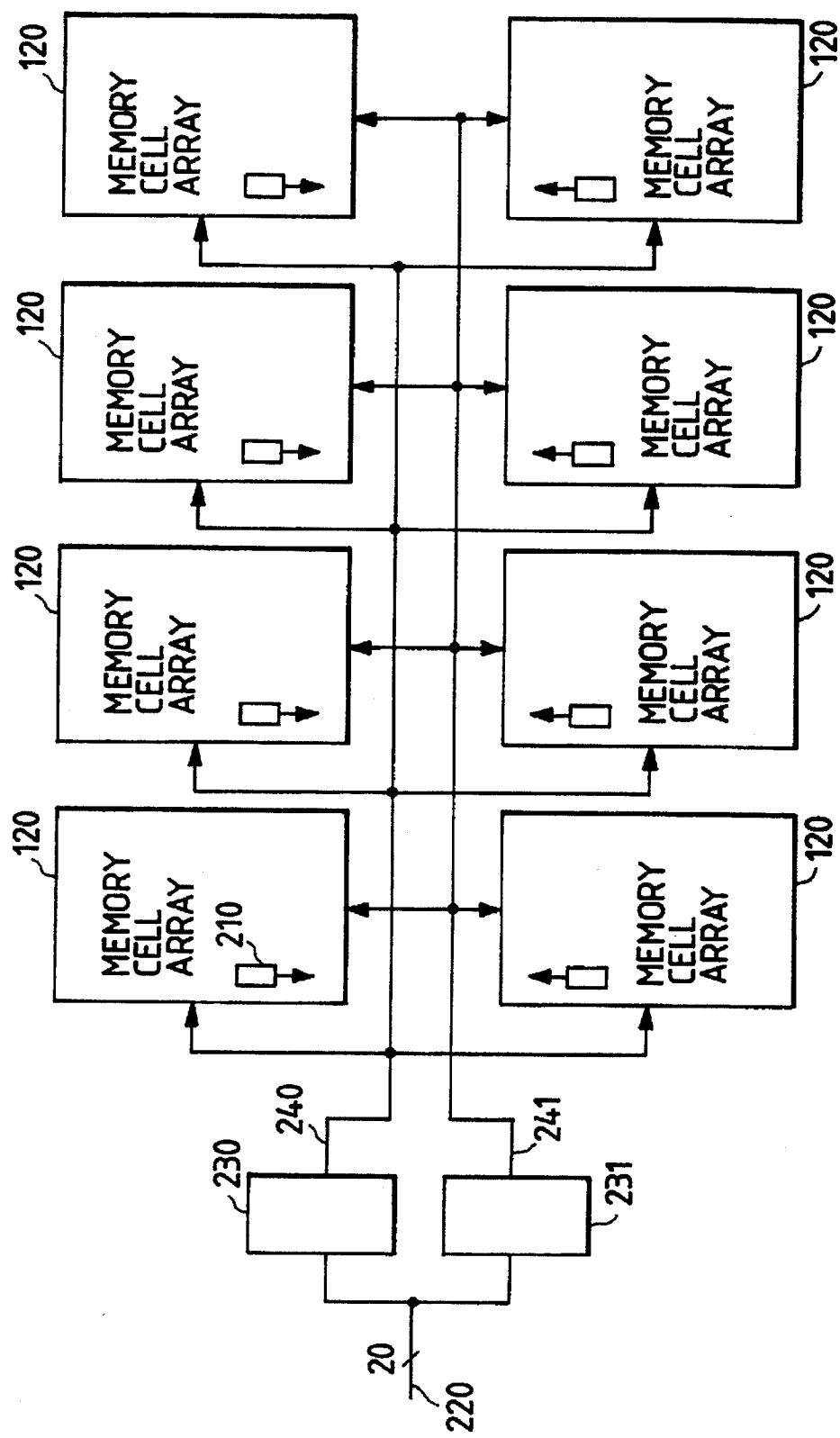
FIG. 44 is a conceptional diagram showing decoder means of one embodiment of the semiconductor integrated circuit of the present invention.

FIG. 44 shows another embodiment of the present invention and a decoder circuit of the embodiment shown in FIG. 43. As described above, each memory cell array 120 including a memory cell 210 has a memory capacity of 1 Mbits so that the total memory capacity is 8 Mbits. The decoder circuit is constructed to include: a row decoder 230; a column decoder 231; a wiring line connecting the output side of the row decoder 230 and each memory cell array 120; and a wiring line connecting the output side of the column decoder 231 and each memory call array 120.

An address signal 220 having 20 bits is inputted to and decoded by the row decoder 230 and the column decoder 231 into a row select signal 240 and a column select signal 241. These row select signal 240 and column select signal 241 are inputted to each of the eight memory cell arrays 120 to select of the memory cell 210 of 1 bit of each of the eight memory cell arrays 120. The data of 1 bit are individually outputted from the selected eight memory cells so that data of 8 bits in total are produced. Specifically, the address signal 220 is one for selecting each memory cell 210 of 1 bit from the eight memory cell arrays 120 each having a memory capacity of 1 Mbits, and data of 1 bit in the eight memory cell arrays 120 are selected for the 20 bits of the address signal 220 so that data of 8 bits are outputted in total.

In the foregoing two embodiments, each of the eight memory cell arrays 120 is equipped with one output circuit 140 and an output pad 150 so that the data are read out bit by bit from all the memory cell arrays 120. However, each of the divided memory cell arrays 120 may be equipped with eight output circuits 140 and eight output pads 150. In this modification, data having an output bit width of 8 bits are outputted from one memory cell array 120. However, data of 1 bit is outputted from each of the eight output circuits and output pads 150, which are connected with the memory cell array 120, and each output pad 150 is arranged close to the memory cell array 120 so that the in-chip wiring lines can be shortened to shorten their delay time.

Figure 45:
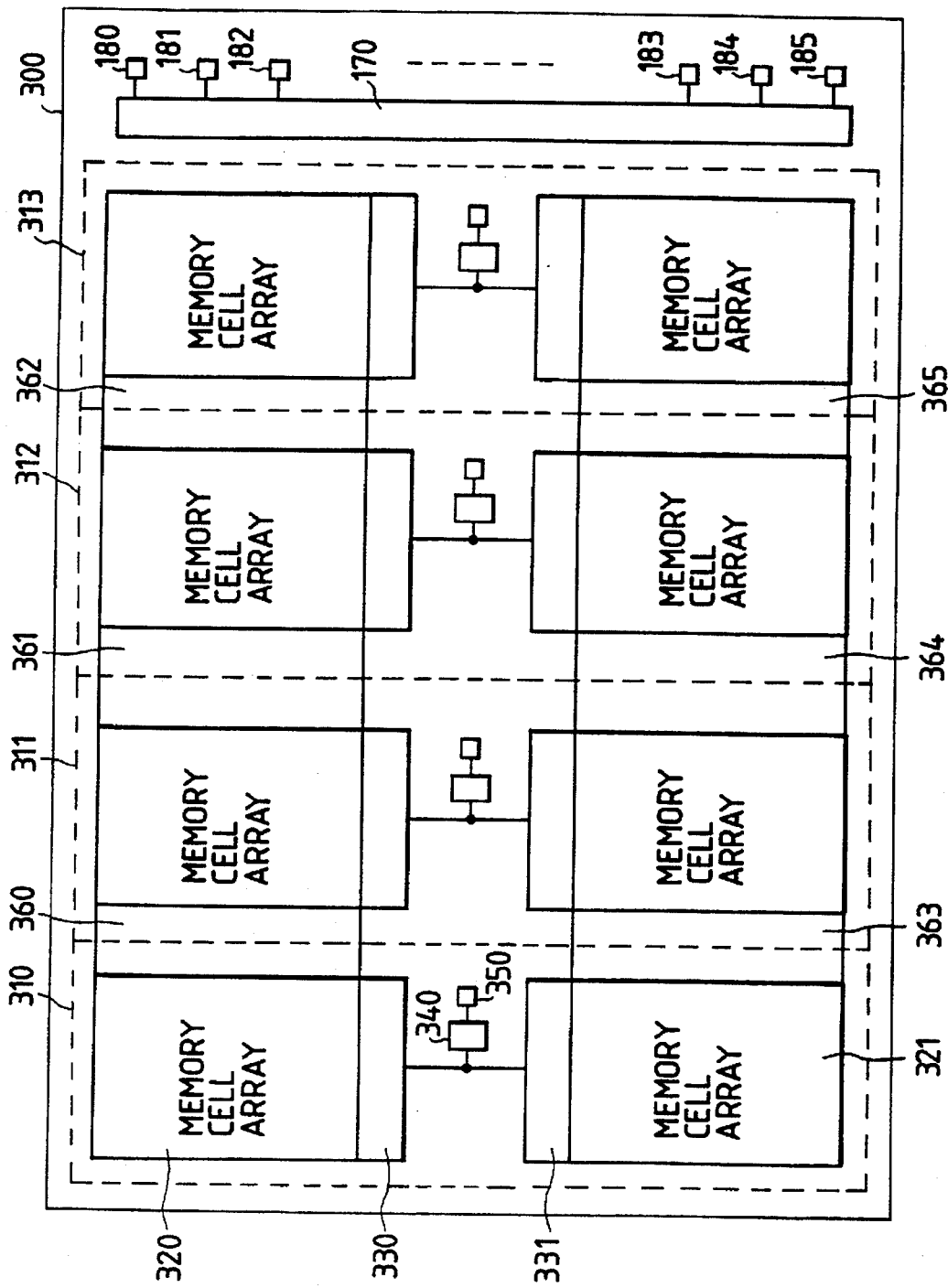
FIG. 45 is a conceptional diagram showing an arrangement of one embodiment of the semiconductor integrated circuit of the present invention.

FIG. 45 shows another embodiment of the present invention. A shown semiconductor integrated circuit 300 is constructed to include: memory blocks 310 to 313 each having memory cell arrays 320 and 321; read circuits 330 and 331 for reading out the data of the memory cell arrays 320 and 321; output circuits 340 connected commonly at the memory block unit with the read circuits 330 and 331; output pads 350 individually connected with the output circuits 340; and decoder circuits 360 to 365 individually arranged between the memory cell arrays.

In the semiconductor integrated circuit of the present embodiment, the semiconductor memory having an output bit width of 4 bits is taken up as an example, and data of an arbitrary 1 bit of the output bit width of 4 bits are separately stored in the memory cell arrays of the four-divided memory blocks 310 to 313. In the present embodiment, moreover, the embodiment shown in FIG. 43 is partially modified for outputting r bits so that a memory for outputting 4 bits can be simply constructed by making use of the memory having an output bit width of 8 bits.

Figure 46:
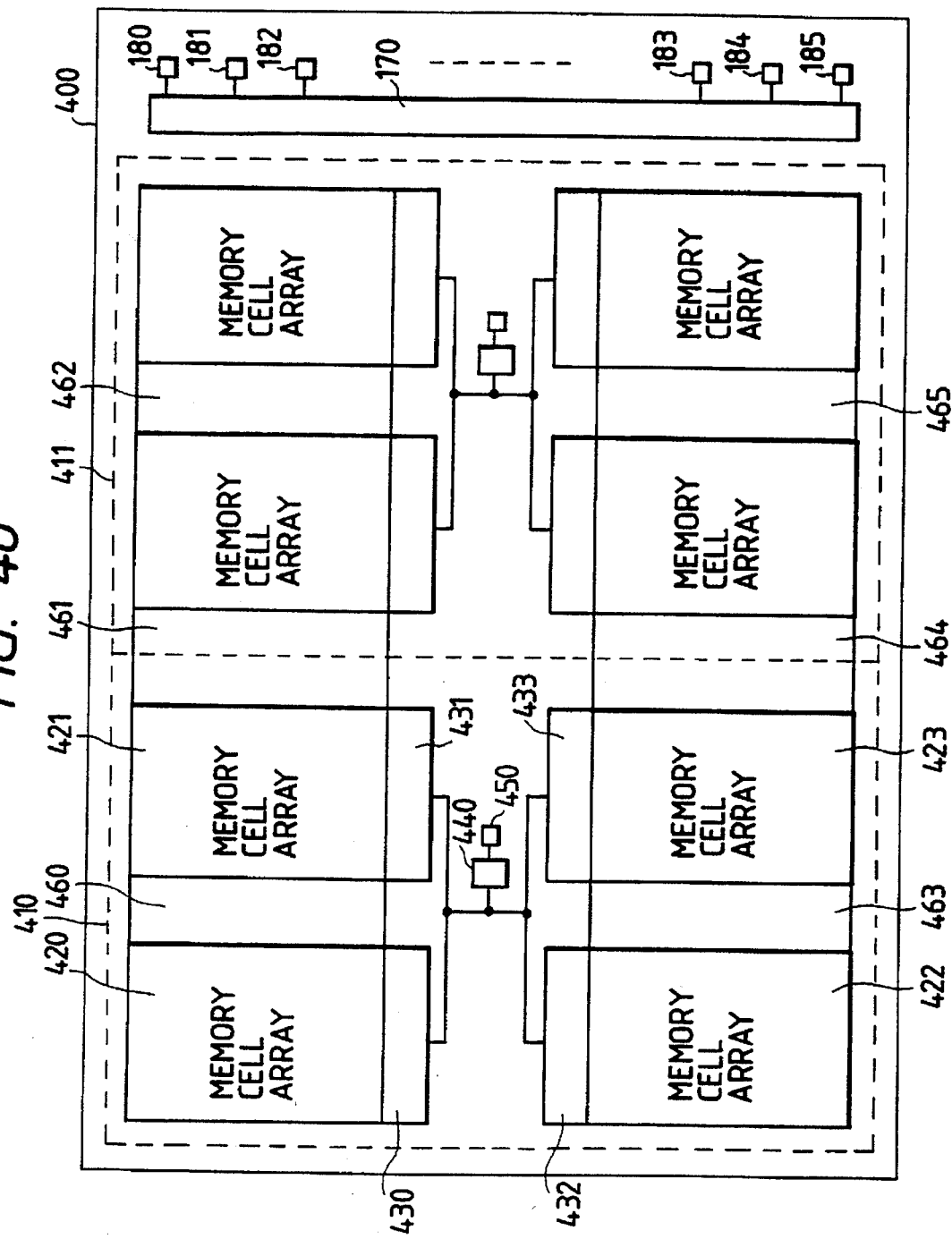
FIG. 46 is a conceptional diagram showing an arrangement of one embodiment of the semiconductor integrated circuit of the present invention.

FIG. 46 shows another embodiment. A shown semiconductor integrated circuit 400 is constructed to include: memory blocks 410 and 411 each having memory cell arrays 420 to 423; read circuits 430 to 433 individually connected with the memory cell arrays 420 to 423 for reading out the data of the memory cell arrays 420 to 423; an output circuit 440 connected in parallel with the read circuits 430 to 433; an output pad connected with the output circuit 440; and decoder circuits 460 to 465 individually arranged between the memory cell arrays.

The semiconductor integrated circuit 400 of the present embodiment takes up the semiconductor memory having an output bit width of 2 bits as an example, and data of 1 bit of either of 2 bits of the output bit width are separately stored in the memory cell array 420 to 423 of one of the two-divided memory blocks 410 and 411. Moreover, the present embodiment is modified from the embodiment shown in FIG. 43 into one for an output of 2 bits, and a memory for the 2-bit output can be simply constructed by making use of the memory having an output bit width of 8 bits.

These embodiments shown in FIGS. 45 and 46 indicate that the output bit width can be simply changed while shortening the delay time of the wiring lines, as has been described with reference to FIG. 43.

Figure 47:
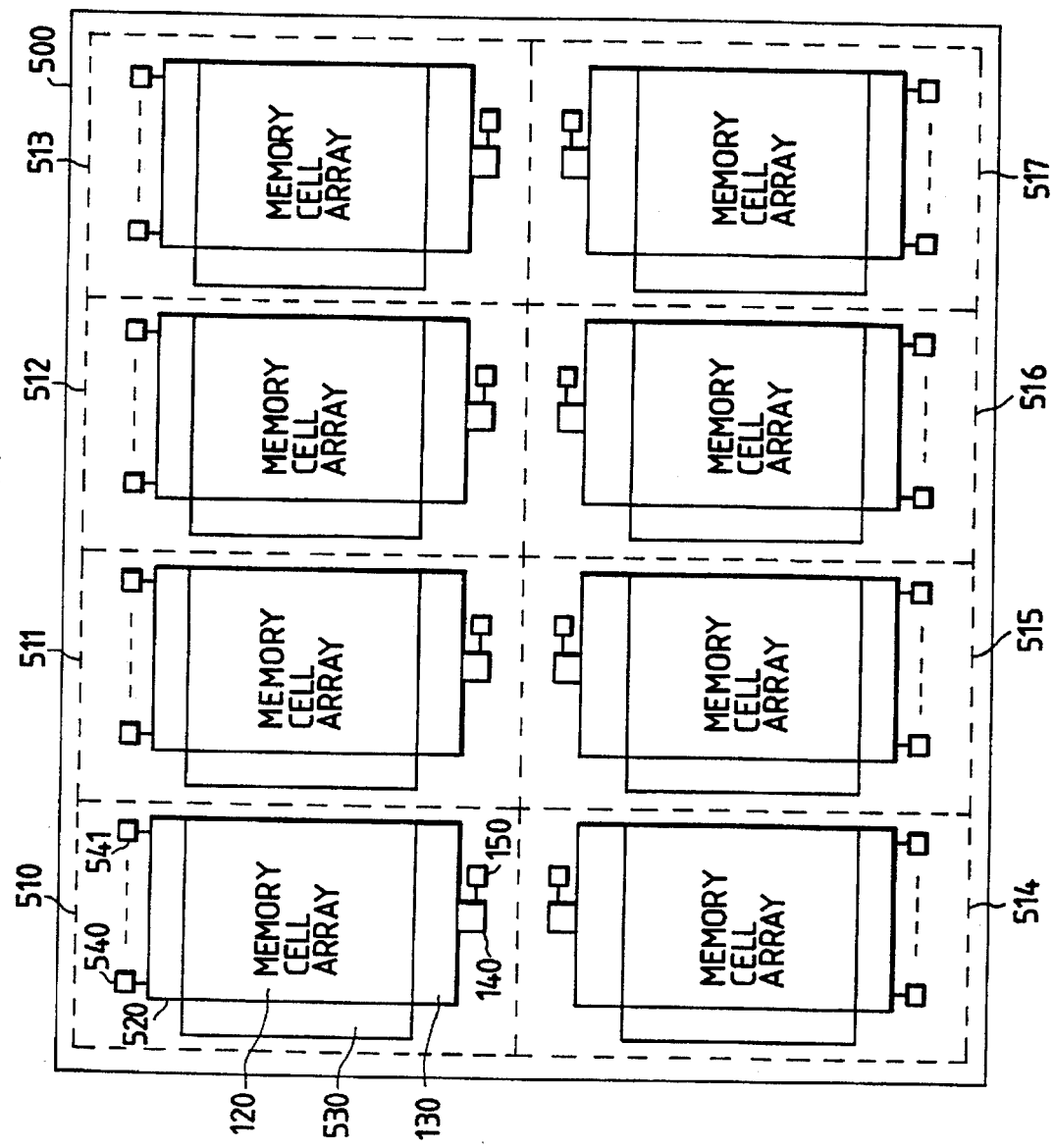
FIG. 47 is a conceptional diagram showing an arrangement of one embodiment of the semiconductor integrated circuit of the present invention.

FIG. 47 shows another embodiment of the present invention. A shown semiconductor integrated circuit 500 is constructed to include: memory blocks 510 to 517 individually having the memory cell arrays 120; input circuits 520 individually attached to the memory blocks 510 to 517; input pads 540 and 541 and decoder circuits 530 attached to each of the input circuits 520. The semiconductor integrated circuit of the present embodiment exemplifies a semiconductor memory having an output bit width of 8 bits, as in the embodiment shown in FIG. 43, and data of an arbitrary 1 bit of the output bit width are stored in the individual memory cell arrays 120 in the memory blocks 510 to 517. In short, each of the memory cell arrays 120 stores the data of any 1 bit of 8 bits.

The construction of the present embodiment is modified from that of the embodiment shown in FIG. 43 such that the input circuits 520, the decoder circuits 530 and the input pads 540 and 541 are individually added to the memory blocks 510 to 517. As a result, the operations are closed from the inputs of the data and addresses to the outputs of the stored data individually in the memory blocks 510 to 517, so that no long portion of the wiring lines exists from the input to the output of the semiconductor integrated circuit 500, thus raising an effect that the passage of the data from the inputs to the outputs can be speeded up. In this case, there exist in the semiconductor integrated circuit 500 a plurality of input pads and input circuits, which correspond to an identical address signal.

Figure 48:
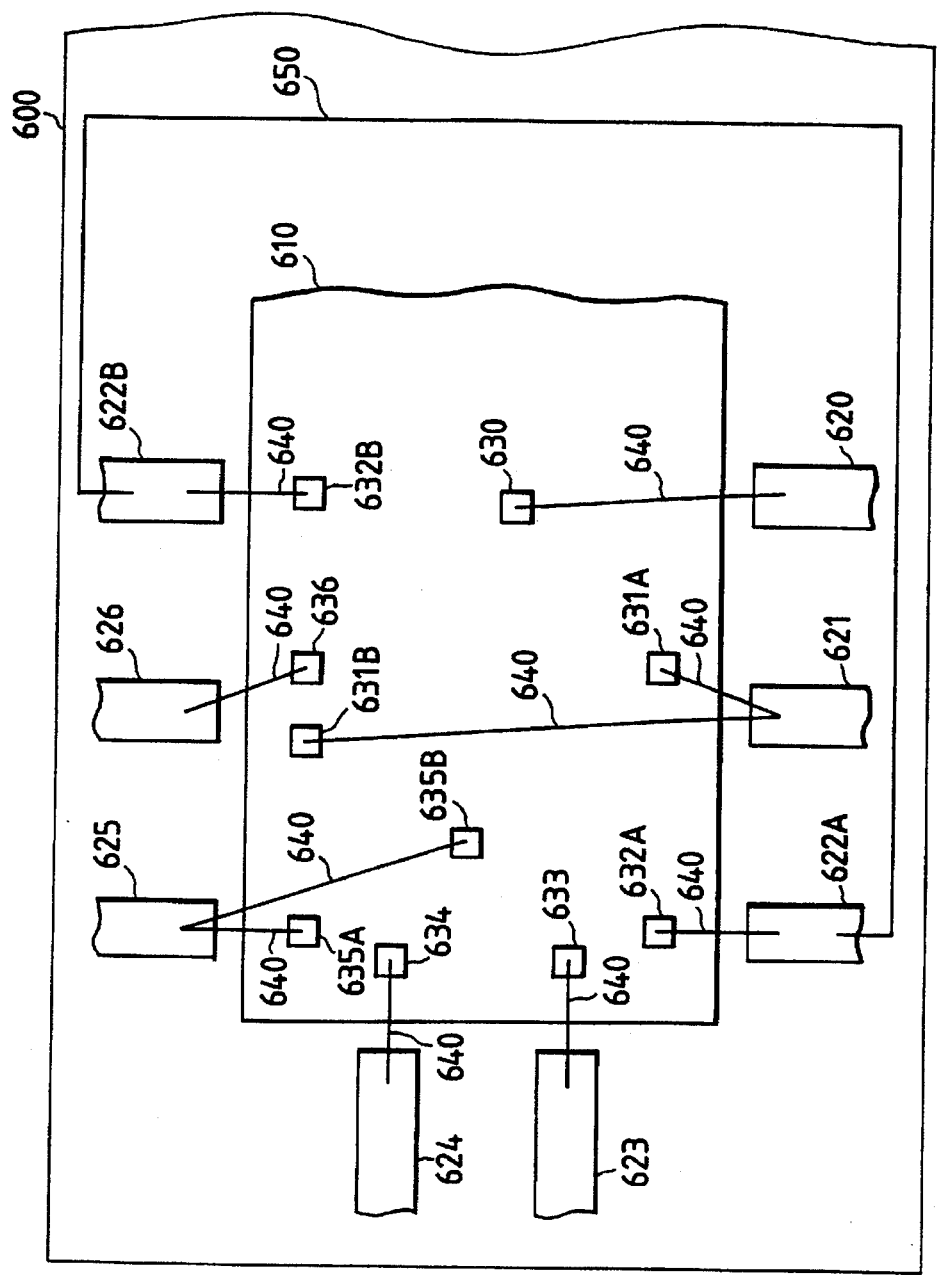
FIG. 48 is a conceptional diagram showing an arrangement of one embodiment of the semiconductor integrated circuit of the present invention.

FIG. 48 shows another embodiment of the present invention. A shown semiconductor package 600 is constructed to include: a semiconductor integrated circuit 610 of the present invention; and lead lines 620, 621, 622A and 622B and lead lines 623 to 626. The lead lines 622A and 622B are those for an identical signal. The lead lines 622A and 622B are connected through a wiring line 650. The semiconductor integrated circuit 610 includes: input/output pads 630, 633, 634 and 636; input pads 631A and 631B, 632A and 632B, and 635A and 635B for inputting identical signals individually; and connect means 640 connecting the lead lines on the semiconductor package 600 and the input/output pads in the semiconductor integrated circuit 610. In short, the semiconductor integrated circuit 610 is equipped with a plurality of input pads for inputting identical signals.

In the embodiment shown in FIG. 48, for the plurality of input pads located in physically separate positions in the semiconductor integrated circuit 610 although they receive identical signals, the lead lines 621 and 625 are equipped with the plurality of connect means 640, or the lead lines 622A and 622B are equipped with the plurality of lead lines for the identical signals. As a result, the wiring lines are partially elongated outside of the semiconductor integrated circuit 610 but shortened for transmitting the signals in the semiconductor integrated circuit 610, so that the operations of the semiconductor integrated circuit 610 are speeded up as a whole. Moreover, the performance of the system can be enhanced by using the semiconductor integrated circuit 610 of the present invention.

According to the present invention, it is possible to shorten the delay time of the wiring lines from the individual memory blocks in the semiconductor integrated circuit to the output circuits and the delay time of the wiring lines from the input circuits to the individual memory blocks. This shortening effect appears more prominently as the miniaturization and the increase in the chip size become more advanced in the future.

According to the means described above, there can be achieved an effect to suppress such delay time of the wiring lines as occupies the critical path, which delay time would raise a problem in proceeding with the miniaturization of the semiconductor integrated circuit and the enlargement of the chip size.

Figure 51:
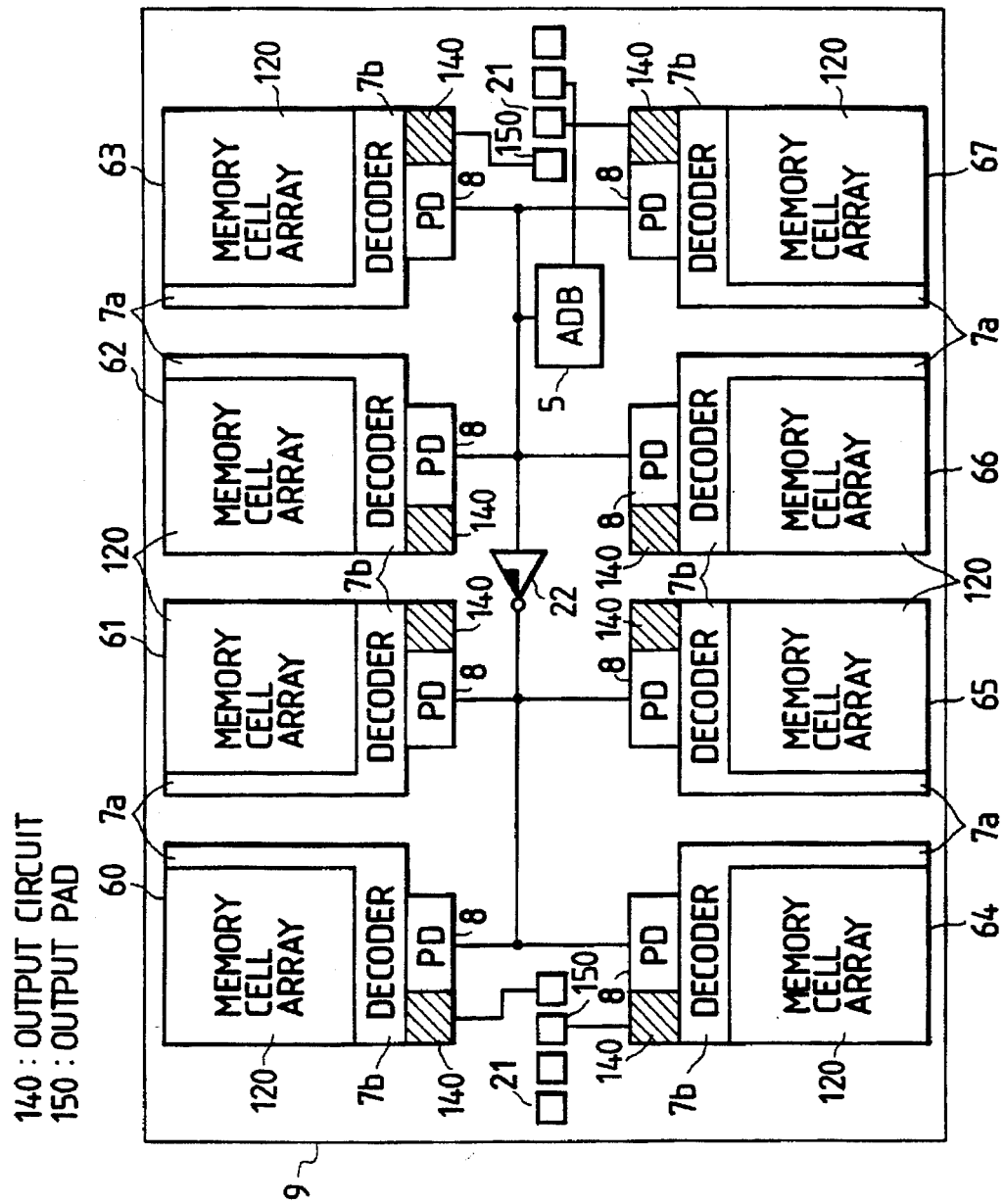
FIG. 51 is a block diagram showing one example of the semiconductor integrated circuit device according to the present invention.

FIG. 51 shows another embodiment of the present invention. A shown semiconductor integrated circuit 9 is constructed to include: eight memory blocks 60 to 67 individually having memory cell arrays; (not-shown) read circuits arranged in the memory blocks 60 to 67 for reading out the data of the memory cell arrays; output circuits 140 and predecoders 8 individually attached to the read circuits; output pads 150 individually provided for the output circuits 140 (although shown only four of the output circuits 140 for simplicity of illustration); decoder circuits 7a individually arranged between the memory cell arrays 120; and input pads 21 connected with the input circuits 5. The stored data of those memory blocks 60 to 67 are assigned, at the 0th bit from the LSB side of the output bits, for example, to the memory block 60, at the 1st bit, to the memory block 61, - - -, and, at the 7th bit, to the memory block 67. Thanks to this construction, the read data between the individual memory blocks 60 to 67 need not be connected through a common bus, but the output circuits 140 and the output pads 150 can be provided independently of the individual memory blocks 60 to 67. As a result, the data read out from the individual memory blocks 60 to 67 can be outputted to the outside of the semiconductor integrated circuit through the output circuits 140 and the output pads 150, which are arranged close to them. In other words, the wiring line length for the stored data to be read and outputted to the outside of the semiconductor integrated circuit can be shortened to drastically reduce the delay time due to the resistance and capacity of the wiring lines so that the semiconductor integrated circuit can be speeded up.

In the present invention, moreover, a plurality the predecoders are arranged on the chip at each of the divided memory cell array regions so that their fan-out can be reduced to the number of divisions, that is, one eighth. As a result, the output loads of the predecoders are reduced to reduce the wiring line length of the predecoder outputs to the chip division length so that both the wiring line capacity and resistance can be reduced to speed up the delay time from the predecoder outputs. By arranging the predecoder group in the vicinity of the memory arrays, the fan-out of the loads to be driven by the predecoder group is reduced to one several-th of the predecoder group in the case of wiring the lines in the chip entirety, so that the access from the predecoders is speeded up.

Figure 52:
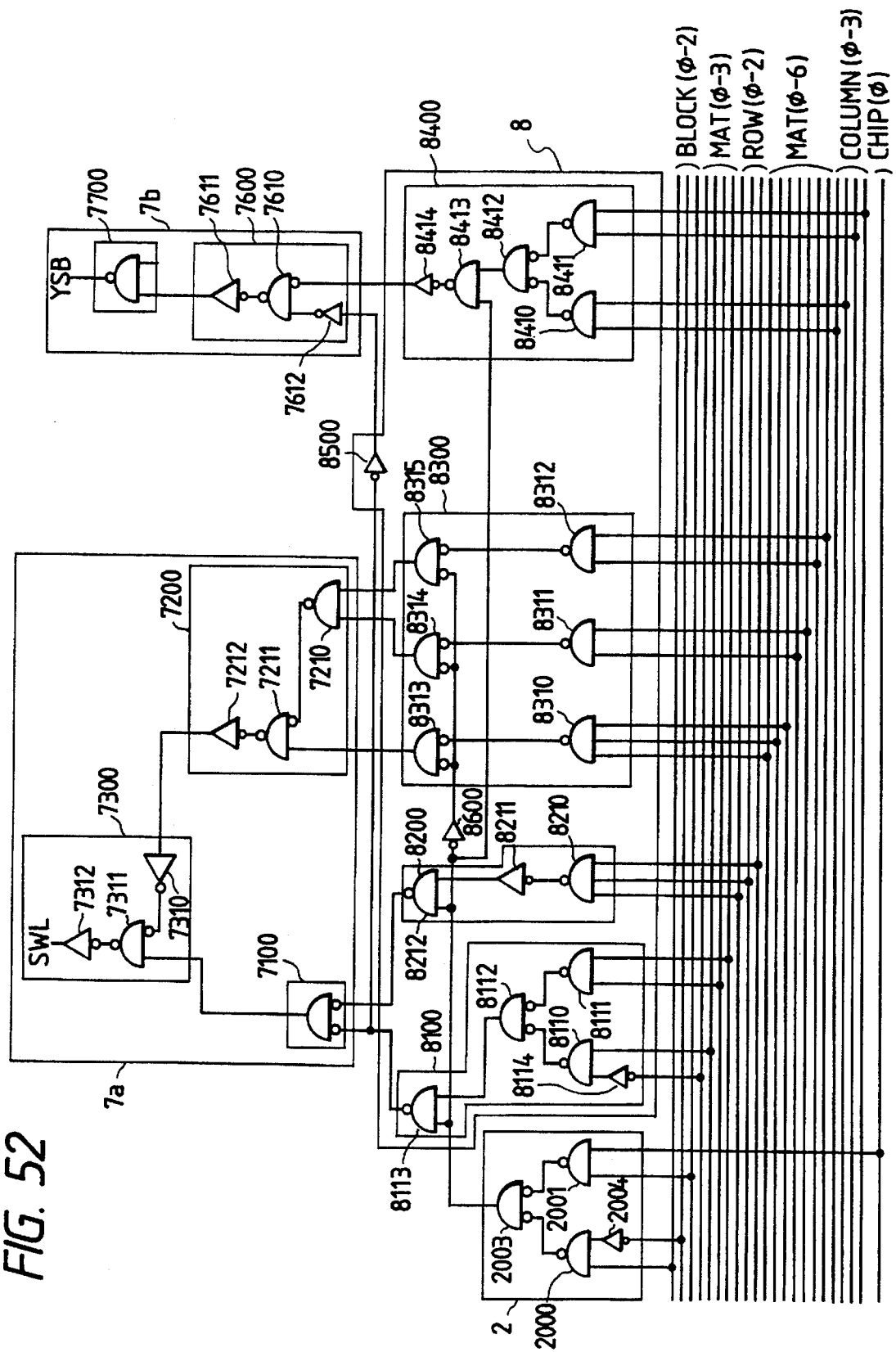
FIG. 52 is a circuit diagram showing one embodiment of a decoder logic circuit of the present invention.

FIG. 52 shows one embodiment of the decoder logic circuit of the semiconductor integrated circuit device, as shown in FIG. 25, according to the present invention.

In FIG. 52, reference letter 2 designates a most significant bit recognize circuit which is arranged for each memory block. The most significant bit recognize circuit 2 includes two-input NANDs 2000 and 2001, a two-input NOR 2003 and an inverter 2004. Each of the first inputs of the two-input NANDs 2000 and 2001 and the input of the inverter 2004 are connected with a bus line of a block select address or the most significant bit so that one of the eight memory blocks is selected in accordance with the block address.

The second input of the two-input NAND 2001 is connected with a chip select address bus so that no memory block operates when the chip 9 is not selected. The inverter 2004 inverts the positive (or negative) signal, which is inputted from a single end type input buffer to the address bus, into a negative (or positive) signal and is provided for producing a signal complementary to one address data.

Reference numeral 8 designates a predecoder which is arranged for each memory block. The predecoder 8 includes: mat predecoders 8100 (sixteen/block); row predecoders 8200 (eight/block); main word predecoders 8300 (eight or four/block); column predecoders 8400 (sixteen/block); and inverters 8500 and 8600.

The mat predecoder 8100 is composed of two-input NANDs 8110, 8111 and 8113, a two-input NOR 8112, and an inverter 8114 and selects one of the sixteen memory mats existing in one block through a row decoder 7100 at a subsequent stage.

The main word predecoder 8300 is composed of three-input NANDs 8310 (eight/block), two-input NANDs 8311 and 8512 (four/block), two-input NORs 8313 (eight/block), and two-input NORs 8314 and 8315 (four/block) and selects one of one hundred and twenty eight main word lines of the selected memory block through a main word driver 7200 at a subsequent stage.

The row predecoder 8200 is composed of a three-input NAND 8210, an inverter 8211 and a two-input NAND 8213 and selects one of the eight subword lines belonging to the selected main word driver through the row decoder 7100 at a subsequent state and a subword driver 7300 at a next subsequent step.

The column decoder 8400 is composed of two-input NANDs 8410, 8411 and 8413, a two-input NOR 8412 and an inverter 8414 and selects one of the sixteen columns of the selected memory mat through a column decoder 7600 at a subsequent stage and a column switch driver 7700 at a next subsequent stage.

A decoder 7a is composed of the row decoders 7100 (8×16 mats/block), the main word driver 7200 and the subword driver 7300. The row decoder 7100 is a two-input NOR; the main word driver 7200 is composed of modified three-input NANDs 7210 and 7211 and an inverter 7212; and the subword driver 7300 is composed of modified two-input NANDs 7310 and 7311 and an inverter 7312. The output SWL of the inverter 7312 corresponds to one of SWL(O) to SWL(1023) of FIG. 18.

A decoder 7b is composed of a column decoder 7600 and a column switch driver 7700. The column decoder 7600 is composed of modified two-input NORs 7610, 7611 and 7612, and the column switch driver 7700 is composed of a two-input NAND.

Figure 53:
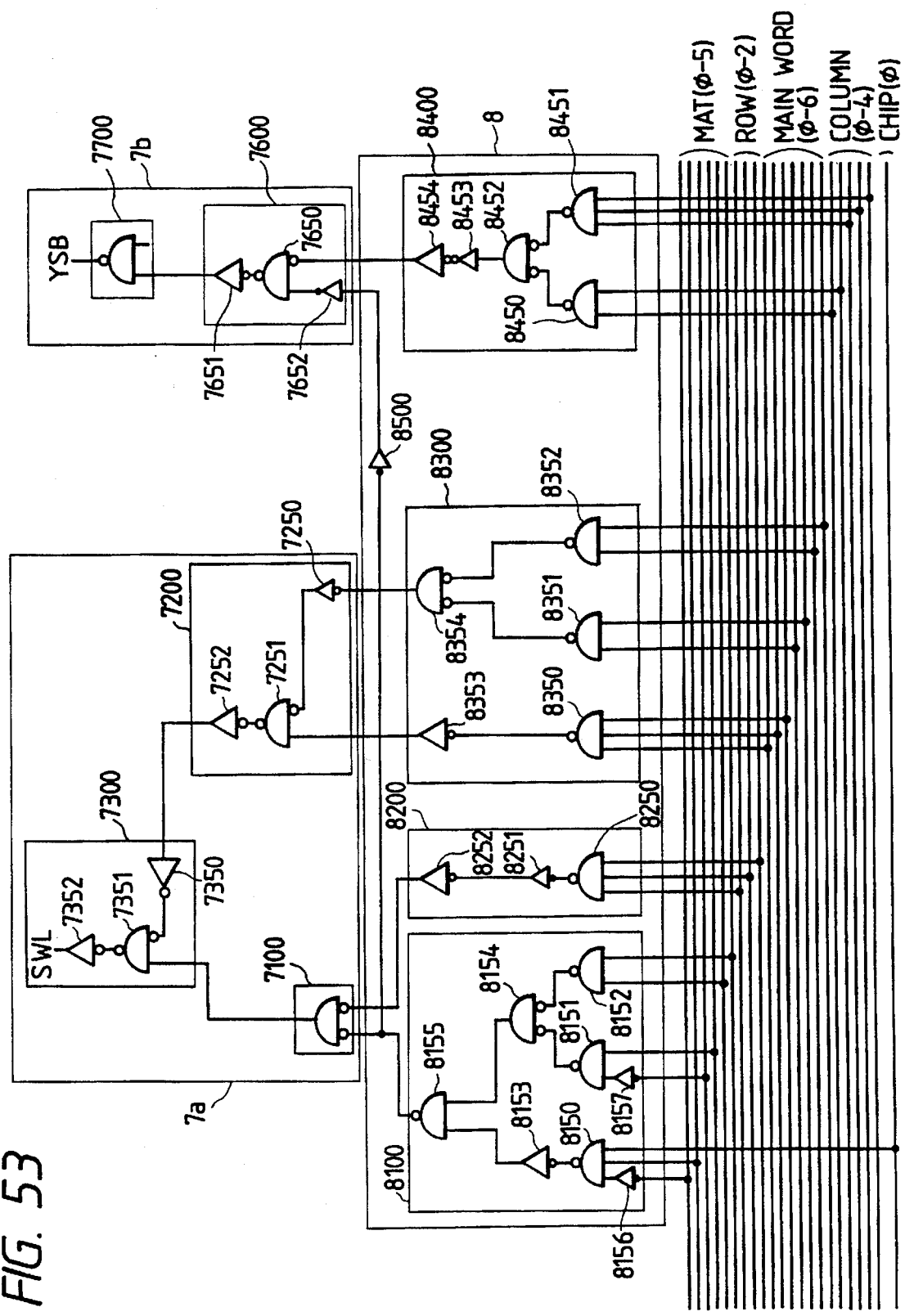
FIG. 53 is a circuit diagram showing one embodiment of a decoder logic circuit of the present invention.

FIG. 53 shows one embodiment of the decoder logic circuit of the semiconductor integrated circuit device, as shown in FIG. 51, according to the present invention.

Unlike the preceding semiconductor integrated circuit device of FIG. 25, there is no most significant bit recognize circuit 2 for selecting the memory blocks. As a result, the eight memory blocks simultaneously operate at the chip selecting time.

Reference numeral 8 designates a predecoder which is arranged for each memory block. The predecoder 8 includes: mat predecoders 8100 (sixty four/block); row predecoders 8200 (eight/block); main word predecoders 8300 (eight or four/block); column predecoders 8400 (thirty two/block); and an inverter 8500.

The mat predecoder 8100 is composed of a three-input NAND 8150, two-input NANDs 8151, 8152 and 8155, a two-input NOR 8154, and inverters 8153, 8156 and 8157 and selects one of the sixty four memory mats existing in one block through a row decoder 7100 at a subsequent stage.

The third input of the three-input NAND 8150 is connected with a chip select address bus so that no memory block operates when the chip 9 is not selected. The inverters 8156 and 8157 invert the positive (or negative) signal, which is inputted from a single end type input buffer to the address bus, into a negative (or positive) signal and are provided for producing a signal complementary to one address data.

The main word predecoder 8300 is composed of three-input NANDs 8350 (eight/block), two-input NANDs 8351 and 8352 (four/block), inverters 8353 (eight/block), and a two-input NORs 8354 (four/block) and selects one of one hundred and twenty eight main word lines of the selected memory block through a main word driver 7200 at a subsequent stage.

The row predecoder 8200 is composed of a three-input NAND 8250 and inverters 8251 and 8152 and selects one of the eight subword lines belonging to the selected main word driver through the row decoder 7100 at a subsequent state and a subword driver 7300 at a next subsequent step.

The column decoder 8400 is composed of a two-input NAND 8450, a three-input NAND 8451, a two-input NOR 8452 and inverters 8453 and 8454 and selects one of the thirty two columns of the selected memory mat through a column decoder 7600 at a subsequent stage and a column switch driver 7700 at a next subsequent stage.

A decoder 7a is composed of the row decoders 7100 (8×16 mats/block), the main word driver 7200 and the subword driver 7300. The row decoder 7100 is a two-input NOR; the main word driver 7200 is composed of modified two-input NANDs 7250 and 7251 and an inverter 7252; and the subword driver 7300 is composed of modified two-input NANDs 7350 and 7351 and an inverter 7352. The output SWL of the inverter 7352 corresponds to one of SYL(O) to SWL(1023) of FIG. 18.

A decoder 7b is composed of a column decoder 7600 and a column switch driver 7700. The column decoder 7600 is composed of modified two-input NORs 7650, 7651 ind 7652, and the column switch driver 7700 is composed of a two-input NAND.

What is claimed is:

1. A semiconductor integrated circuit device comprising:

a plurality of processing blocks for processing data;

a logic circuit for generating a logic signal from a data signal to be processed and from a control signal for defining how to process said data in each of said processing blocks; and a plurality of pulse generators having a number corresponding to the number of said processing blocks so that each processing block has a corresponding pulse generator coupled thereto, wherein at least one of said pulse generators is selected by a block select signal to select at least one of said processing blocks in said plurality of processing blocks, each of said pulse generators generating a pulse signal from said logic signal and controlling a corresponding processing block, which is connected with said selected pulse generator, by said pulse signal in order to process data, wherein said pulse generators generate negative pulse signals.

2. A semiconductor integrated circuit device including a plurality of chips, wherein at least one of the chips comprises:

a plurality of processing blocks for processing data;

a logic circuit for generating a logic signal by performing a logic operation on a data signal to be processed, a chip select signal and a control signal for defining how to process said data in each of said processing blocks; and a plurality of pulse generators having a number corresponding to the number of said processing blocks so that each processing block has a corresponding pulse generator coupled thereto, wherein at least one of said pulse generators is selected by a block select signal to select at least one of said processing blocks in said plurality of processing blocks, each of said pulse generators generating a pulse signal from said logic signal and controlling a corresponding processing block, which is connected with said selected pulse generator, by said pulse signal in order to process data, wherein said pulse generators generate negative pulse signals.

3. A semiconductor integrated circuit device having a plurality of chips, comprising:

at least one of the chips including a signal generating means for generating a chip select signal which selects at least one of the chips from said plurality of chips, a data signal and a control signal which defines how to process said data signal, and at least another one of the chips comprising:

a plurality of processing blocks for processing data;

a logic circuit for generating a logic signal by performing a logic operation on said data signal, said chip select signal and said control signal to each of said processing block; and a plurality of pulse generators having a number corresponding to the number of said processing blocks so that each processing block has a corresponding pulse generator coupled thereto, wherein at least one of said pulse generators is selected by a block select signal to select at least one of said processing blocks in said plurality of processing blocks, each of said pulse generators generating a pulse signal from said logic signal, and controlling a corresponding processing block, which is connected with said selected pulse generator, by said pulse signal in order to process data, wherein said pulse generators generate negative pulse signals.

4. A semiconductor memory device comprising:

a plurality of semiconductor memory mats, each comprised of a plurality of memory cells;

a first logic circuit receiving data signals to be processed and control signals defining how said data signals are to be processed, said first logic circuit including means for performing a logic operation on said data signals and said control signals to form a first logic signal;

a plurality of second logic circuits receiving the first logic signal and decode signals, said second logic circuits including means to perform a logic operation on said first logic signal and said decode signals to generate second logic signals; and a plurality of pulse generators having a number corresponding to the number of semiconductor memory mats so that each semiconductor memory mat has a corresponding pulse generator coupled thereto, wherein each of said pulse generators is also coupled to receive one of said second logic signals from said second logic circuit, wherein each of said pulse generators includes means to generate a pulse signal from the second logic circuits for controlling the corresponding memory mat coupled thereto, and wherein each of said pulse generators is coupled directly to the corresponding memory mat without being coupled through any further logic circuits to minimize the line length for the application of the pulse signals to the memory mats.

5. A semiconductor memory device according to claim 4, wherein said pulse generators generate negative pulse signals.

6. A semiconductor memory device according to claim 4, wherein the plurality of second logic circuits have a number corresponding to the number of the pulse generators so that each of the pulse generators will be coupled to a corresponding second logic circuit.

* * * * *